US012604469B2

(12) United States Patent
Chen et al.

(10) Patent No.: US 12,604,469 B2
(45) Date of Patent: Apr. 14, 2026

(54) THREE-DIMENSIONAL MEMORY DEVICE CONTAINING DUMMY STACK EDGE SEAL STRUCTURE AND METHODS FOR FORMING THE SAME

(71) Applicant: SANDISK TECHNOLOGIES LLC, Addison, TX (US)

(72) Inventors: Yao Chen, Yokkaichi (JP); Shigehisa Inoue, Yokkaichi (JP); Kazuto Ohsawa, Yokkaichi (JP); Hisaya Sakai, Yokkaichi (JP)

(73) Assignee: Sandisk Technologies, Inc., Milpitas, CA (US)

( * ) Notice: Subject to any disclaimer, the term of this patent is extended or adjusted under 35 U.S.C. 154(b) by 952 days.

(21) Appl. No.: 17/807,819

(22) Filed: Jun. 20, 2022

(65) Prior Publication Data
US 2023/0413551 A1      Dec. 21, 2023

(51) Int. Cl.
*H10B 43/27*        (2023.01)
*H10B 41/10*        (2023.01)
(Continued)

(52) U.S. Cl.
CPC ............. *H10B 43/27* (2023.02); *H10B 41/10* (2023.02); *H10B 41/27* (2023.02); *H10B 41/35* (2023.02);
(Continued)

(58) Field of Classification Search
CPC ........ H10B 43/27; H10B 43/50; H10B 41/10; H10B 41/27; H10B 41/35; H10B 43/10;
(Continued)

(56) References Cited

U.S. PATENT DOCUMENTS 9,224,747 B2    12/2015  Mizutani et al.
9,589,981 B2    3/2017   Nishikawa et al.
(Continued)

OTHER PUBLICATIONS

Endoh et al., "Novel Ultra High-Density Memory with a Stacked-Surrounding Gate Transistor (S-SGT) Structured Cell," IEDM Proc. (2001) 33-36.

(Continued)

*Primary Examiner* — Britt Hanley
*Assistant Examiner* — Victor V Barzykin
(74) *Attorney, Agent, or Firm* — THE MARBURY LAW GROUP PLLC

(57) ABSTRACT

A memory die includes first and second memory-region alternating stacks of memory-region insulating layers and electrically conductive layers that are laterally spaced apart from each other by a respective first portion of a retro-stepped dielectric structure overlying first stepped surfaces of the first and second memory-region alternating stacks, memory opening fill structures located the first and second memory-region alternating stacks, and a peripheral alternating stack of peripheral insulating layers and spacer material which is laterally spaced from the second memory-region alternating stack by a second portion of the retro-stepped dielectric structure overlying second stepped surfaces of the second memory-region alternating stack. Bottom surfaces of the first and second memory-region alternating stacks are spaced apart by a first lateral spacing distance, and bottom surfaces of the second memory alternating stack and the peripheral alternating stack are spaced apart by the first lateral spacing distance.

11 Claims, 34 Drawing Sheets

(51) Int. Cl.

| | |
|---|---|
| *H10B 41/27* | (2023.01) |
| *H10B 41/35* | (2023.01) |
| *H10B 43/10* | (2023.01) |
| *H10B 43/35* | (2023.01) |
| *H10B 43/50* | (2023.01) |
| *H10W 20/41* | (2026.01) |
| *H10W 20/42* | (2026.01) |

(52) U.S. Cl.
CPC ............. *H10B 43/10* (2023.02); *H10B 43/35* (2023.02); *H10B 43/50* (2023.02); *H10W 20/42* (2026.01); *H10W 20/435* (2026.01)

(58) Field of Classification Search
CPC .. H10B 43/35; H01L 23/5226; H01L 23/5283
See application file for complete search history.

(56) References Cited

U.S. PATENT DOCUMENTS

| | | | |
|---|---|---|---|
| 9,646,981 B2 | 5/2017 | Nishikawa et al. | |
| 9,673,213 B1 | 6/2017 | Yu et al. | |
| 9,953,992 B1 | 4/2018 | Ogawa et al. | |
| 10,861,873 B2 | 12/2020 | Kim et al. | |
| 10,872,899 B2 * | 12/2020 | Kim | H10B 41/27 |
| 11,133,252 B2 | 9/2021 | Ito et al. | |
| 2016/0365351 A1 | 12/2016 | Nishikawa et al. | |
| 2016/0365352 A1 | 12/2016 | Nishikawa et al. | |
| 2017/0236746 A1 * | 8/2017 | Yu | G11C 16/24 257/314 |
| 2021/0242128 A1 | 8/2021 | Ito et al. | |

OTHER PUBLICATIONS

U.S. Appl. No. 17/397,678, filed Aug. 9, 2021, SanDisk Technologies LLC.

U.S. Appl. No. 17/397,777, filed Aug. 9, 2021, SanDisk Technologies LLC.

U.S. Appl. No. 17/397,846, filed Aug. 9, 2021, SanDisk Technologies LLC.

U.S. Appl. No. 17/654,465, filed Feb. 11, 2022, SanDisk Technologies LLC.

\* cited by examiner

A'

165

132P/142P

175

132A/142A

165

132P/142P

1652

165

1651

900

UA

A'

165

175

165

132A/142A

9

165

132P/142P

THREE-DIMENSIONAL MEMORY DEVICE CONTAINING DUMMY STACK EDGE SEAL STRUCTURE AND METHODS FOR FORMING THE SAME

FIELD

The present disclosure relates generally to the field of semiconductor devices, and particularly to a three-dimensional memory device with an edge seal structure containing a dummy stack for reducing a staircase region area and methods of forming the same.

BACKGROUND

A three-dimensional memory device including three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2011) 33-36.

SUMMARY

According to an aspect of the present disclosure, a semiconductor structure includes a memory die. The memory die includes first and second memory-region alternating stacks of memory-region insulating layers and electrically conductive layers that are laterally spaced apart from each other by a respective first portion of a retro-stepped dielectric structure overlying first stepped surfaces of the first and second memory-region alternating stacks, memory openings vertically-extending through the first and second memory-region alternating stacks, memory opening fill structures located in the memory openings and comprising a respective vertical semiconductor channel and a respective vertical stack of memory elements, and a peripheral alternating stack of peripheral insulating layers and spacer material layers having a different composition from the electrically conductive layers, the peripheral alternating stack is laterally spaced from the second memory-region alternating stack by a second portion of the retro-stepped dielectric structure overlying second stepped surfaces of the second memory-region alternating stack. Bottom surfaces of the first and second memory-region alternating stacks are spaced apart by a first lateral spacing distance, and bottom surfaces of the second memory alternating stack and the peripheral alternating stack are spaced apart by the first lateral spacing distance.

According to another aspect of the present disclosure, a method of forming a semiconductor structure comprises: forming a vertically alternating sequence of continuous memory-region insulating layers and continuous spacer material layers over a substrate; forming memory-region etch masks and a die-periphery etch mask over the vertically alternating sequence, wherein each of the memory-region etch masks covers a respective area of the vertically alternating sequence and comprises a respective portion of a trimmable mask material, wherein each neighboring pair of memory-region etch masks is laterally spaced from each other by a uniform mask spacing distance, and the die-periphery etch mask is laterally spaced from each of the memory-region etch masks by the uniform mask spacing distance; performing multiple iterations of a unit processing step including an anisotropic etch step and a trimming step, wherein the anisotropic etch step performs an anisotropic etch process that etches unmasked regions of the vertically alternating sequence, and the trimming step performs a mask trimming process that isotropically trims each of the memory-region etch masks, and wherein the vertically alternating sequence is divided into memory-region alternating stacks of memory-region insulating layers and spacer material layers that are laterally spaced apart and a peripheral alternating stack of peripheral insulating layers and additional spacer material layers that is laterally spaced from the memory-region alternating stacks and laterally surrounds each of the memory-region alternating stacks; forming a retro-stepped dielectric structure, wherein the retro-stepped dielectric structure comprise at least one first portion formed between a respective neighboring pair of memory-region alternating stacks and a second portion formed between the peripheral alternating stack and the memory-region alternating stacks; forming memory openings through the memory-region alternating stacks; forming memory opening fill structures in the memory openings, wherein each of the memory opening fill structures comprises a respective vertical semiconductor channel and a respective vertical stack of memory elements; and replacing the spacer material layers within the memory-region alternating stacks with electrically conductive layers.

DETAILED DESCRIPTION

Figure 1:
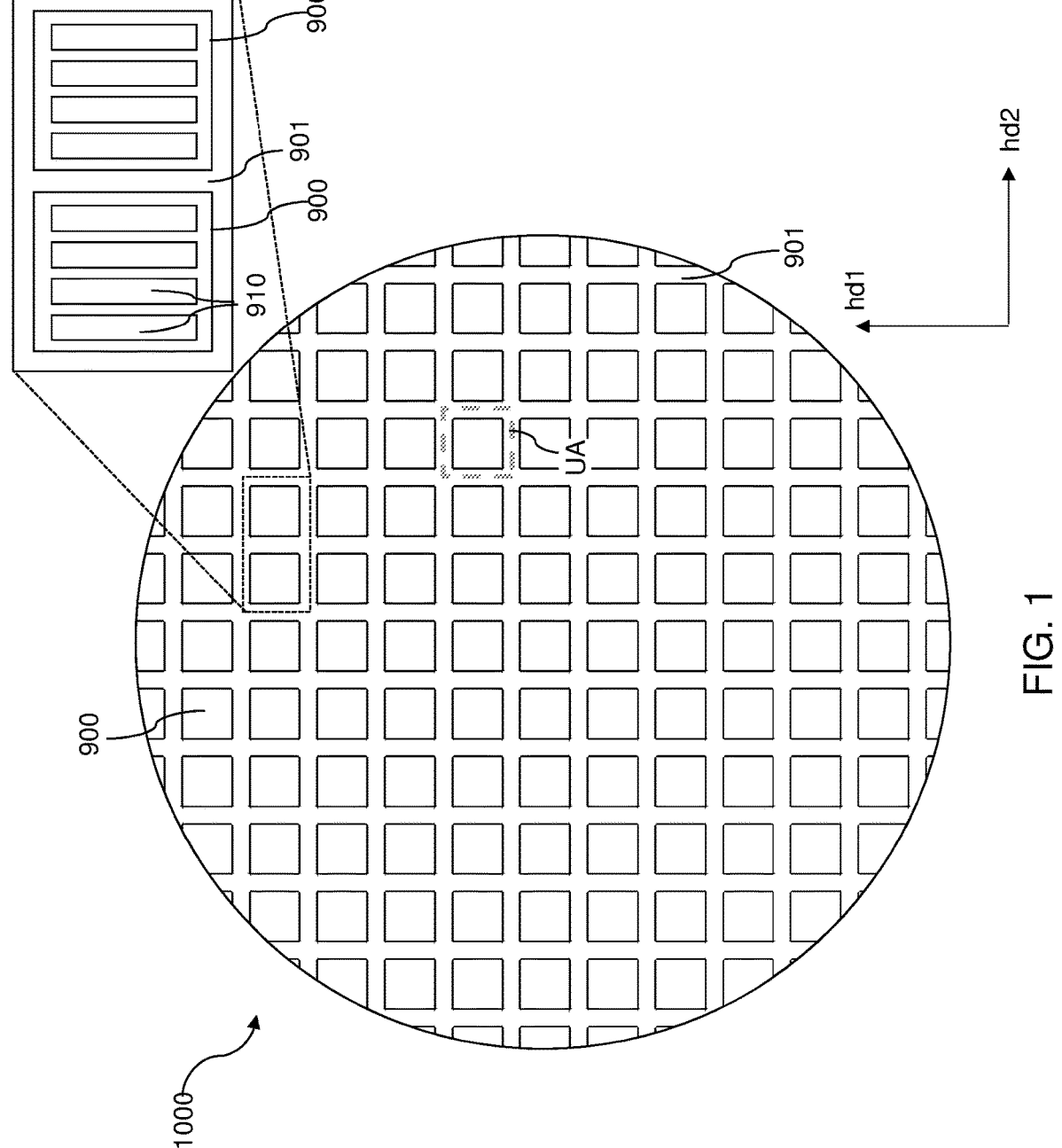
FIG. 1 is a top-down view of a first semiconductor device wafer including an array of memory dies according to an embodiment of the present disclosure.

As discussed above, the embodiments of the present disclosure are directed to a three-dimensional memory device with an edge seal structure containing a dummy stack containing a dummy staircase or a substantially planar sidewall which reduces staircase trimming distortion which in turn reduces the total area of the staircase region and methods of forming the same, the various aspects of which are now described in detail.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or from each other, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the first continuous structure. For example, a layer may be located between any pair of horizontal planes between, or at, a top surface and a bottom surface of the first continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction. As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^{5}$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^{7}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1.0 \times 10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^{7}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many number of external commands as the total number of dies therein. Each die includes one or more planes, or "memory planes." Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Referring to FIG. 1, a first semiconductor device wafer 1000 according to an embodiment of the present disclosure is illustrated. The first semiconductor device wafer 1000 includes a two-dimensional array of memory dies 900 that are arranged with a first periodicity along a first horizontal direction hd1 and with a second periodicity along a second horizontal direction hd2. Each memory die 900 can be formed within a respective unit area UA, which is the area of a unit of repetition within the two-dimensional array of memory dies 900. Each unit area includes a memory die 900 and a kerf region 901. The kerf regions 901 are located between neighboring pairs of memory dies 900 and are used for subsequent dicing of the first semiconductor device wafer 1000 to separate the memory dies 900 from each other.

According to an aspect of the present disclosure, each memory die 900 may comprise multiple planes (i.e., memory planes) 910 that are laterally spaced apart from each other. Each plane 910 may include a vertical stack of memory-region insulating layers and electrically conductive layers having stepped surfaces (i.e., staircases) at peripheral regions (i.e., staircase regions). In case mask trimming processes are employed to form the stepped surfaces, the lateral extent of horizontally-extending surfaces within the stepped surfaces can be affected by the rate of trimming of trimmable masks, which is affected by the density of trimming edges around each trimming region. Specifically, the trimming rate of a trimmable mask is high if a density of trimming edges around a trimming region is low, whereas the trimming rate of the trimmable mask is low if the density of trimming edges is high around a trimming region. Thus, the horizontal steps of stepped surfaces that are adjacent to other stepped surfaces (such as the stepped surfaces of a memory plane that is adjoined to stepped surfaces of another memory plane) can be short, while the horizontal steps of stepped surfaces of a memory plane that are adjacent to an edge of a memory die (e.g., adjacent to the kerf region 901) can be long. In other words, under the forming process of a specific horizontal step (e.g., terrace) in the staircase region, the entire semiconductor device wafer 1000 undergoes a specific trimming period of time which is then followed by an etching step. Therefore, a horizontal step (e.g., terrace) may have non-uniform step length across the entire semiconductor device wafer 1000, due to the spatial dependent trimming rate of the trimmable mask. This undesirable difference between stepped surface lengths is referred to as staircase trimming distortion, which may lead to word line contact via structures not contacting their respective conductive layer (e.g., word line) stepped surfaces in the staircase region. In order to compensate for the distortion, the lengths of all stepped surfaces may be increased. However, this undesirably increases the area of the staircase region.

The embodiments of the present disclosure provide dummy staircase regions and methods for equalizing the step widths of stepped surfaces (i.e., staircases) of memory planes when multiple memory planes are present in a memory die 900. Thus, the presence of the dummy staircase regions may actually reduce the total area of the staircase regions in the memory planes 910 because the increased lengths of the stepped surfaces in the memory places to compensate for distortion is not required. Thus, the memory cell density of each memory plane may be increased.

Figures 2A, 2B:
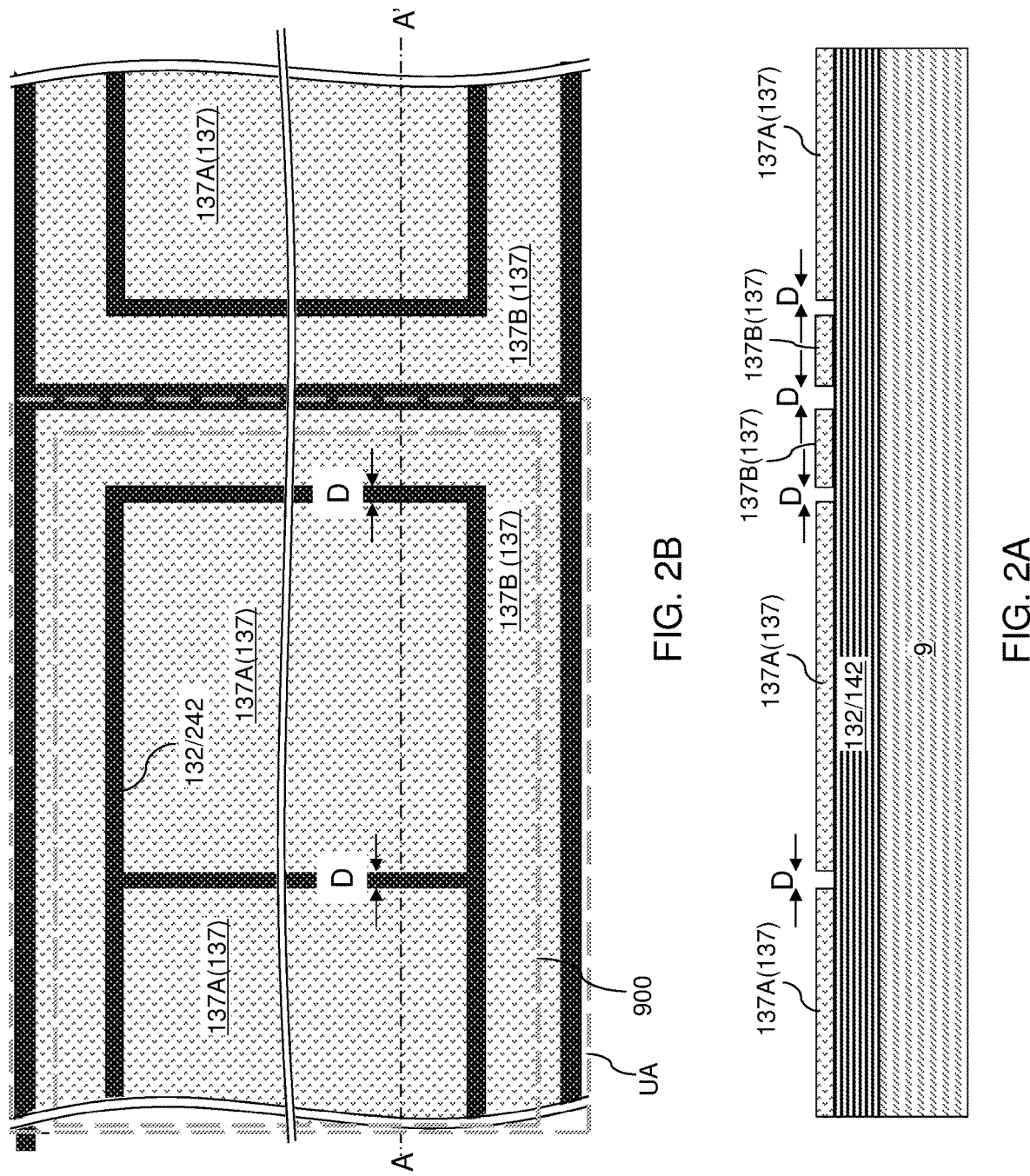
FIG. 2A is a vertical cross-sectional view of a first exemplary structure after formation of a first-tier vertically alternating sequence and application and patterning of a first trimmable etch mask layer according to a first embodiment of the present disclosure.
FIG. 2B is a top-down view of the first exemplary structure of FIG. 2A.

Referring to FIGS. 2A and 2B, a first vertically alternating sequence of first continuous insulating layers 132 and first continuous spacer material layers 142 can be formed over a memory substrate 9. As used herein, a vertically alternating sequence refers to a sequence of multiple instances of a first element and multiple instances of a second element that is arranged such that an instance of a second element is located between each vertically neighboring pair of instances of the first element, and an instance of a first element is located between each vertically neighboring pair of instances of the second element. The memory substrate 9 may be a semiconductor substrate (e.g., silicon wafer), an insulating substrate, or a conductive substrate. In one embodiment, the memory substrate 9 may be a carrier substrate that is subsequently removed. In other embodiment, the memory substrate 9 remains in the final device.

The first continuous insulating layers 132 can be composed of the first material, and the first continuous spacer material layers 142 can be composed of the second material, which is different from the first material. Each of the first continuous insulating layers 132 is an insulating layer that continuously extends over the entire area of the memory substrate 9, and may have a uniform thickness throughout. Each of the first continuous spacer material layers 142 includes is a spacer material layer that includes a dielectric material and continuously extends over the entire area of the memory substrate 9, and may have a uniform thickness throughout. Insulating materials that may be used for the first continuous insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first continuous insulating layers 132 may be silicon oxide.

The second material of the first continuous spacer material layers 142 may be a sacrificial dielectric material, which is a dielectric material that may be subsequently removed selective to the first material of the first continuous insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material. The second material of the first continuous spacer material layers 142 may be subsequently replaced with electrically conductive electrodes which may function, for example, as control gate electrodes of a vertical NAND device. In one embodiment, the first continuous spacer material layers 142 may be material layers that comprise silicon nitride.

While in the above described embodiment the first spacer material layers are formed as first continuous spacer material layers 142 that are subsequently replaced with first electrically conductive layers, embodiments are expressly contemplated herein in which the first spacer material layers are formed as first electrically conductive layers. In such embodiments, steps for replacing the material of the first spacer material layers with an electrically conductive material can be omitted.

First etch masks 137 can be formed over the first vertically alternating sequence of first continuous insulating layers 132 and first continuous spacer material layers 142. Within each unit are UA, the first etch masks 137 may comprise first memory-region etch masks 137A that are formed within the area of respective memory planes 910, and a first die-periphery etch mask 137B that is formed in a periphery of a memory die 900, which surrounds the memory planes 910 of a respective memory die 900. In one embodiment, a first die-periphery etch mask 137B may cover the entirety of a periphery of a memory die 900 which surrounds the memory planes 910. In one embodiment, the first die-periphery etch mask 137B may be located partially or entirely in the kerf region 901. Each first memory-region etch mask 137A is laterally surrounded by the first die-periphery etch mask 137B. In one embodiment, each of the first etch masks 137 may comprise a respective portion of a trimmable mask material, such as photoresist. According to an aspect of the present disclosure, each neighboring pair of first memory-region etch masks 137A is laterally spaced from each other by a first uniform mask spacing distance "D", and the first die-periphery etch mask 137B is laterally spaced from each of the first memory-region etch masks 137A by the same first uniform mask spacing distance "D". In other words, each neighboring pair of the first die-periphery etch mask 137B and a first memory-region etch mask 137A is laterally spaced from each other by the first uniform mask spacing distance "D". The first uniform mask spacing distance "D" may be in a range from 1 microns to 100 microns, although lesser and greater dimensions may also be employed.

Figures 3A, 3B:
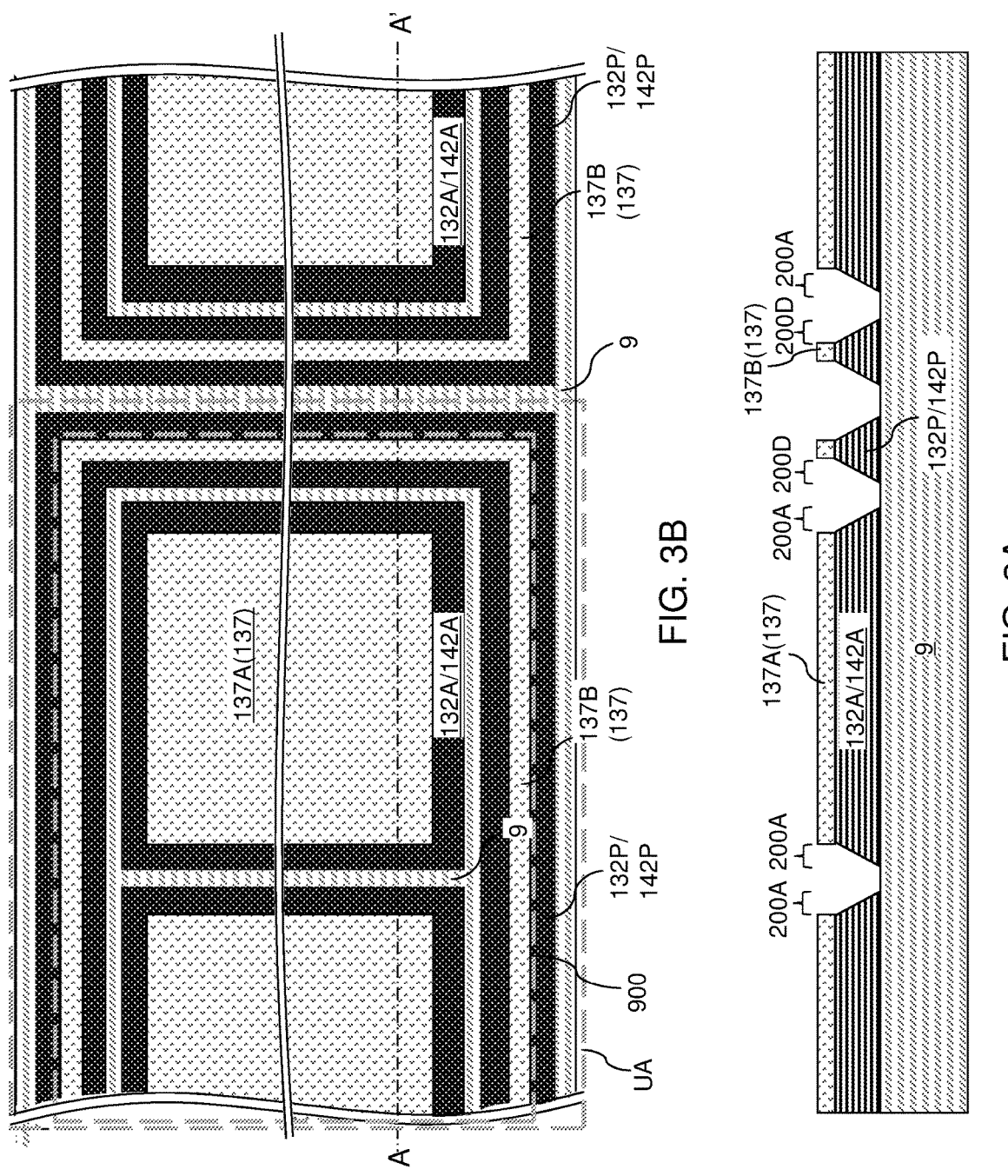
FIG. 3A is a vertical cross-sectional view of the first exemplary structure after formation of first-tier stepped surfaces according to the first embodiment of the present disclosure.
FIG. 3B is a top-down view of the first exemplary structure of FIG. 3A.

Referring to FIGS. 3A and 3B, multiple iterations of a unit processing step including an anisotropic etch step and a trimming step can be performed. The anisotropic etch step performs an anisotropic etch process that etches unmasked regions of the first vertically alternating sequence (132, 142). The trimming step performs a mask trimming process that isotropically trims each of the first etch masks 137, which includes the first memory-region etch masks 137A and the first die-periphery etch masks 137B. The first vertically alternating sequence (132, 142) is divided into first memory-region alternating stacks (132A, 142A) in the memory plane 910 region and a peripheral alternating stack (132P, 142P) in the kerf region 901 within each unit area UA.

Each first memory-region alternating stack (132A, 142A) includes a vertically alternating sequence of first memory-region insulating layers 132A and first memory-region spacer material layers 142A. The first memory-region insulating layers 132A are patterned portions of the first continuous insulating layer 132 that underlie the first memory-region etch masks 137A. The first memory-region spacer material layers 142A are patterned portions of the first continuous spacer material layers 142 that underlie the first memory-region etch masks 137A.

Each first peripheral alternating stack (132P, 142P) includes a vertically alternating sequence of first peripheral insulating layers 132P and first peripheral spacer material layers 142P. The first peripheral insulating layers 132P are patterned portions of the first continuous insulating layer 132 that underlie the first die-periphery etch masks 137B. The first peripheral spacer material layers 142P are patterned portions of the first continuous spacer material layers 142 that underlie the first die-periphery etch masks 137B.

Within each unit area UA, each first memory-region alternating stack (132A, 142A) can be formed with a respective set of stepped surfaces (i.e., active staircase regions 200A). Within each unit area UA, each first peripheral alternating stack (132P, 142P) can be formed with first stepped surfaces (i.e., dummy staircase regions 200D) facing inward toward the first memory-region alternating stacks (132A, 142A) and with second stepped surfaces facing outward away from the first memory-region alternating stacks (132A, 142A).

In one embodiment, the first uniform mask spacing (i.e., distance D) between each neighboring pairs of the first etch masks 137 causes the trimmable mask material of each of the first etch masks 137 to be isotropically trimmed during each trimming step. As a consequence, the average horizontal step width each of the stepped surfaces of the first memory-region alternating stacks (132A, 142A) and the first peripheral alternating stacks (132P, 142P) may be the same.

The present inventors realized that if an active staircase region 200A in one memory plane 910 faces an active staircase region 200A in an adjacent memory plane 910 of the same memory die 900, then the spacing between these two staircase regions is relatively small. As used herein, an active staircase region 200A contains exposed horizontal stepped surfaces of active word lines and/or select gate electrodes of the vertical NAND strings which contact respective layer contact via structures as will be described below. Therefore, the staircase slimming process is relatively slow because the aperture for the radicals (e.g., etch medium) between the two staircase regions is relatively small, and a relatively low number of radicals enter the aperture. In contrast, if the active staircase region 200A in one memory plane 910 faces the kerf region 901, then the spacing between the active staircase region 200A and another active staircase region 200A in an adjacent memory die 900 is relatively large because the spacing includes the kerf region 901. Therefore, the staircase slimming process is relatively fast because the aperture for the radicals (e.g., etch medium) between the two active staircase regions 200A is relatively large, and a relatively high number of radicals enter the aperture. Thus, the stepped surfaces are longer in the active staircase regions facing the kerf region 901 than in the active staircase regions 200A facing an adjacent memory plane 910 of the same memory die 900. This causes the above described staircase trim distortion.

However, in one embodiment, a dummy staircase region 200D is formed in the first peripheral alternating stacks (132P, 142P). As used herein, a dummy staircase region 200D does not contain exposed horizontal stepped surfaces of active word lines and/or select gate electrodes of the vertical NAND strings which contact respective layer contact via structures. The dummy staircases regions 200D may be formed on peripheral alternating stacks (132P, 142P) which lack vertical NAND strings (e.g., memory opening fill structures described below) extending therethrough. The presence of the dummy staircase region 200D causes the spacing between an active staircase region 200A on one side of the memory plane 910 which faces another active staircase region 200A of an adjacent memory plane 910 in the same memory die 900 to be the same as the spacing between an active staircase region 200A on the opposite side of the memory plane 910 and the dummy staircase region 200D on the dummy stack (e.g., peripheral alternating stack (132P, 142P)). Therefore, the apertures that expose both active staircase regions 200A on opposite sides of the edge memory plane 910 of a memory die 900 are the same. This reduces or eliminates the distortion in stepped surface length. Therefore, the stepped surface lengths of active staircase regions 200A may be minimized since distortion does not have to be accounted for, which reduces the active staircase region 200A area in each memory die 900.

In one embodiment, a first memory-region alternating stack (132A, 142A) may comprise first stepped surfaces facing another first memory-region alternating stack (132A, 142A) and second stepped surfaces facing a first peripheral alternating stack (132P, 142P). In this case, the average horizontal step width of the first stepped surfaces of the first memory-region alternating stacks (132A, 142A) is the same as an average horizontal step width of the second stepped surfaces of the first memory-region alternating stacks (132A, 142A), and is the same as an average horizontal step width of the stepped surfaces of the first peripheral alternating stack (132P, 142P). The first etch masks 137 can be subsequently removed, for example, by ashing.

Figures 4A, 4B:
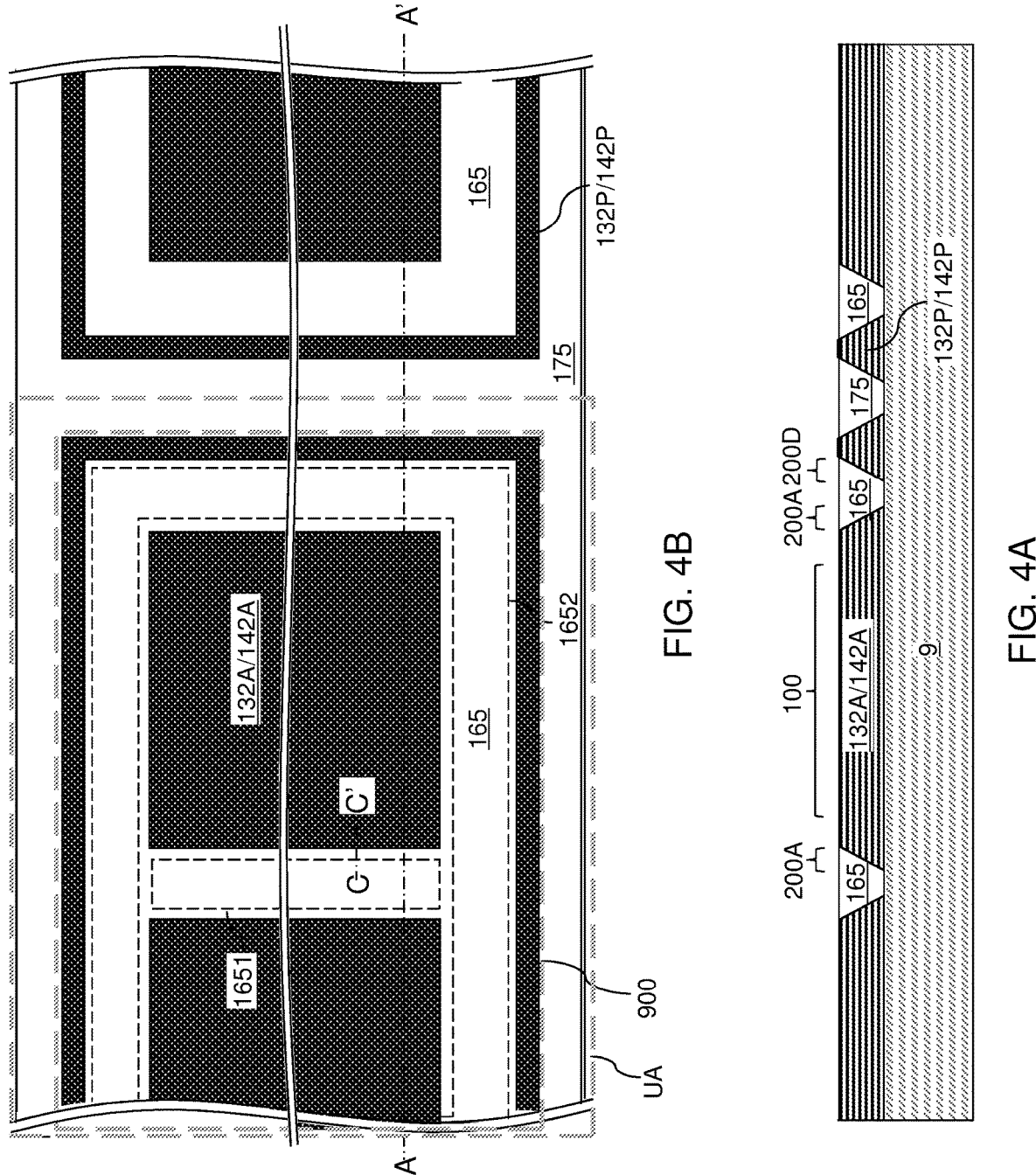
FIG. 4A is a vertical cross-sectional view of the first exemplary structure after formation of first-tier retro-stepped dielectric structures according to the first embodiment of the present disclosure.
FIG. 4B is a top-down view of the first exemplary structure of FIG. 4A.
Figure 4C:
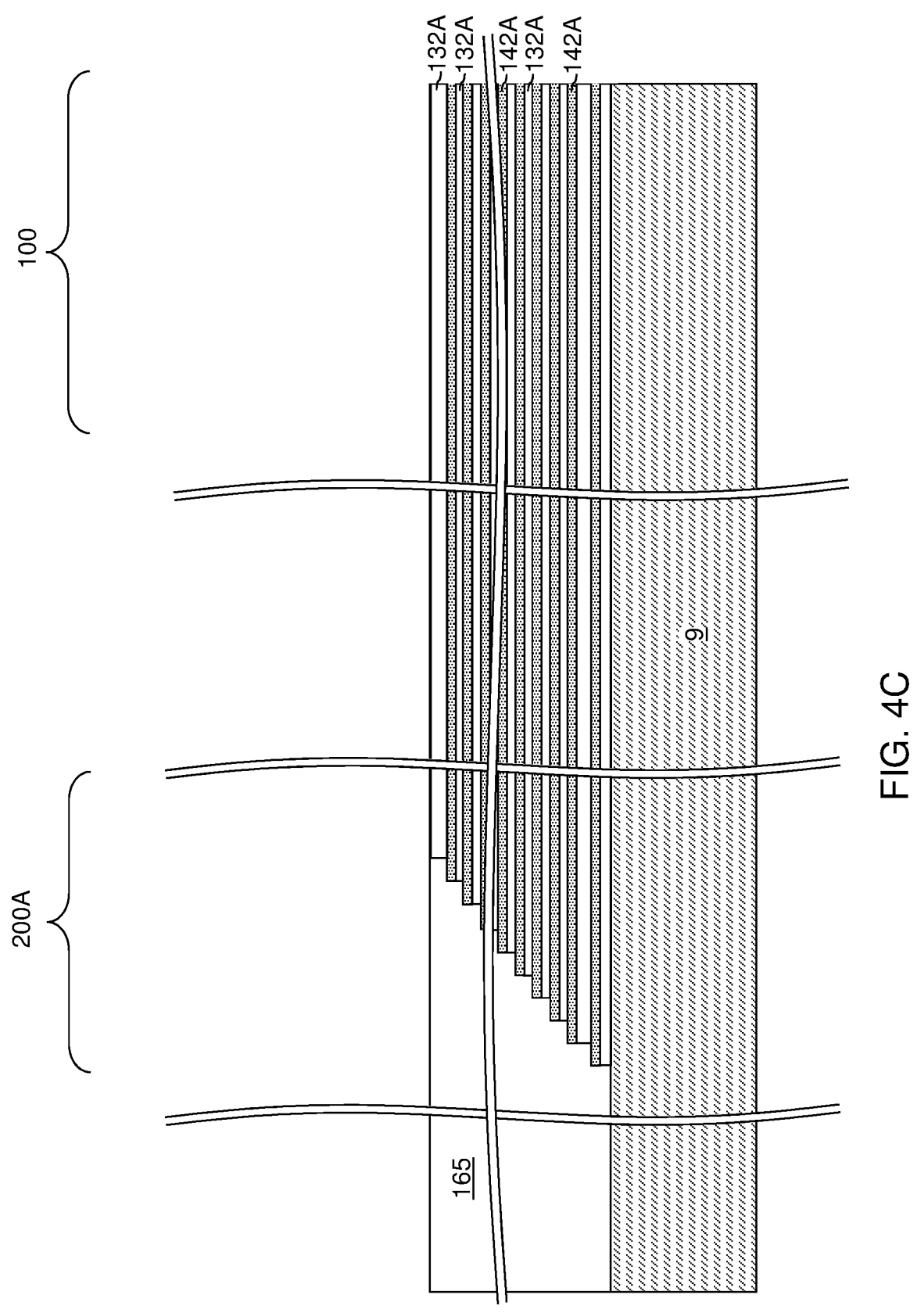
FIG. 4C is a magnified vertical cross-sectional view of a region of the first exemplary structure shown in FIG. 4A.

Referring to FIGS. 4A-4C, a dielectric fill material such as silicon oxide can be deposited over the stepped surfaces of the first memory-region alternating stacks (132A, 142A) and the first peripheral alternating stacks (132P, 142P). A planarization process (such as a chemical mechanical planarization process) can be performed to remove portions of the dielectric fill material from above the horizontal plane including the top surfaces of the first memory-region alternating stacks (132A, 142A) and the first peripheral alternating stacks (132P, 142P). Remaining portions of the dielectric fill material comprise first-tier retro-stepped dielectric structures 165 that are formed entirely within a respective first peripheral alternating stack (132P, 142P), and first-tier peripheral dielectric material portions 175 that are formed between neighboring pairs of first peripheral alternating stacks (132P, 142P) in kerf regions 901. As used herein, a "retro-stepped" element refers to an element having stepped surfaces on a bottom side. In one embodiment, each first-tier retro-stepped dielectric structure 165 can contact, and can laterally surround, each first memory-region alternating sack (132A, 142A) within a memory die 900. Each first peripheral dielectric material portion 175 located at a peripheral region of a memory die 900 is laterally spaced from the first memory-region alternating stacks (132A, 142A) within the memory die 900 by a respective first peripheral alternating stack (132P, 142P) and by a respective first-tier retro-stepped dielectric structure 165. Each first-tier retro-stepped dielectric structure 165 comprises at least one first portion 1651 (which may be a plurality of first portions 1651) located between a neighboring pair of first memory-region alternating stacks (132A, 142A) and a second portion 1652 located between the first peripheral alternating stack (132P, 142P) and the first memory-region alternating stacks (132A, 142A).

The first exemplary structure includes a memory array region 100 within the area of each of the first memory-region alternating stacks (132A, 142A). Each memory array region 100 is a region in which a three-dimensional memory array is to be subsequently formed. A peripheral area of each first memory-region alternating stack (132A, 142A) includes the active staircase regions 200A containing stepped surfaces of first memory-region alternating stack (132A, 142A) or stepped surfaces to be patterned on an additional alternating stack that is to be subsequently formed. This peripheral area is herein referred to as the active staircase region 200A. In one embodiment, each active staircase region 200A may laterally enclose a respective memory array region 100.

Figure 5:
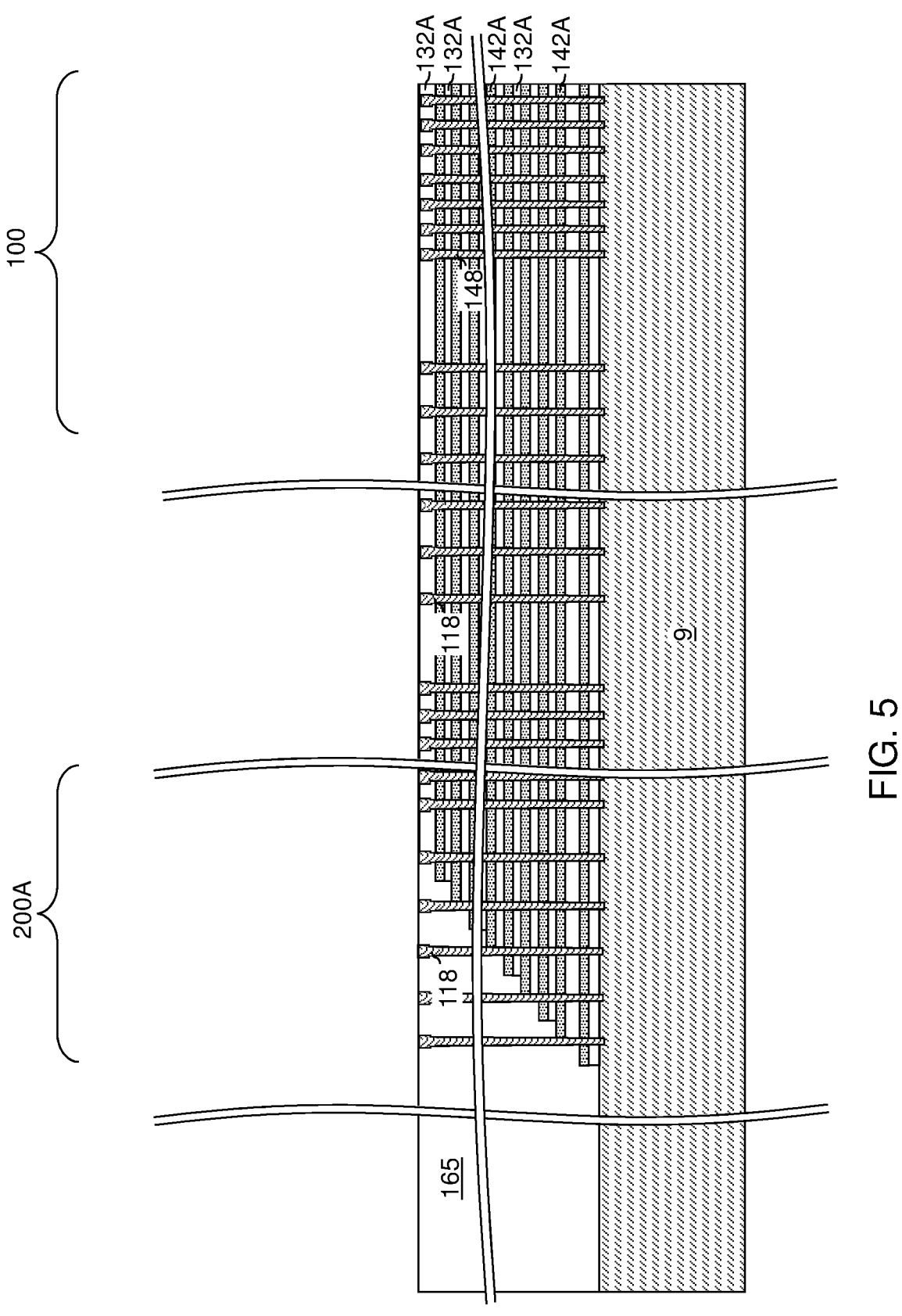
FIG. 5 is a vertical cross-sectional view of the first exemplary structure after formation of a first-tier structure according to the first embodiment of the present disclosure.

Referring to FIG. 5, various first-tier openings may be formed through the first memory-region alternating stacks (132A, 142A) and into the memory substrate 9. A photoresist layer (not shown) may be applied over the first exemplary structure, and may be lithographically patterned to form various openings therethrough. The pattern of openings in the photoresist layer may be transferred through the first memory-region alternating stacks (132A, 142A) and into the memory substrate 9 by a first anisotropic etch process to form the various first-tier openings concurrently, i.e., during the first isotropic etch process.

The various first-tier openings may include first-tier memory openings formed in the memory array regions 100 and first-tier support openings formed in the active staircase regions 200A. Each cluster of first-tier memory openings may be formed as a two-dimensional array of first-tier memory openings. The first-tier support openings are openings that are formed in the active staircase regions 200A, and are subsequently employed to form support pillar structures. A subset of the first-tier support openings may be formed through a respective horizontal surface of the first stepped surfaces.

Sacrificial first-tier opening fill portions (148, 128) may be formed in the various first-tier openings. For example, a sacrificial first-tier fill material is deposited concurrently deposited in each of the first-tier openings. The sacrificial first-tier fill material includes a material that may be subsequently removed selective to the materials of the first memory-region insulating layers 132 and the first continuous spacer material layers 142.

In one embodiment, the sacrificial first-tier fill material may include a semiconductor material such as silicon (e.g., a-Si or polysilicon), a silicon-germanium alloy, germanium, a III-V compound semiconductor material, or a combination thereof. Optionally, a thin etch stop liner (such as a silicon oxide layer or a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In another embodiment, the sacrificial first-tier fill material may include a silicon oxide material having a higher etch rate than the materials of the first memory-region insulating layers 132. For example, the sacrificial first-tier fill material may include borosilicate glass or porous or non-porous organosilicate glass having an etch rate that is at least 100 times higher than the etch rate of densified TEOS oxide (i.e., a silicon oxide material formed by decomposition of tetra-ethylorthosilicate glass in a chemical vapor deposition process and subsequently densified in an anneal process) in a 100:1 dilute hydrofluoric acid. In this case, a thin etch stop liner (such as a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In yet another embodiment, the sacrificial first-tier fill material may include carbon-containing material (such as amorphous carbon or diamond-like carbon) that may be subsequently removed by ashing, or a silicon-based polymer that may be subsequently removed selective to the materials of the first memory-region alternating stacks (132A, 142A).

Portions of the deposited sacrificial material may be removed from above the topmost layer of the first memory-region alternating stacks (132A, 142A), such as from above the topmost first memory-region insulating layer 132A. For example, the sacrificial first-tier fill material may be recessed to a top surface of the topmost first memory-region insulating layer 132A using a planarization process. The planarization process may include a recess etch, chemical mechanical planarization (CMP), or a combination thereof. The top surface of the topmost first memory-region insulating layer 132A may be used as an etch stop layer or a planarization stop layer.

Remaining portions of the sacrificial first-tier fill material comprise sacrificial first-tier opening fill portions (148, 128). Specifically, each remaining portion of the sacrificial material in a first-tier memory opening constitutes a sacrificial first-tier memory opening fill portion 148. Each remaining portion of the sacrificial material in a first-tier support opening constitutes a sacrificial first-tier support opening fill portion 128. The various sacrificial first-tier opening fill portions (148, 128) are concurrently formed, i.e., during a same set of processes including the deposition process that deposits the sacrificial first-tier fill material and the planarization process that removes the first-tier deposition process from above the first memory-region alternating stacks (132A, 142A) (such as from above the top surface of the topmost first memory-region insulating layer 132A). The top surfaces of the sacrificial first-tier opening fill portions (148, 128) may be coplanar with the top surface of the topmost first memory-region insulating layer 132. Each of the sacrificial first-tier opening fill portions (148, 128) may, or may not, include cavities therein. The set of all structures located between a horizontal plane including the bottommost surface of the first memory-region alternating stacks (132A, 142A) and the horizontal plane including the topmost surface of the first memory-region alternating stacks (132A, 142A) and/or embedded within the first memory-region alternating stacks (132A, 142A) constitutes a first-tier structure.

Figures 6A, 6B:
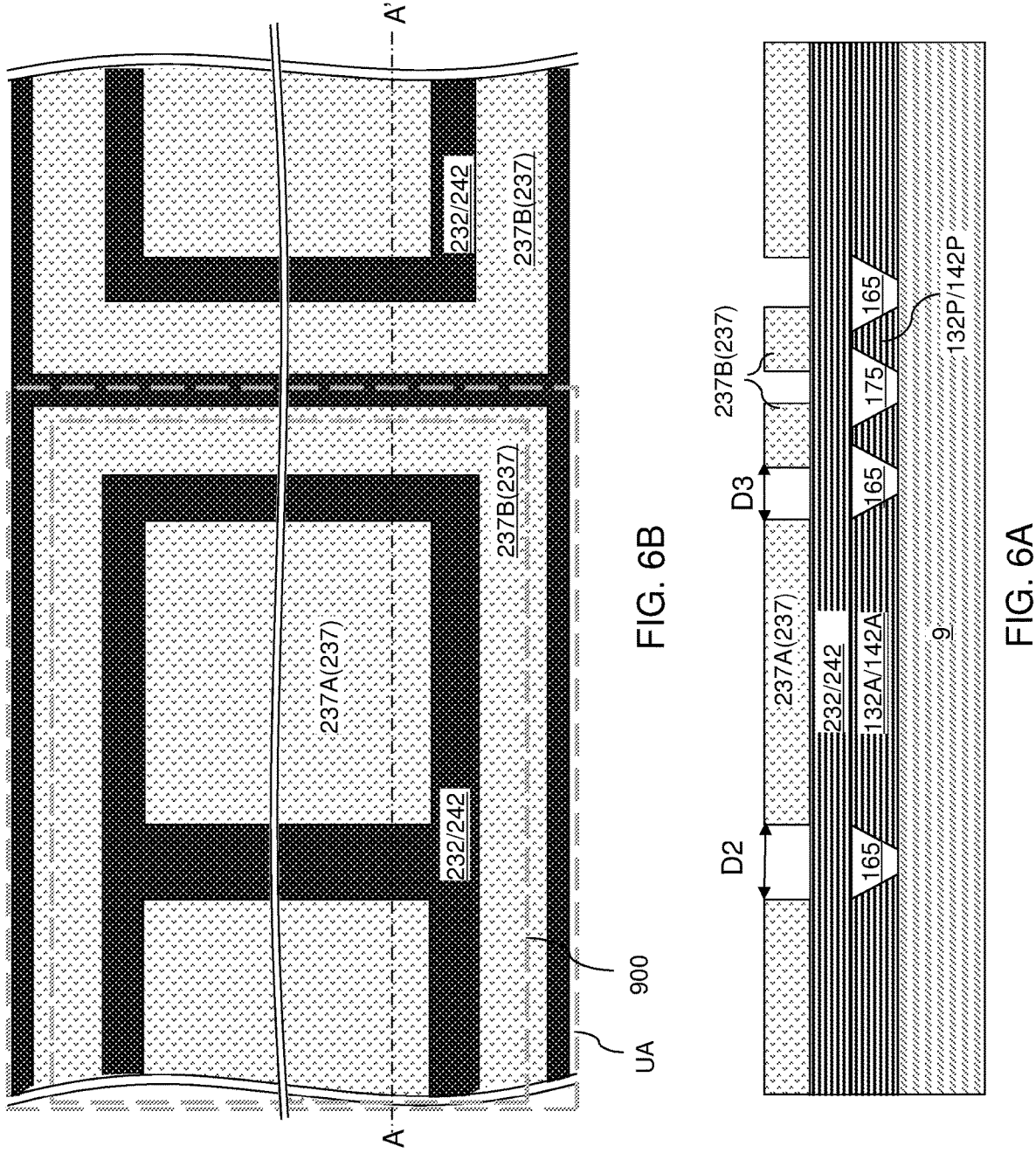
FIG. 6A is a vertical cross-sectional view of a first exemplary structure after formation of a second-tier vertically alternating sequence and application and patterning of a second trimmable etch mask layer according to a first embodiment of the present disclosure.
FIG. 6B is a top-down view of the first exemplary structure of FIG. 6A.

Referring to FIGS. 6A and 6B, a second vertically alternating sequence of second continuous insulating layers 232 and second continuous spacer material layers 242 can be formed over the first-tier structure. The second continuous insulating layers 232 can comprise the same material as the first continuous insulating layers 132, and the second continuous spacer material layers 242 can comprise the same material as the first continuous spacer material layers 132. Each of the second continuous insulating layers 232 is an insulating layer that continuously extends over the entire area of the memory substrate 9, and may have a uniform thickness throughout. Each of the second continuous spacer material layers 242 includes a spacer material layer that includes a dielectric material and continuously extends over the entire area of the memory substrate 9, and may have a uniform thickness throughout.

Generally, at least one vertically alternating sequence of unit layer stacks can be formed over a substrate. Each of the unit layer stacks comprises a continuous insulating layer (such as a first continuous insulating layer 132 or a second continuous insulating layer 232) and a continuous spacer material layer (such as a first continuous spacer material layer 142 or a second continuous spacer material layer 242). While two vertically alternating sequences are employed to form a first-tier structure and a second-tier structure in the above embodiments, other embodiments are expressly contemplated herein in which only a first-tier structure is formed, or three- or more vertically alternating sequences of respective continuous insulating layers and respective continuous spacer material layers are employed to form three or more tier structures. Appropriate modifications to the patterning processes can be made as needed.

Second etch masks 237 can be formed over the second vertically alternating sequence of second continuous insulating layers 232 and second continuous spacer material layers 242. Within each unit are UA, the second etch masks 237 may comprise second memory-region etch masks 237A that are formed within the area of memory planes 910 and a second die-periphery etch mask 237B that is formed around a periphery of the respective memory die 900 (e.g., in the kerf region 901). In one embodiment, the second die-periphery etch mask 237B may cover the entirety of a periphery of a memory die 900. Each second memory-region etch mask 237A is laterally surrounded by the second die-periphery etch mask 237B. In one embodiment, each of the second etch masks 237 may comprise a respective portion of a trimmable mask material, such as photoresist. According to an aspect of the present disclosure, each neighboring pair of second memory-region etch masks 237A is laterally spaced from each other by a second uniform mask spacing distance D2. In one embodiment, the second die-periphery etch mask 237B may be laterally spaced from each of the second memory-region etch masks 237A by a third lateral mask spacing D3 which is the same as or less than the second lateral spacing distance D2.

In one embodiment, the second uniform mask spacing distance may be greater than the width of each portion of the top surface of the first-tier retro-stepped dielectric structures 165 located between neighboring pairs of first memory-region alternating stacks (132A, 142A). In this case, the entirety of each second memory-region etch mask 237A may be located within the area of a topmost surface of an underlying first memory-region alternating stack (132A, 142A).

In one embodiment, each second die-periphery etch mask 237B may have a substantially same area as a respective first die-periphery etch mask 137B that is previously formed over a same memory die 900. In this case, each second die-periphery etch mask 237B may have an areal overlap with an outer portion of a respective first portion 1651 of the first-tier retro-stepped dielectric structure 165 and an inner portion of a respective first-tier peripheral dielectric material portions 175.

Figures 7A, 7B:
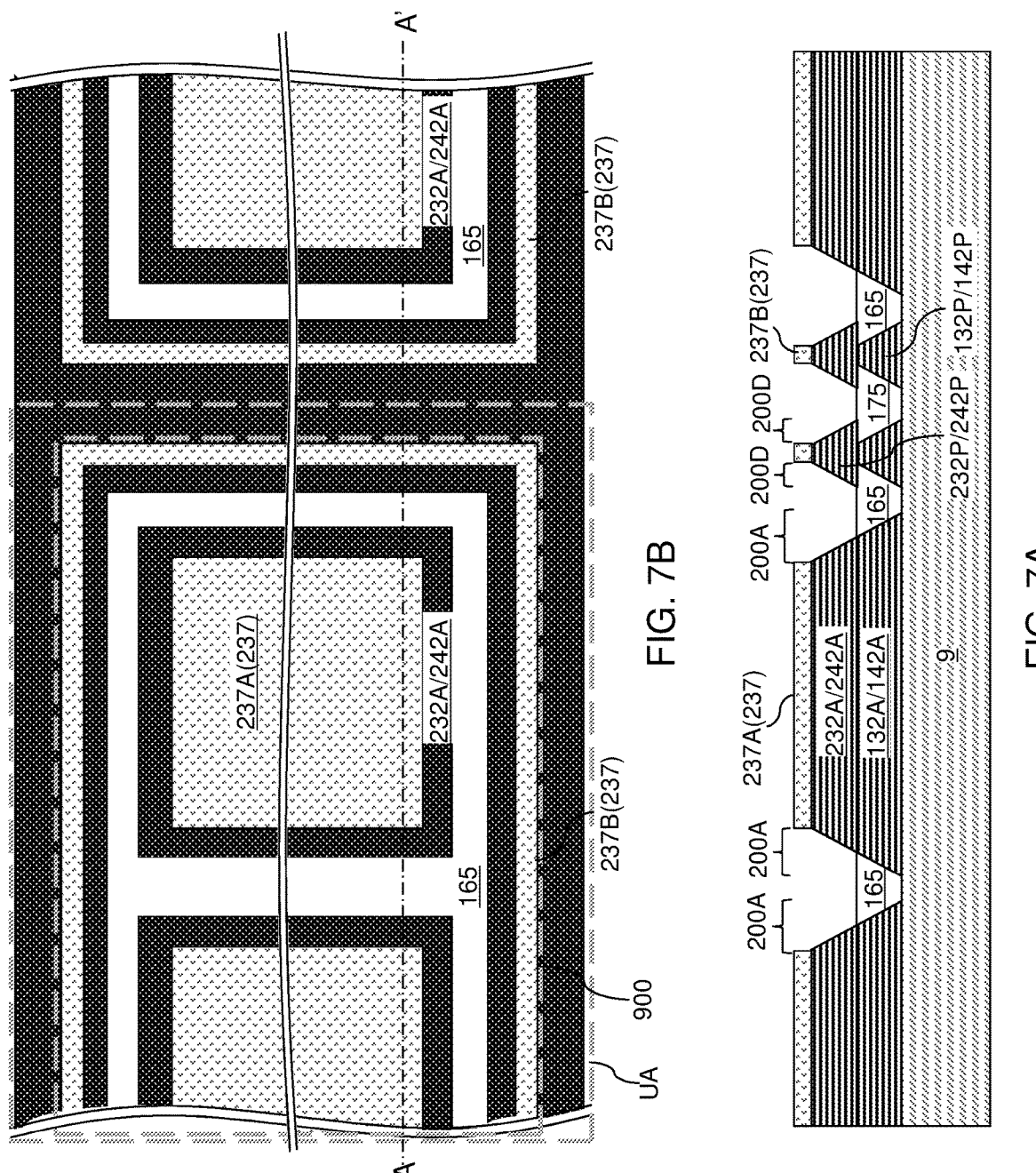
FIG. 7A is a vertical cross-sectional view of the first exemplary structure after formation of second-tier stepped surfaces according to the first embodiment of the present disclosure.
FIG. 7B is a top-down view of the first exemplary structure of FIG. 7A.

Referring to FIGS. 7A and 7B, multiple iterations of a unit processing step including an anisotropic etch step and a trimming step can be performed. The anisotropic etch step performs an anisotropic etch process that etches unmasked regions of the second vertically alternating sequence (232, 242). The trimming step performs a mask trimming process that isotropically trims each of the second etch masks 237, which includes the second memory-region etch masks 237A and the second die-periphery etch masks 237B. The second vertically alternating sequence (232, 242) is divided into second memory-region alternating stacks (232A, 242A) and a peripheral alternating stack (232P, 242P) within each unit area UA.

Each second memory-region alternating stack (232A, 242A) includes a vertically alternating sequence of second memory-region insulating layers 232A and second memory-region spacer material layers 242A. The second memory-region insulating layers 232A are patterned portions of the second continuous insulating layer 232 that underlie the second memory-region etch masks 237A. The second memory-region spacer material layers 242A are patterned portions of the second continuous spacer material layers 242 that underlie the second memory-region etch masks 237A.

Each second peripheral alternating stack (232P, 242P) includes a vertically alternating sequence of second peripheral insulating layers 232P and second peripheral spacer material layers 242P. The second peripheral insulating layers 232P are patterned portions of the second continuous insulating layer 232 that underlie the second die-periphery etch masks 237B. The second peripheral spacer material layers 242P are patterned portions of the second continuous spacer material layers 242 that underlie the second die-periphery etch masks 237B.

Within each unit area UA, each second memory-region alternating stack (232A, 242A) can be formed with a respective set of stepped surfaces in the active staircase region 200A. Within each unit area UA, each second peripheral alternating stack (232P, 242P) can be formed with first stepped surfaces in the first dummy staircase region 200D facing inward toward the second memory-region alternating stacks (232A, 242A) and with second stepped surfaces facing outward away from the second memory-region alternating stacks (232A, 242A) in a second dummy staircase region 200D.

Each second memory-region alternating stack (232A, 242A) can be formed entirely within the area of the topmost surface of a respective underlying first memory-region alternating stack (132A, 142A). Each second peripheral alternating stack (232P, 242P) may have a greater bottom surface area than the area of the top surface of a respective underlying first peripheral alternating stack (132P, 142P). In one embodiment, each second peripheral alternating stack (232P, 242P) may contact an outer portion of the top surface of a respective in-die first-tier retro-stepped dielectric structure (which is a first-tier retro-stepped dielectric structure 165 of a first type that is located entirely within the area of a memory die 900) and an inner portion of the top surface of a respective kerf first-tier retro-stepped dielectric structure (which is a first-tier retro-stepped dielectric structure 165 of a second type that is located partly within the kerf regions 901 and partly in peripheral regions of memory dies 900). The second etch masks 237 can be subsequently removed, for example, by ashing.

Figures 8A, 8B:
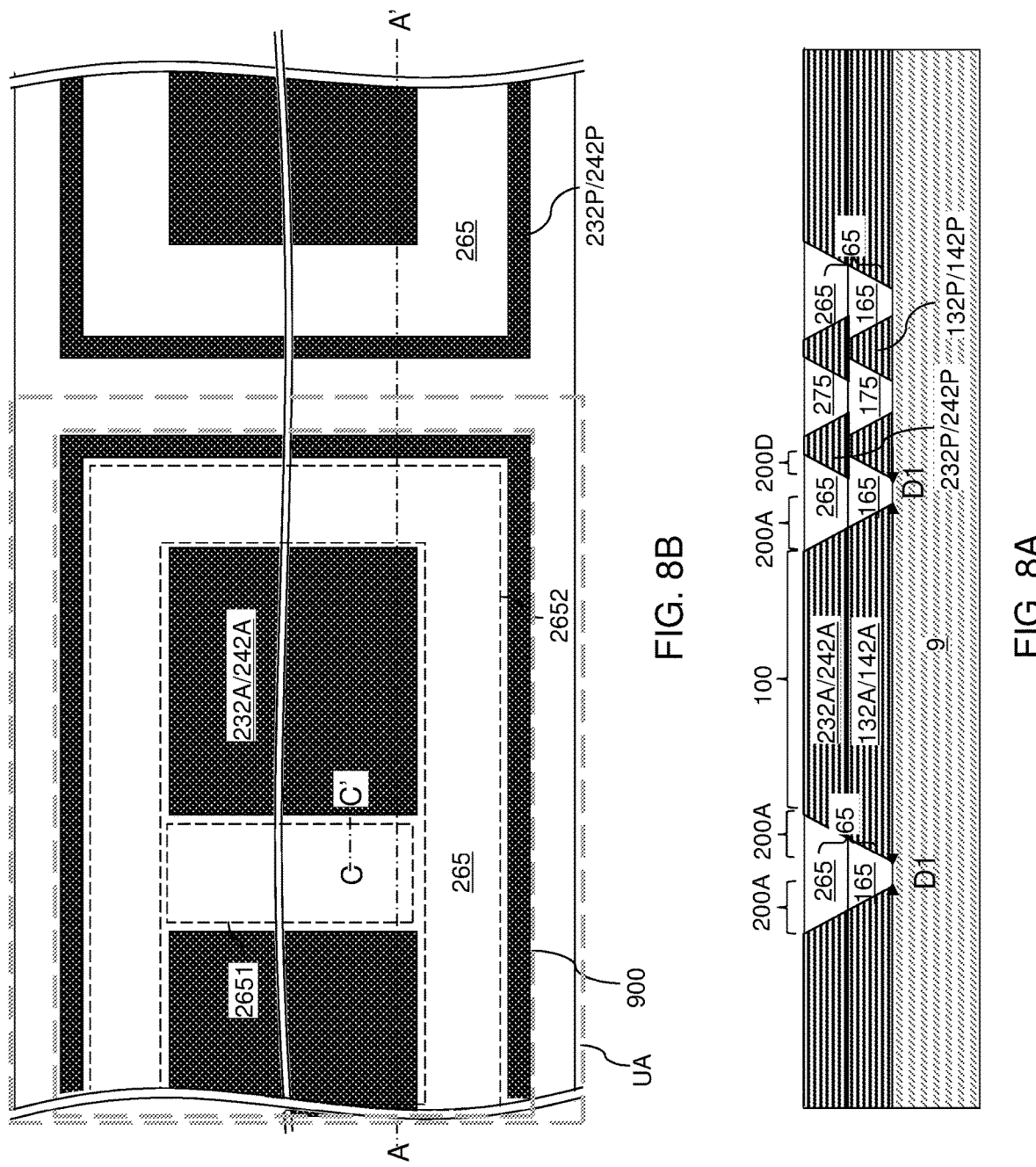
FIG. 8A is a vertical cross-sectional view of the first exemplary structure after formation of second-tier retro-stepped dielectric structures according to the first embodiment of the present disclosure.
FIG. 8B is a top-down view of the first exemplary structure of FIG. 8A.
Figure 8C:
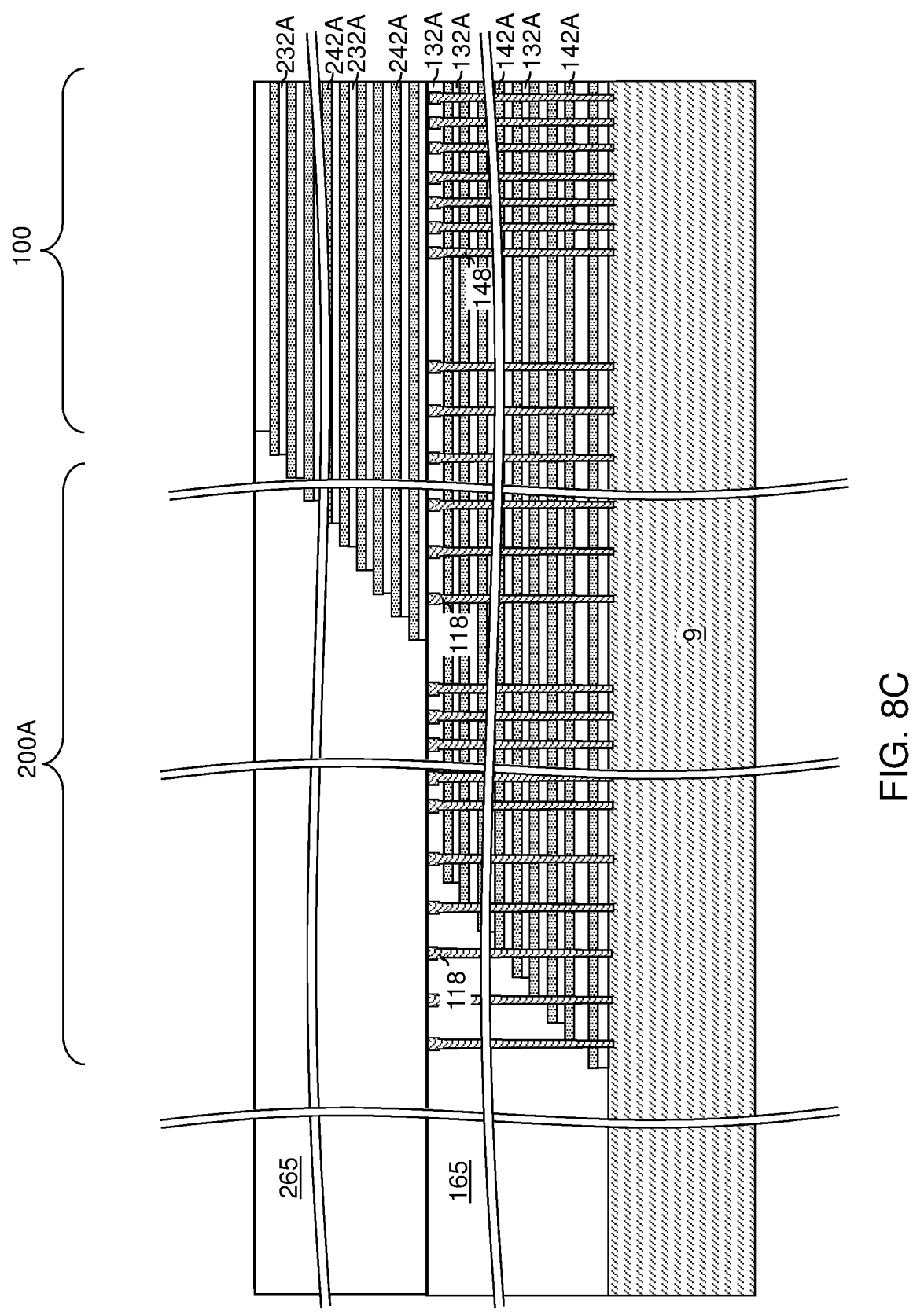
FIG. 8C is a magnified vertical cross-sectional view of a region of the first exemplary structure shown in FIG. 8A.

Referring to FIGS. 8A-8C, a dielectric fill material such as silicon oxide can be deposited over the stepped surfaces of the second memory-region alternating stacks (232A, 242A) and the second peripheral alternating stacks (232P, 242P). A planarization process (such as a chemical mechanical planarization process) can be performed to remove portions of the dielectric fill material from above the horizontal plane including the top surfaces of the second memory-region alternating stacks (232A, 242A) and the second peripheral alternating stacks (232P, 242P). Remaining portions of the dielectric fill material comprise second-tier retro-stepped dielectric structures 265 that are formed entirely within a respective second peripheral alternating stack (232P, 242P), and second-tier peripheral dielectric material portions 275 that are formed between neighboring pairs of second peripheral alternating stacks (232P, 242P) in kerf regions 901. In one embodiment, each second-tier retro-stepped dielectric structure 265 can contact, and can laterally surround, each first memory-region alternating sack (132A, 142A) within a memory die 900. Each second peripheral dielectric material portion 275 located at a peripheral region of a memory die 900 is laterally spaced from the second memory-region alternating stacks (232A, 242A) located within the memory die 900 by a respective second peripheral alternating stack (232P, 242P) and by a respective second-tier retro-stepped dielectric structure 265. Each second-tier retro-stepped dielectric structure 265 comprises at least one first portion 2651 (which may be a plurality of first portions 2651) located between a neighboring pair of second memory-region alternating stacks (232A, 242A) and a second portion 2652 located between the second peripheral alternating stack (232P, 242P) and the second memory-region alternating stacks (232A, 242A).

The first exemplary structure includes a memory array region 100 within the area of each of the second memory-region alternating stacks (232A, 242A). Each memory array region 100 is a region in which a three-dimensional memory array is to be subsequently formed. An active staircase region 200A includes stepped surfaces of second memory-region alternating stack (232A, 242A) and stepped surfaces of the first memory-region alternating stack (132A, 142A), and laterally enclose a respective memory array region 100. Each stack of a first-tier retro-stepped dielectric structure 165 and a second-tier retro-stepped dielectric structure 265 is herein referred to as a dielectric structure stack 65, or as a retro-stepped dielectric structure 65.

Figure 9:
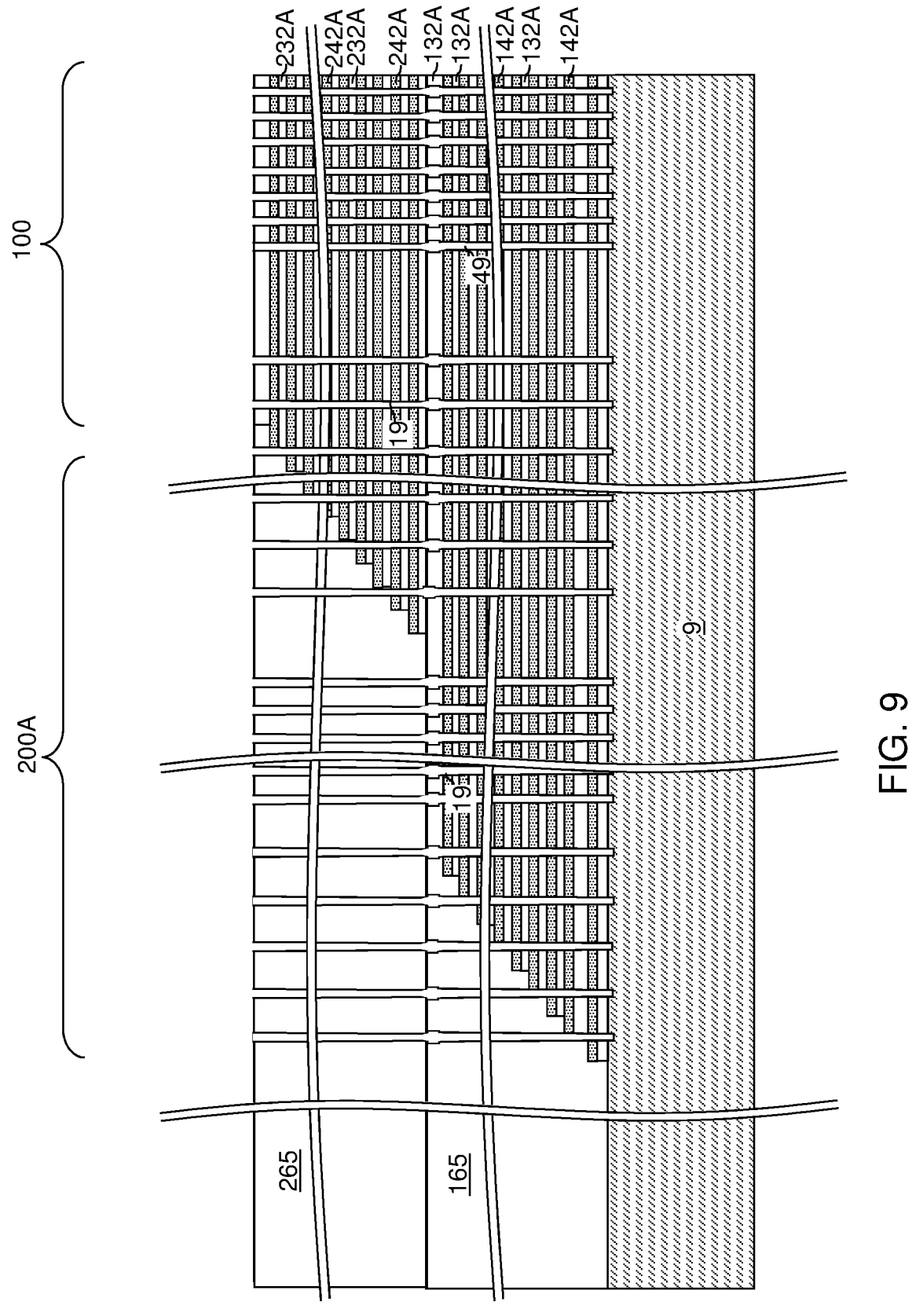
FIG. 9 is a vertical cross-sectional view of the first exemplary structure after formation of second-tier openings according to the first embodiment of the present disclosure.

Referring to FIG. 9, various second-tier openings may be formed through the second memory-region alternating stacks (232A, 242A). A photoresist layer (not shown) may be applied over the first exemplary structure, and may be lithographically patterned to form various openings therethrough. The pattern of openings in the photoresist layer may be transferred through the second memory-region alternating stacks (232A, 242A) by a second anisotropic etch process to form the various second-tier openings concurrently, i.e., during the second isotropic etch process.

The various second-tier openings may include second-tier memory openings formed in the memory array regions 100 and second-tier support openings formed in the active staircase regions 200A. Each cluster of second-tier memory openings may be formed as a two-dimensional array of second-tier memory openings. The second-tier support openings are openings that are formed in the active staircase regions 200A, and are subsequently employed to form support pillar structures. A subset of the second-tier support openings may be formed through a respective horizontal surface of the second stepped surfaces.

The sacrificial first-tier fill material of the sacrificial first-tier opening fill portions (148, 128) may be removed using an etch process that etches the sacrificial first-tier fill material selective to the materials of the second memory-region alternating stacks (232A, 242A) and the first memory-region alternating stacks (132A, 142A). A memory opening, which is also referred to as an inter-tier memory opening 49, is formed in each combination of a second-tier memory openings and a volume from which a sacrificial first-tier memory opening fill portion 148 is removed. A support opening, which is also referred to as an inter-tier support opening 19, is formed in each combination of a second-tier support openings and a volume from which a sacrificial first-tier support opening fill portion 128 is removed. The inter-tier memory opening 49 extends through the first-tier structure and the second-tier structure. Generally, memory openings 49 can be formed within each memory array region 100, in which each layer of the second memory-region alternating stacks (232A, 242A) and the first memory-region alternating stacks (132A, 142A) is present.

Figures 10A, 10B:
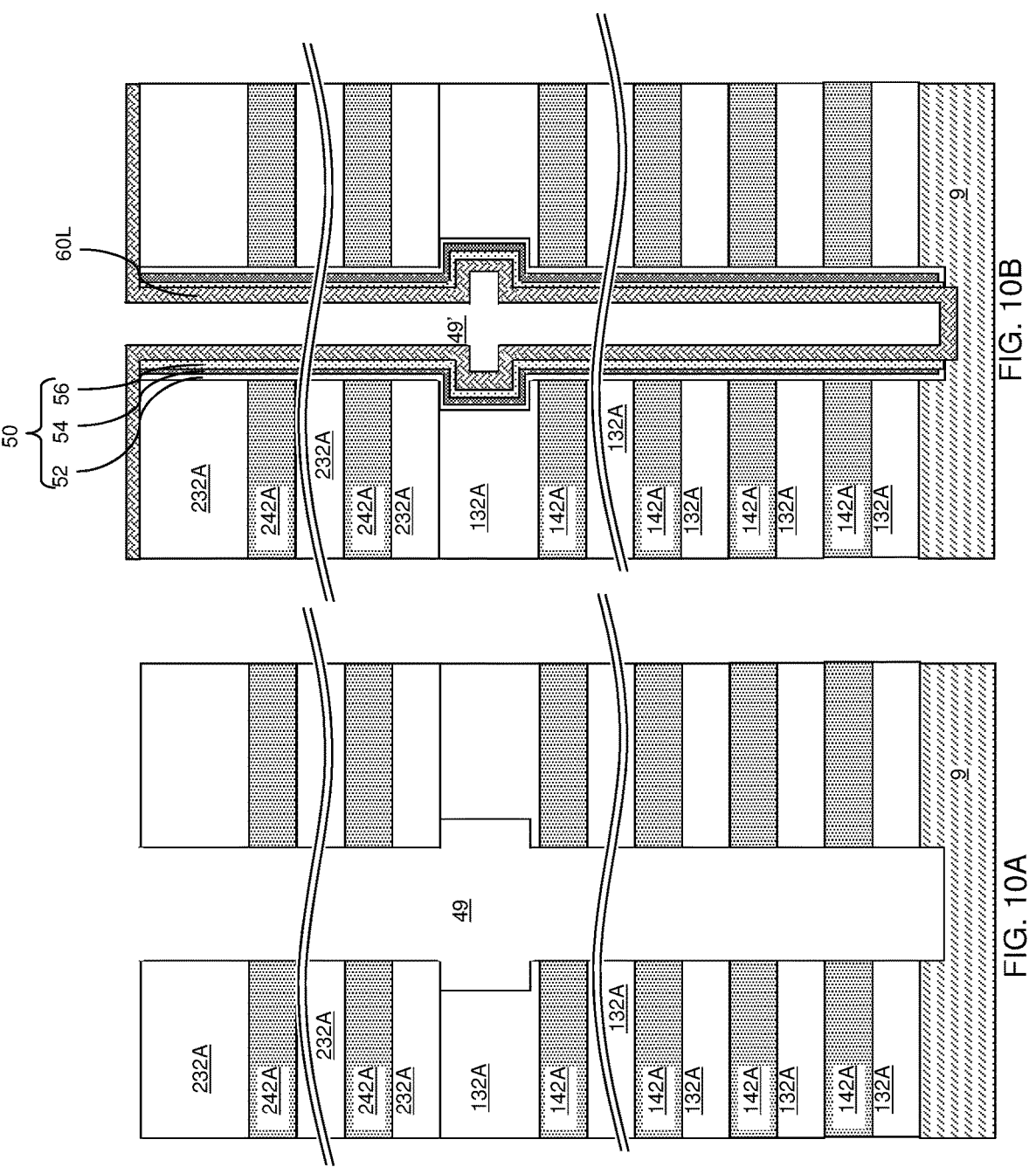
FIGS. 10A-10D illustrate sequential vertical cross-sectional views of a memory opening during formation of a memory opening fill structure according to the first embodiment of the present disclosure.

FIGS. 10A-10D illustrate sequential vertical cross-sectional views of a memory opening 49 during formation of a memory opening fill structure 58 according to the first embodiment of the present disclosure. Referring to FIG. 10A, a memory opening 49 in the first exemplary structure of FIG. 9 is illustrated.

Referring to FIG. 10B, a stack of layers including a blocking dielectric layer 52, a memory material layer 54, a tunneling dielectric layer 56, and a sacrificial cover layer (not shown) may be sequentially deposited in the inter-tier memory openings 49. The blocking dielectric layer 52 may include a single dielectric material layer or a stack of a plurality of dielectric material layers. In one embodiment, the blocking dielectric layer may include a dielectric metal oxide layer consisting essentially of a dielectric metal oxide. Alternatively or additionally, the blocking dielectric layer 52 may include a dielectric semiconductor compound such as silicon oxide, silicon oxynitride, silicon nitride, or a combination thereof. In one embodiment, the blocking dielectric layer 52 may include a layer stack of an aluminum oxide layer and a silicon oxide layer.

Subsequently, the memory material layer 54 may be formed. In one embodiment, the memory material layer 54 may be a continuous layer or patterned discrete portions of a charge trapping material including a dielectric charge trapping material, which may be, for example, silicon nitride. Alternatively, the memory material layer 54 may include a continuous layer or patterned discrete portions of a conductive material such as doped polysilicon or a metallic material that is patterned into multiple electrically isolated portions (e.g., floating gates), for example, by being formed within lateral recesses into memory-region spacer material layers (142A, 242A). The thickness of the memory material layer 54 may be in a range from 2 nm to 20 nm, although lesser and greater thicknesses may also be used.

The tunneling dielectric layer 56 includes a dielectric material through which charge tunneling may be performed under suitable electrical bias conditions. The charge tunneling may be performed through hot-carrier injection or by Fowler-Nordheim tunneling induced charge transfer depending on the mode of operation of the three-dimensional NAND string memory device to be formed. The tunneling dielectric layer 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. The thickness of the tunneling dielectric layer 56 may be in a range from 2 nm to 20 nm, although lesser and greater thicknesses may also be used. The stack of the blocking dielectric layer 52, the memory material layer 54, and the tunneling dielectric layer 56 constitutes a memory film 50 that stores memory bits. The sacrificial cover layer includes a sacrificial material that may be removed selective to the tunneling dielectric layer 56. For example, the sacrificial cover layer may comprise amorphous carbon or amorphous silicon.

An anisotropic etch process may be performed to remove horizontally-extending portions of the sacrificial cover layer. Each remaining contiguous set of cylindrical portions of the blocking dielectric layer 52, the memory material layer 54, and the tunneling dielectric layer constitutes a memory film 50.

A semiconductor channel material layer 60L can be subsequently deposited on the physically exposed surfaces of the memory substrate 9 and on inner sidewalls of the memory films 50. The semiconductor channel material layer 60L includes a p-doped semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L may have a uniform doping. In one embodiment, the semiconductor channel material layer 60L has a p-type doping in which p-type dopants (such as boron atoms) are present at an atomic concentration in a range from $1.0 \times 10^{12}/cm^3$ to $1.0 \times 10^{18}/cm^3$, such as from $1.0 \times 10^{14}/cm^3$ to $1.0 \times 10^{17}/cm^3$. In one embodiment, the semiconductor channel material layer 60L includes, and/or consists essentially of, boron-doped amorphous silicon or boron-doped polysilicon. In another embodiment, the semiconductor channel material layer 60L has an n-type doping in which n-type dopants (such as phosphor atoms or arsenic atoms) are present at an atomic concentration in a range from $1.0 \times 10^{12}/cm^3$ to $1.0 \times 10^{18}/cm^3$, such as from $1.0 \times 10^{14}/cm^3$ to $1.0 \times 10^{17}/cm^3$. The semiconductor channel material layer 60L may be formed by a conformal deposition method such as low pressure chemical vapor deposition (LPCVD). The thickness of the semiconductor channel material layer 60L may be in a range from 2 nm to 10 nm, although lesser and greater thicknesses may also be used. A cavity 49' is formed in the volume of each inter-tier memory opening 49 that is not filled with the deposited material layers (52, 54, 56, 60L). A cavity 49' may be present in an unfilled volume of each memory opening 49.

Figures 10C, 10D:
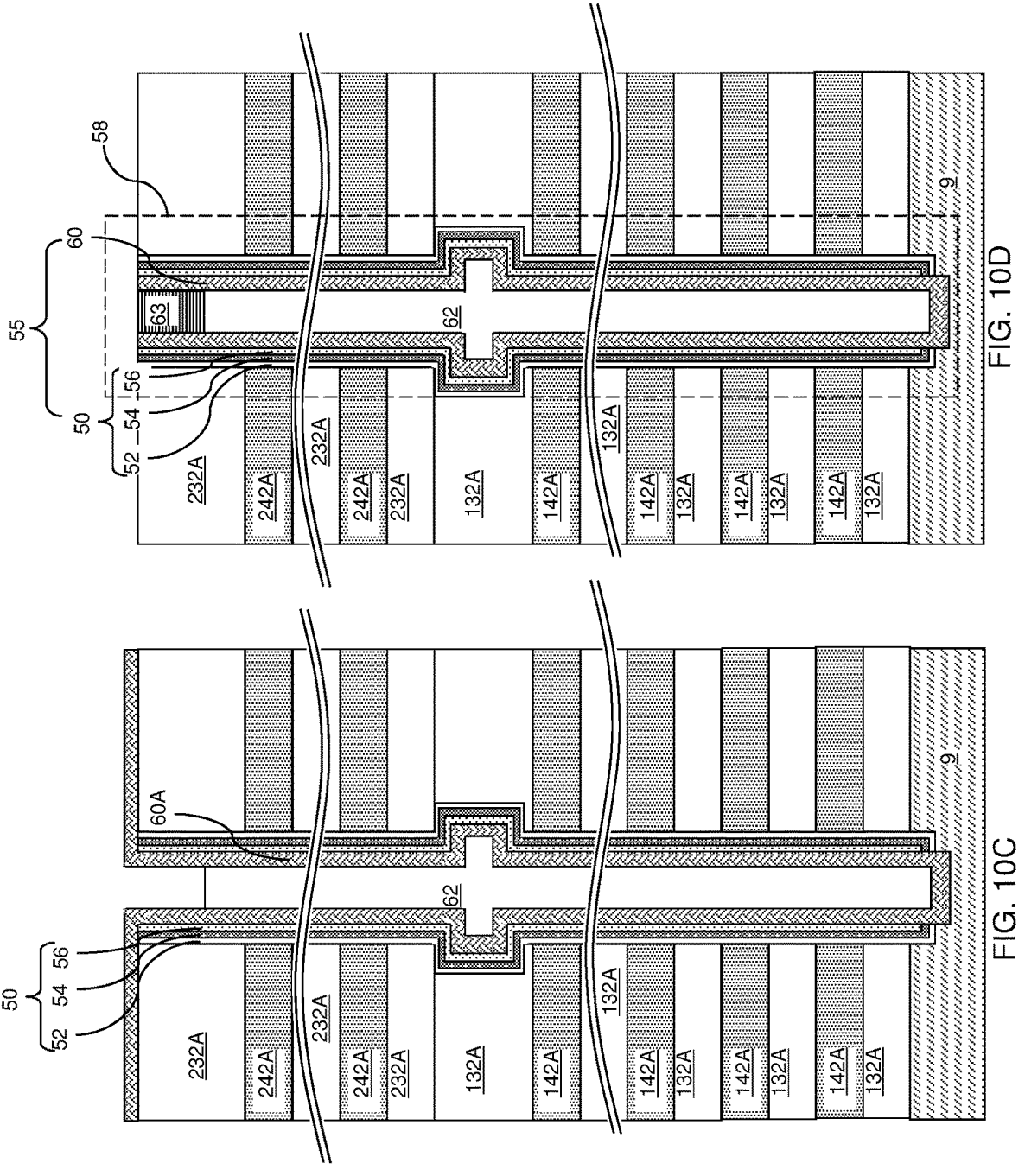

Referring to FIG. 10C, in case the cavity 49' in each memory opening is not completely filled by the semiconductor channel material layer 60L, a dielectric core layer may be deposited in the cavity 49' to fill any remaining portion of the cavity 49' within each memory opening. The dielectric core layer includes a dielectric material such as silicon oxide or organosilicate glass. The dielectric core layer may be deposited by a conformal deposition method such as low pressure chemical vapor deposition (LPCVD), or by a self-planarizing deposition process such as spin coating. The horizontal portion of the dielectric core layer overlying the top second memory-region insulating layer 232 may be removed, for example, by a recess etch. The recess etch continues until top surfaces of the remaining portions of the dielectric core layer are recessed to a height between the top and bottom surfaces of the topmost second memory-region insulating layer 232. Each remaining portion of the dielectric core layer constitutes a dielectric core 62.

Referring to FIG. 10D, a doped semiconductor material having a doping of a second conductivity type may be deposited in cavities overlying the dielectric cores 62. The second conductivity type is the opposite of the first conductivity type. For example, if the first conductivity type is p-type, the second conductivity type is n-type, and vice versa. Portions of the deposited doped semiconductor material, the semiconductor channel material layer 60L, the tunneling dielectric layer 56, the memory material layer 54, and the blocking dielectric layer 52 that overlie the horizontal plane including the top surface of the topmost second memory-region insulating layer 232 may be removed by a planarization process such as a chemical mechanical planarization (CMP) process.

Each remaining portion of the doped semiconductor material of the second conductivity type constitutes a drain region 63. The dopant concentration in the drain regions 63 may be in a range from $5.0 \times 10^{19}/cm^3$ to $2.0 \times 10^{21}/cm^3$, although lesser and greater dopant concentrations may also be used. The doped semiconductor material may be, for example, doped polysilicon.

Each remaining portion of the semiconductor channel material layer 60L constitutes a vertical semiconductor channel 60 through which electrical current may flow when a vertical NAND device including the vertical semiconductor channel 60 is turned on. A tunneling dielectric layer 56 is surrounded by a memory material layer 54, and laterally surrounds a vertical semiconductor channel 60. Each adjoining set of a blocking dielectric layer 52, a memory material layer 54, and a tunneling dielectric layer 56 collectively constitute a memory film 50, which may store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 (which is a vertical semiconductor channel) within an inter-tier memory opening 49 constitutes a memory stack structure 55. The memory stack structure 55 is a combination of a vertical semiconductor channel 60, a tunneling dielectric layer 56, a plurality of memory elements comprising portions of the memory material layer 54, and an optional blocking dielectric layer 52. The memory stack structures 55 can be formed through memory array regions 100 of the first and second vertically alternating sequences in which all layers of the first and second vertically alternating sequences are present. Each combination of a memory stack structure 55, a dielectric core 62, and a drain region 63 within an inter-tier memory opening 49 constitutes a memory opening fill structure 58. Generally, memory opening fill structures 58 are formed within the memory openings 49. Each of the memory opening fill structures 58 comprises a respective memory film 50 and a respective vertical semiconductor channel 60.

In one embodiment, each of the memory stack structures 55 comprises vertical NAND string including the respective vertical stack of memory elements (comprising portions of a memory material layer 54 located at levels of the memory-region spacer material layers (142A, 242A) and a vertical semiconductor channel 60 that vertically extend through the memory-region spacer material layers (142A, 242A) adjacent to the respective vertical stack of memory elements.

Figure 11:
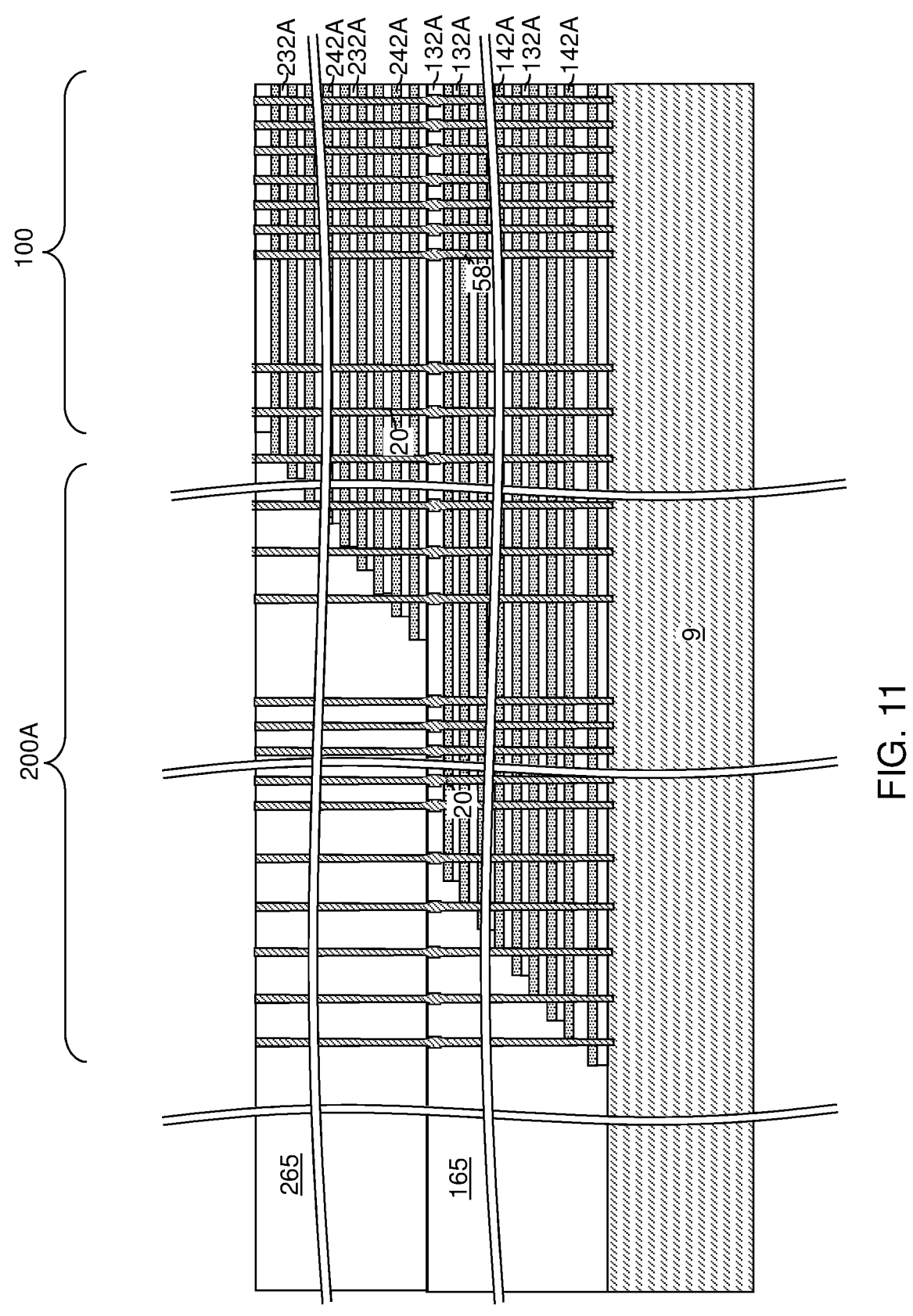
FIG. 11 is a vertical cross-sectional view of the first exemplary structure after formation of memory opening fill structures and support pillar structures according to the first embodiment of the present disclosure.

Referring to FIG. 11, the first exemplary structure is illustrated after formation of the memory opening fill structures 58 and the support pillar structures 20. Generally arrays of memory opening fill structures 58 can be formed within the arrays of memory openings 49.

Figure 12A:
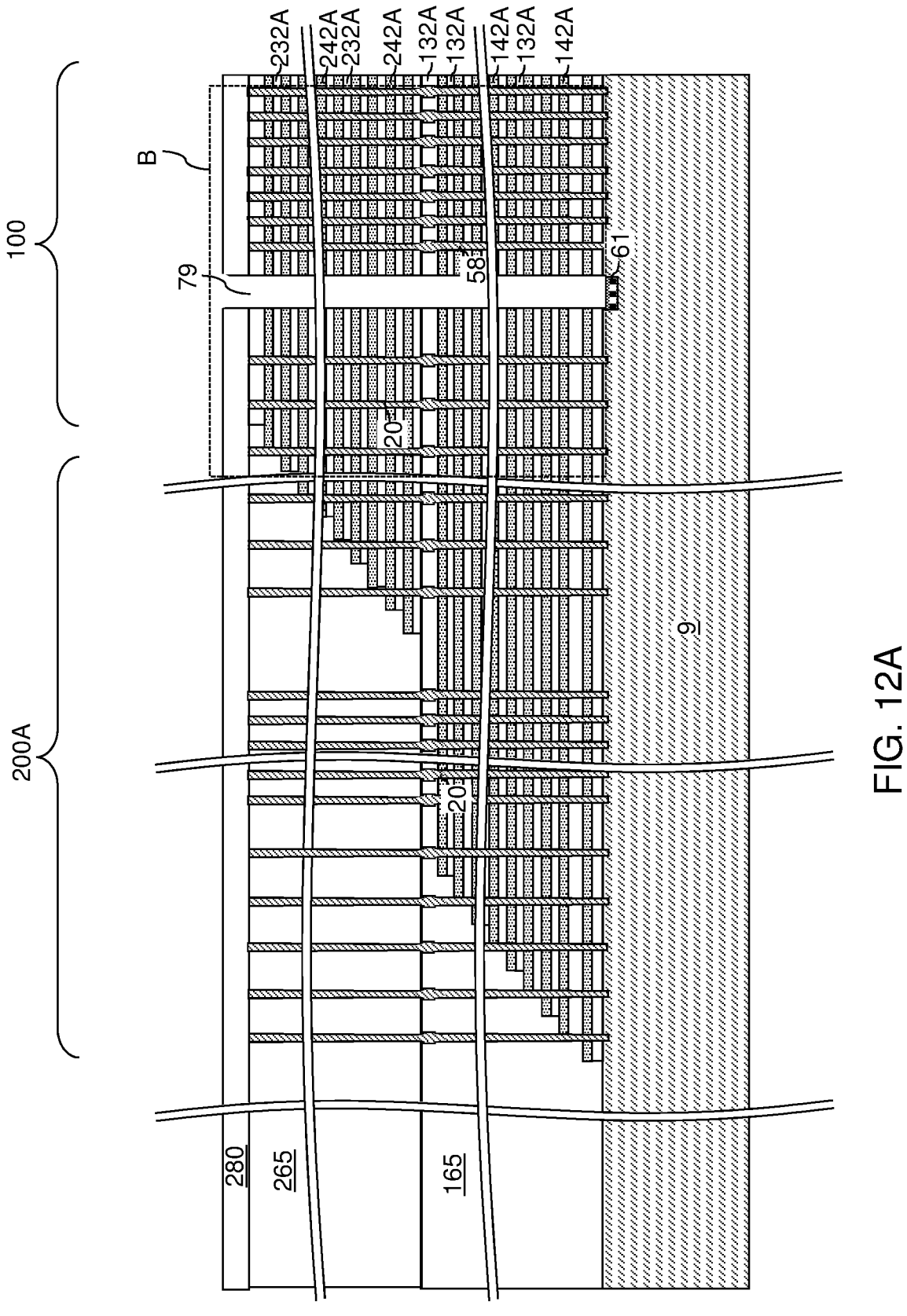
FIG. 12A is a vertical cross-sectional view of the first exemplary structure after formation of backside trenches according to the first embodiment of the present disclosure.
Figure 12B:
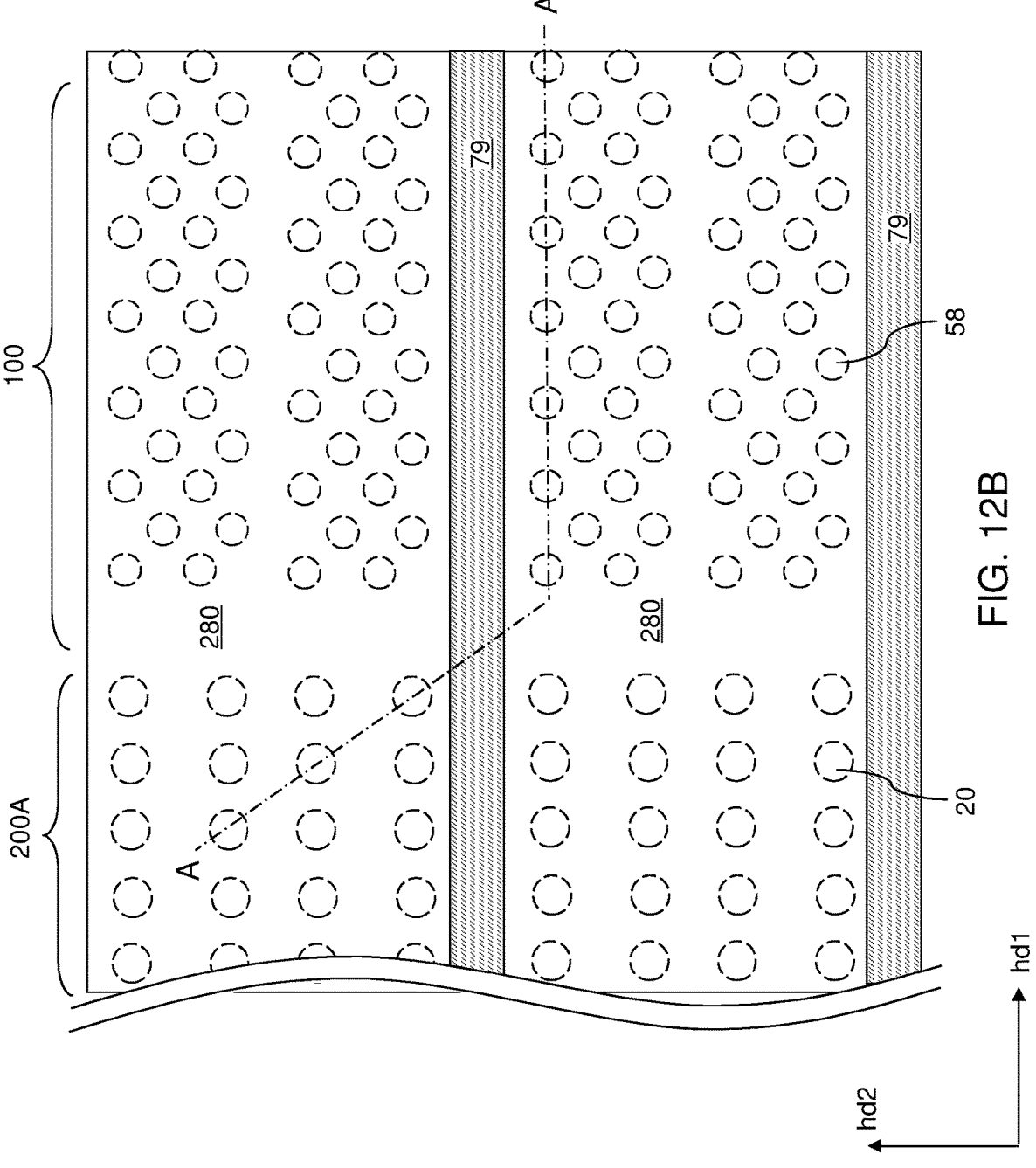
FIG. 12B is a top-down view of the first exemplary structure of FIG. 12A. The angled vertical plane A-A' corresponds to region B shown in FIG. 12A.

Referring to FIGS. 12A and 12B, a contact-level dielectric layer 280 may be formed over the second alternating stacks {(232A, 242A), (232P, 242P)}. The contact-level dielectric layer 280 includes a dielectric material such as silicon oxide, and may be formed by a conformal or non-conformal deposition process. For example, the contact-level dielectric layer 280 may include undoped silicate glass and may have a thickness in a range from 100 nm to 600 nm, although lesser and greater thicknesses may also be used.

A photoresist layer (not shown) may be applied over the contact-level dielectric layer 280, and may be lithographically patterned to form linear openings laterally extending along the first horizontal direction (e.g., word line direction) hd1 and laterally spaced apart along the second horizontal direction (e.g., bit line direction) hd2. The linear openings in the photoresist layer can be formed within areas in which memory opening fill structures 58 or the support pillar structures 20 are not present.

Backside trenches 79 which laterally extend along the first horizontal direction hd1 are formed by transferring the pattern in the photoresist layer (not shown) through the contact-level dielectric layer 280, the second memory-region alternating stacks (232A, 242A), the first memory-region alternating stacks (132A, 142A), and portions of the dielectric structure stacks 65. In one embodiment, the backside trenches 79 are not formed through the peripheral alternating stacks {(132P, 142P), (232P, 242P)}. In other words, the backside trenches 79 within each memory die 900 can be formed entirely within the area of the memory-region alternating stacks {(132A, 142A), (232A, 242A)} of the memory die 900. Each memory-region alternating stack {(132A, 142A), (232A, 242A) can be divided into a plurality of memory-region alternating stack {(132A, 142A), (232A, 242A) by the backside trenches 79.

Figure 13:
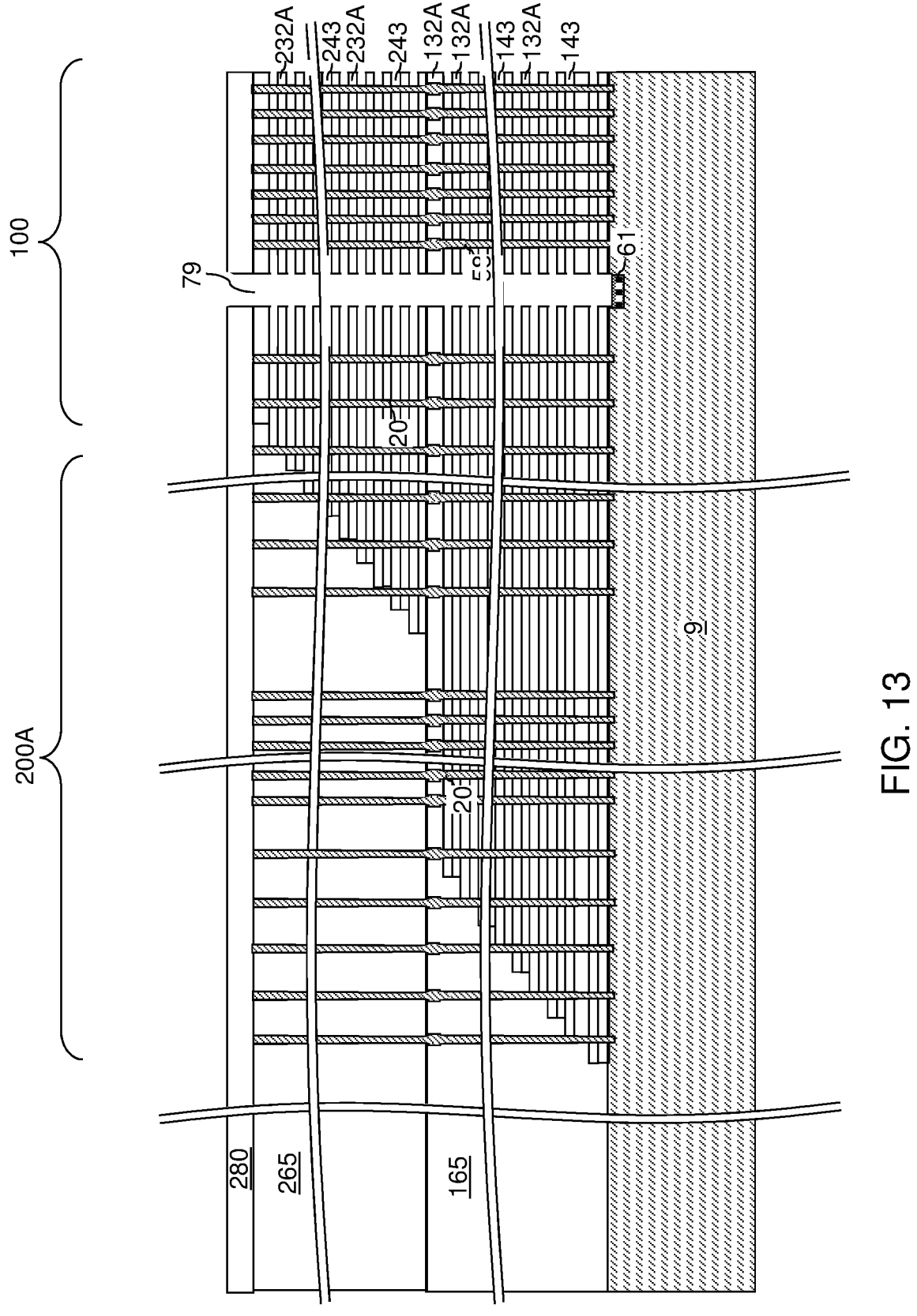
FIG. 13 is a vertical cross-sectional view of the first exemplary structure after formation of backside recesses according to the first embodiment of the present disclosure.

Referring to FIG. 13, the memory-region spacer material layers (142A, 242A) are removed selective to the memory-region insulating layers (132A, 232A), the contact-level dielectric layer 280, and the memory substrate 9. For example, an etchant that selectively etches the materials of the spacer material layers (142A, 242A) with respect to the materials of the memory-region insulating layers (132A, 232A), the retro-stepped dielectric structures (165, 265), and the material of the outermost layer of the memory films 50 may be introduced into the backside trenches 79, for example, using an isotropic etch process. For example, the spacer material layers (142A, 242A) may include silicon nitride, the materials of the memory-region insulating layers (132A, 232A), the retro-stepped dielectric structures (165, 265), and the outermost layer of the memory films 50 may include silicon oxide materials.

The isotropic etch process may be a wet etch process using a wet etch solution, or may be a gas phase (dry) etch process in which the etchant is introduced in a vapor phase into the backside trench 79. For example, if the spacer material layers (142A, 242A) include silicon nitride, the etch process may be a wet etch process in which the first exemplary structure is immersed within a wet etch tank including phosphoric acid, which etches silicon nitride selective to silicon oxide, silicon, and various other materials used in the art.

Backside recesses (143, 243) are formed in volumes from which the spacer material layers (142A, 242A) are removed. The backside recesses (143, 243) include first backside recesses 143 that are formed in volumes from which the first spacer material layers 142A are removed and second backside recesses 243 that are formed in volumes from which the second spacer material layers 242A are removed. Each of the backside recesses (143, 243) may be a laterally extending cavity having a lateral dimension that is greater than the vertical extent of the cavity. In other words, the lateral dimension of each of the backside recesses (143, 243) may be greater than the height of the respective backside recess. A plurality of backside recesses (143, 243) may be formed in the volumes from which the material of the spacer material layers (142A, 242A) is removed. Each of the backside recesses (143, 243) may extend substantially parallel to the top surface of the substrate semiconductor layer 9. A backside recess (143, 243) may be vertically bounded by a top surface of an underlying memory-region insulating layer (132A, 232A) and a bottom surface of an overlying memory-region insulating layer (132A, 232A). In one embodiment, each of the backside recesses (143, 243) may have a uniform height throughout. In one embodiment, since the backside trenches 79 are not formed through the peripheral alternating stacks {(132P, 142P), (232P, 242P)}, the backside recesses are not formed in the peripheral alternating stacks {(132P, 142P), (232P, 242P)}. Thus, the peripheral alternating stacks {(132P, 142P), (232P, 242P)} contain alternating stacks of insulating layers (132P, 232P) and sacrificial material layers (e.g., silicon nitride or other dielectric materials) (142P, 242P).

Figure 14:
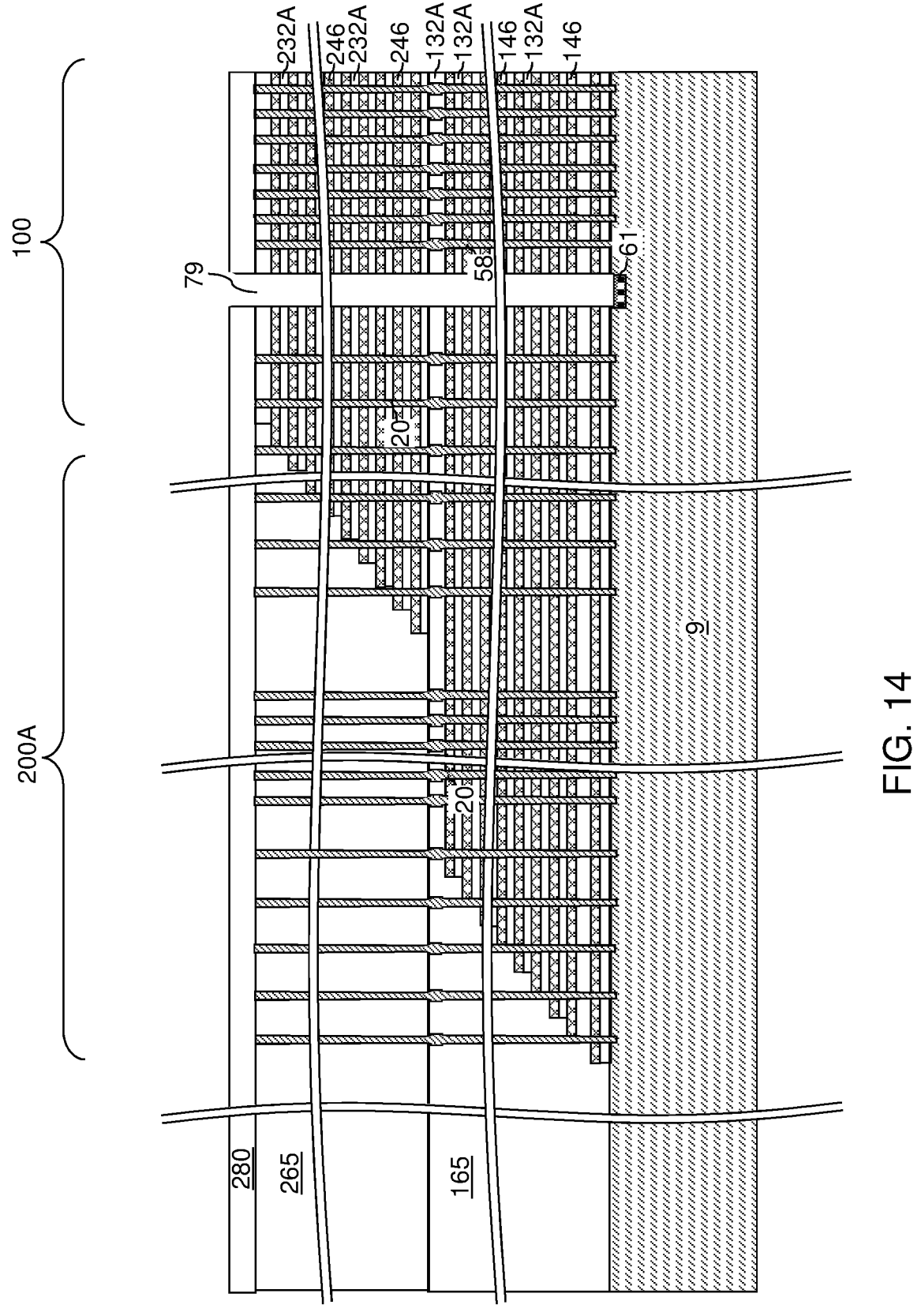
FIG. 14 is a schematic vertical cross-sectional view of the first exemplary structure after replacement of sacrificial material layers with electrically conductive layers according to the first embodiment of the present disclosure.
Figure 15:
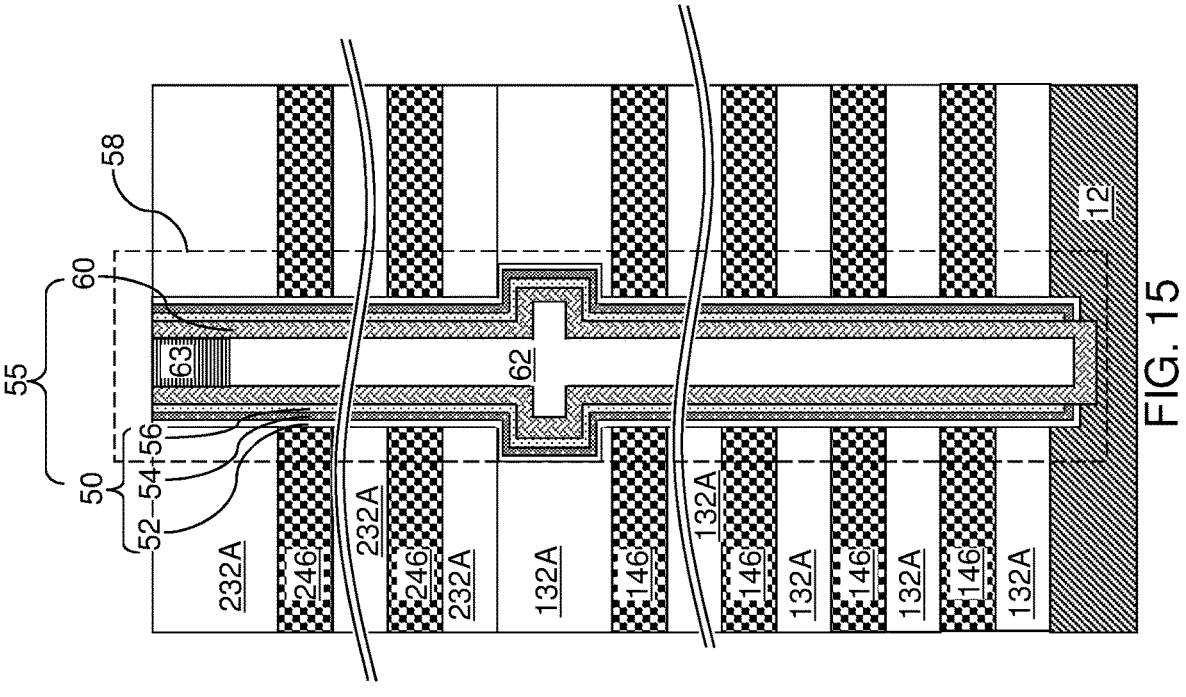
FIG. 15 is a vertical cross-sectional view of a region of the first exemplary structure that includes a memory opening fill structure according to the first embodiment of the present disclosure.

Referring to FIGS. 14 and 15, at least one conductive material may be deposited in the plurality of backside recesses (143, 243), on the sidewalls of the backside trenches 79, and over the contact-level dielectric layer 280. The at least one conductive material may be deposited by a conformal deposition method, which may be, for example, chemical vapor deposition (CVD), atomic layer deposition (ALD), electroless plating, electroplating, or a combination thereof. The at least one conductive material may include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof.

In one embodiment, the at least one conductive material may include at least one metallic material, i.e., an electrically conductive material that includes at least one metallic element. Non-limiting first exemplary metallic materials that may be deposited in the backside recesses include tungsten, tungsten nitride, titanium, titanium nitride, tantalum, tantalum nitride, cobalt, and ruthenium. For example, the at least one conductive material may include a conductive metallic nitride liner that includes a conductive metallic nitride material such as TiN, TaN, WN, or a combination thereof, and a conductive fill material such as W, Co, Ru, Mo, Cu, or combinations thereof. In one embodiment, the at least one conductive material for filling the backside recesses may be a combination of titanium nitride layer and a tungsten fill material.

Electrically conductive layers (146, 246) may be formed in the backside recesses (143, 243) by deposition of the at least one conductive material. A plurality of first electrically conductive layers 146 may be formed in the plurality of first backside recesses 143, a plurality of second electrically conductive layers 246 may be formed in the plurality of second backside recesses 243, and a continuous metallic material layer (not shown) may be formed on the sidewalls of each backside trench 79 and over the contact-level dielectric layer 280. Each of the first electrically conductive layers 146 and the second electrically conductive layers 246 may include a respective conductive metallic nitride liner and a respective conductive fill material. Thus, the first and second memory-region spacer material layers (142A, 242A) may be replaced with the first and second electrically conductive layers (146, 246), respectively. A backside cavity is present in the portion of each backside trench 79 that is not filled with the continuous metallic material layer.

Residual conductive material may be removed from inside the backside trenches 79. Specifically, the deposited metallic material of the continuous metallic material layer may be etched back from the sidewalls of each backside trench 79 and from above the contact-level dielectric layer 280, for example, by an anisotropic or isotropic etch. Each remaining portion of the deposited metallic material in the first backside recesses 143 constitutes a first electrically conductive layer 146. Each remaining portion of the deposited metallic material in the second backside recesses 243 constitutes a second electrically conductive layer 246. Sidewalls of the first electrically conductive layers 146 and the second electrically conductive layers 246 may be physically exposed to a respective backside trench 79.

Each electrically conductive layer (146, 246) may be a conductive sheet including openings therein. A first subset of the openings through each electrically conductive layer (146, 246) may be filled with memory opening fill structures 58. A second subset of the openings through each electrically conductive layer (146, 246) may be filled with the support pillar structures 20. A subset of the electrically conductive layers (146, 246) may comprise word lines for the memory elements. One or more topmost electrically conductive layers 246 may function as drain select gate electrodes while one or more topmost electrically conductive layers 146 may function as source select gate electrodes. In contrast, the peripheral alternating stacks {(132P, 142P), (232P, 242P)} contain alternating stacks of insulating layers (132P, 232P) and sacrificial material layers (e.g., silicon nitride or other dielectric materials) (142P, 242P) which have a different composition from the electrically conductive layers (146, 246).

A source region 61 may be formed at the bottom of each backside trench 79 by implantation of dopants. The source regions 61 may have a doping of a same conductivity type as the drain regions 63 within the memory opening fill structures 58.

Figure 16:
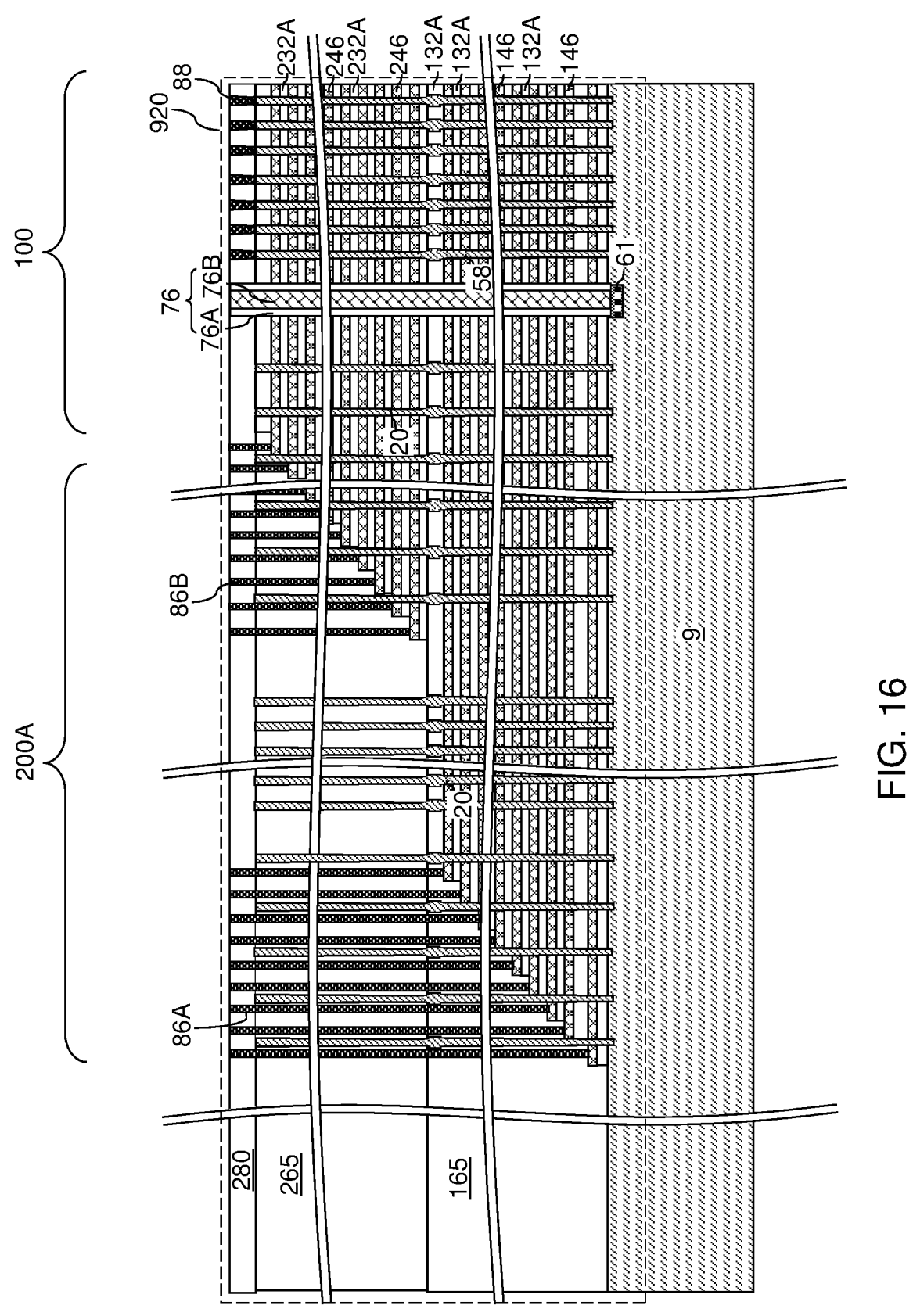
FIG. 16 is a schematic vertical cross-sectional view of the first exemplary structure after formation of layer contact via structures according to the first embodiment of the present disclosure.

Referring to FIG. 16, a trench fill structure 76 can be formed in each backside trench 79. In one embodiment, an insulating liner layer including a dielectric material (such as silicon oxide) can be conformally deposited at a periphery of each backside trench 79, and can be anisotropically etched to form an insulating spacer 76A within each backside trench 79. At least one conductive material can be deposited in remaining volumes of the backside trenches 79, and excess portions of the at least one conductive material can be removed from above the top surface of the contact-level dielectric layer 280 by a planarization process. Each remaining portion of the at least one conductive material contacting a source region 61 and laterally surrounded by a respective insulating spacer 76A constitutes a backside contact via structure 76B, which laterally extends along the first horizontal direction hd1. Each contiguous combination of an insulating spacer 76A and a backside contact via structure 76B that fills a backside trench 79 constitutes a trench fill structure 76.

Alternatively, at least one dielectric material, such as silicon oxide, may be conformally deposited in the backside trenches 79 by a conformal deposition process. Each portion of the deposited dielectric material that fills a backside trench 79 constitutes a trench fill structure 76. In this case, each trench fill structure may fill the entire volume of a backside trench 79 and may consist essentially of at least one dielectric material. In this alternative embodiment, the source region 61 may be omitted, and a horizontal source line (e.g., a direct strap contact layer) may contact a side of the lower portion of the semiconductor channel 60.

Various contact via structures can be formed through the contact-level dielectric layer 280 and optionally through underlying material portions onto a respective underlying conductive structure. The various contact via structures (88, 86A, 86B) can include layer contact via structures (86A, 86B) that are formed in the active staircase regions 200A. The layer contact via structures (86A, 86B) can include first contact via structures 86A that contact a respective first electrically conductive layer 146 and second contact via structures 86B that contact a respective second electrically conductive layer 246. The layer contact via structures (86A, 86B) are preferably omitted in the dummy staircase regions 200D. The horizontal surfaces of the dummy staircase regions 200D may include sacrificial material layers (142P, 242P) of the dummy stacks instead of the electrically conductive layers (146, 246) of the active stacks.

For example, a photoresist layer (not shown) can be applied over the second-tier vertically alternating sequences (232, 246), and can be lithographically patterned to form openings within areas of the memory opening fill structures 58, and the second-tier retro-stepped dielectric structure 265 which is located over the horizontal surfaces of the second stepped surfaces of the second-tier vertically alternating sequences (232, 246). An anisotropic etch process can be performed to transfer the pattern of the openings in the photoresist layer through the contact-level dielectric layer 280, the first-tier retro-stepped dielectric structures 165, and the second-tier retro-stepped dielectric structures 265.

At least one conductive material can be deposited in each of the first contact via cavities, the second contact via cavities, and the drain contact via cavities. The at least one conductive material can include, for example, a metallic barrier material (such as TiN, TaN, and/or WN) and a metallic fill material (such as W, Cu, Mo, Co, Ru, etc.). Excess portions of the at least one conductive material can be removed from above the horizontal plane including the top surface of the contact-level dielectric layer employing a planarization process (such as a chemical mechanical planarization process). Each remaining portion of the at least one conductive material filling the first contact via cavities comprises a first contact via structure 86A. Each remaining portion of the at least one conductive material filling the second contact via cavities comprise a second contact via structure 86B.

The first contact via structures 86A can be formed through a respective second-tier retro-stepped dielectric structure 265 and through a respective first-tier retro-stepped dielectric structure 165 and directly on a first subset of the electrically conductive layers, i.e., the first electrically conductive layers 146. The second contact via structures 86B can be formed through a respective second-tier retro-stepped dielectric structure 265 and directly on a second subset of the electrically conductive layers (i.e., the second electrically conductive layers 246) that is located over a horizontal plane including top surfaces of the first-tier retro-stepped dielectric structures 165. The first contact via structures 86A and the second contact via structures 86B contact a respective one of the electrically conductive layers (146, 246), and are collectively referred to as layer contact via structures.

Drain contact via cavities (not shown) can be formed over each memory opening fill structure 58. Top portions of the memory opening fill structures 58, such as the drain regions 63, may be employed as etch stop structures during the anisotropic etch process. In one embodiment, the drain contact via cavities may be formed concurrently with formation of the first contact via cavities and the second contact via cavities. Alternatively, the drain contact via cavities may be formed prior to, or after, formation of the first contact via cavities and the second contact via cavities employing an additional lithographic patterning process and an additional anisotropic etch process. Drain contact via structures 88 can be formed in the drain contact via cavities.

The set of all devices formed over the memory substrate 9 constitutes a memory device 920, which may comprise a three-dimensional memory device such as a three-dimensional NAND array.

Figures 17A, 17B:
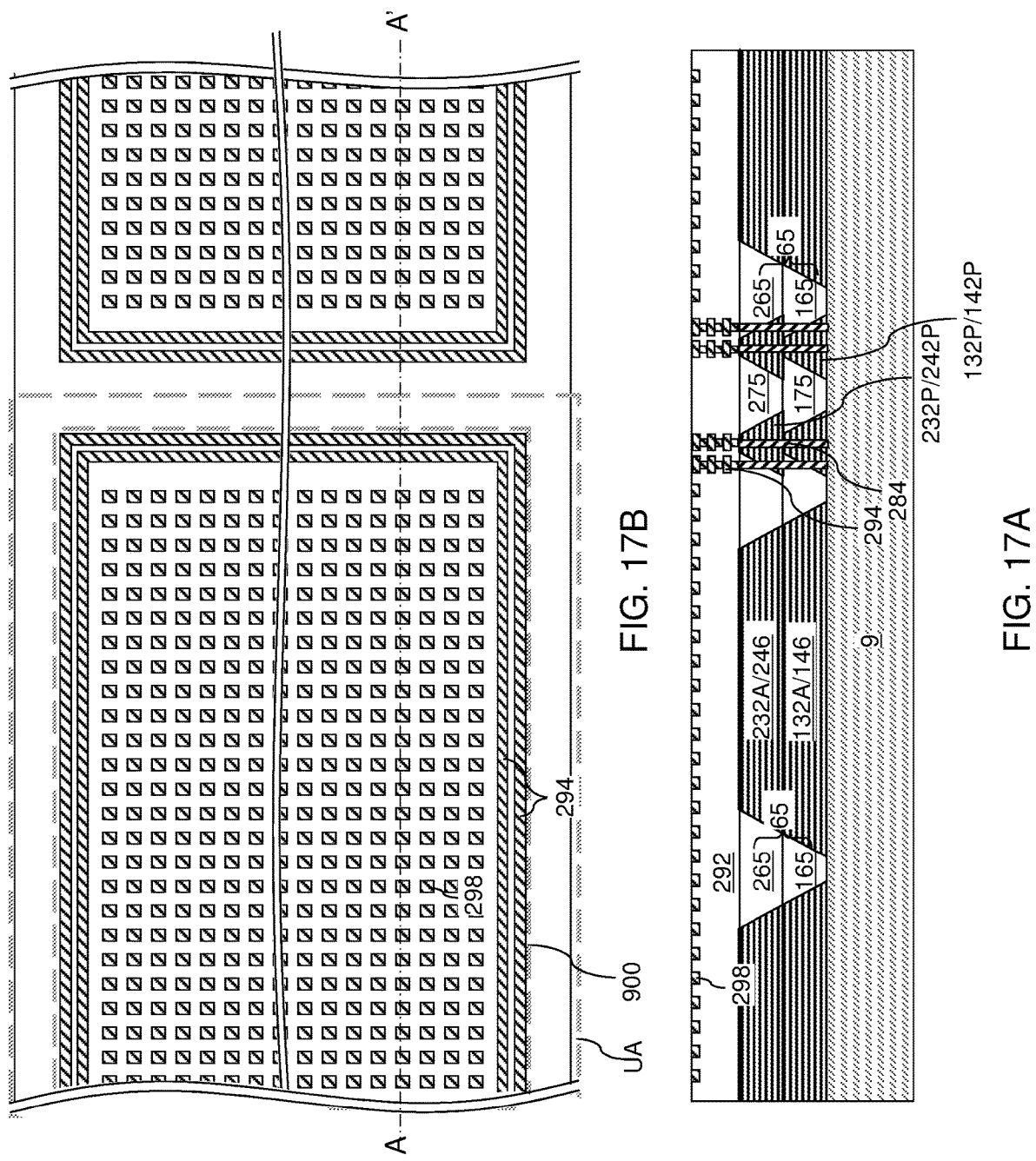
FIG. 17A is a vertical cross-sectional view of the first exemplary structure after formation of metal interconnect structures and edge seal wall structures according to the first embodiment of the present disclosure.
FIG. 17B is a top-down view of the first exemplary structure of FIG. 17A.

Referring to FIGS. 17A and 17B, a photoresist layer (not shown) can be applied over the first exemplary structure, and can be lithographically patterned to form at least one ring-shaped opening over areas of the peripheral alternating stacks {(132P, 142P), (232P, 242P)}. An anisotropic etch process can be performed to form at least one moat trench within each memory die 900. Each moat trench vertically extends through the peripheral alternating stacks {(132P, 142P), (232P, 242P)} down to the top surface of the memory substrate 9. Each moat trench can be formed entirely within the area of a respective memory die 900, and can vertically extend through a first-tier alternating stack (132P, 142P) and a second-tier alternating stack (232P, 242P). At least one metallic material can be deposited in the moat trenches, and excess portions of the at least one metallic material can be removed from above the horizontal plane including the top surface of the contact-level dielectric layer 280. Each remaining portion of the at least one metallic material filling a respective moat trench constitutes a metal wall structure 284.

Each metal wall structure 284 vertically extends through a first-tier peripheral alternating stack (132P, 142P) and a second-tier alternating stack (232P, 242P). At least one metallic wall structure 284 is formed in each memory die 900. The at least one metallic wall structure 284 includes one or more metallic wall structures 284 that vertically extends through each layer within the first-tier peripheral alternating stack (132P, 142P) and each layer within the second-tier alternating stack (232P, 242P), and laterally surrounds, and is laterally spaced from, the dielectric structure stack 65.

Optionally, the at least one metallic wall structure 284 may comprise a plurality of metallic wall structures 284 that includes an innermost metallic wall structure that vertically extends through the first-tier peripheral alternating stack (132P, 142P) and the second-tier alternating stack (232P, 242P) and through peripheral portions of the first-tier retro-stepped dielectric structure 165 and the second-tier retro-stepped dielectric structure 265. In one embodiment, the at least one metallic wall structure 284 may be laterally enclosed by, and is laterally spaced from, the first-tier peripheral dielectric material portions 175 and the second-tier peripheral dielectric material portion 275.

Interconnect-level dielectric material layers 292 embedding metal interconnect structures 294 can be formed above the contact-level dielectric layer 280. Generally, the interconnect-level dielectric material layers 292 embedding metal interconnect structures 294 can be formed over the memory-region alternating stacks {(132A, 146), (232A, 246)} and the peripheral alternating stack {(132P, 142P), (232P, 242P)}. A subset of the metal interconnect structures 294 is adjoined to the at least one metallic wall structure 284, and continuously extends around the periphery of a respective memory die 900 between the top surface(s) of the at least one metallic wall structure 284 to the topmost surface of the interconnect-level dielectric material layers 292. Such as subset of metal interconnect structures functions as an interconnect-level metallic seal structure that prevents diffusion of impurities and moisture therethrough.

At least one edge seal wall structure (284, 294) is formed within each memory die 900. Each edge seal structure (284, 294) comprises a respective set of the at least one metal wall structure 284 and a respective subset of the metal interconnect structures 294. Each edge seal structure (284, 294) continuously extends from a bottommost layer within the peripheral alternating stacks {(132P, 142P), (232P, 242P)} to a horizontal plane including a top surface of the interconnect-level dielectric material layers 292.

The interconnect-level dielectric material layers 292 embed additional metal interconnect structures (not illustrated) that provide electrical connection to the various nodes of the memory device 920. Such additional metal interconnect structures overlie the memory-region alternating stacks {(132A, 146) and/or (232A, 246)}.

In one embodiment, each metal wall structure 284 within the respective set of at least one metal wall structure 284 in a memory die laterally extends around all of the memory-region alternating stacks {(132A, 146), (232A, 246)} in a memory die 900 as a single continuous structure that is topologically homeomorphic to a torus. In one embodiment, the at least one edge seal wall structure (284, 294) within a memory die 900 comprises a nested plurality of edge seal wall structures (284, 294) within which each edge seal wall structure (284, 294) is laterally surrounded by, or laterally surrounds, any other edge seal wall structure (284, 294) within the nested plurality of edge seal wall structures (284, 294). In one embodiment, the nested plurality of edge seal wall structures (284, 294) in a memory die 900 may comprises: a first edge seal wall structure (284, 294) that vertically extends through a subset of all layers within the peripheral alternating stack {(132P, 142P), (232P, 242P)} and through a region of a second portion (2651, 2652) of the retro-stepped dielectric structure 65; and a second edge seal wall structure (284, 294) that vertically extends through all layers within the peripheral alternating stack {(132P, 142P) and/or (232P, 242P)} and is laterally spaced from the second portion (1652, 2652) of the retro-stepped dielectric structure 65.

In one embodiment, each memory die 900 may comprise memory-side bonding pads 298 that are embedded at the topmost level of the interconnect-level dielectric material layers 292 and electrically connected to a respective subset of the metal interconnect structures embedded within the interconnect-level dielectric material layers 292 and electrical nodes of the memory device 920.

Figure 18:
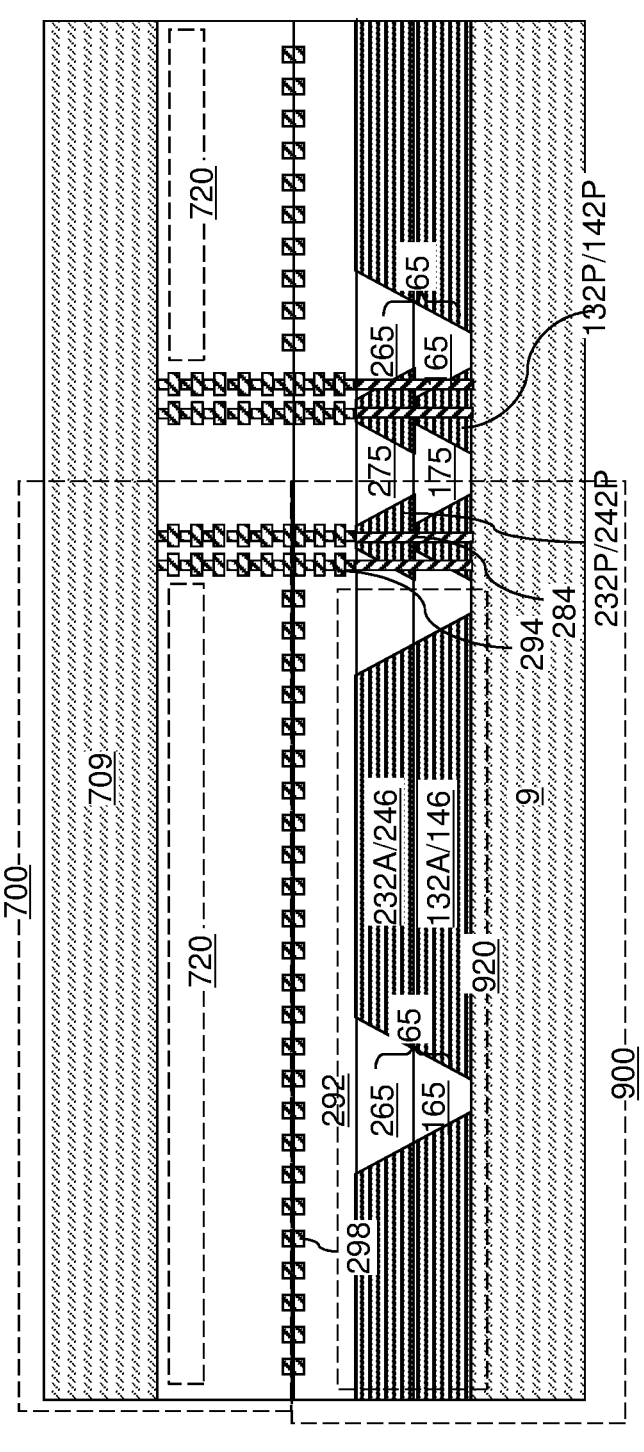
FIG. 18 is a vertical cross-sectional view of the first exemplary structure after bonding a second semiconductor device wafer including an array of logic dies to the first device wafer according to the first embodiment of the present disclosure.

Referring to FIG. 18, a second semiconductor device wafer including a two-dimensional array of logic dies 700 is provided. The second semiconductor device wafer includes a logic substrate 709 on which logic devices 720 are formed. Logic-side dielectric material layers embedding logic-side metal interconnect structures (not expressly shown) and logic-side edge seal wall structures can be formed over the logic devices 720. Logic-side bonding pads can be formed at the topmost level of the logic-side dielectric material layers. Generally, the logic devices 720 may comprise a control circuitry configured to control operation of the memory devices 920 within a mating memory die 900.

The second semiconductor device wafer can be bonded to the first semiconductor device wafer, for example, employing wafer-to-wafer bonding. In this case, the logic-side bonding pads may be bonded to the memory-side bonding pads 298 employing metal-to-metal bonding. A bonded assembly of the first semiconductor device wafer and the second semiconductor device wafer can be formed.

Figure 19:
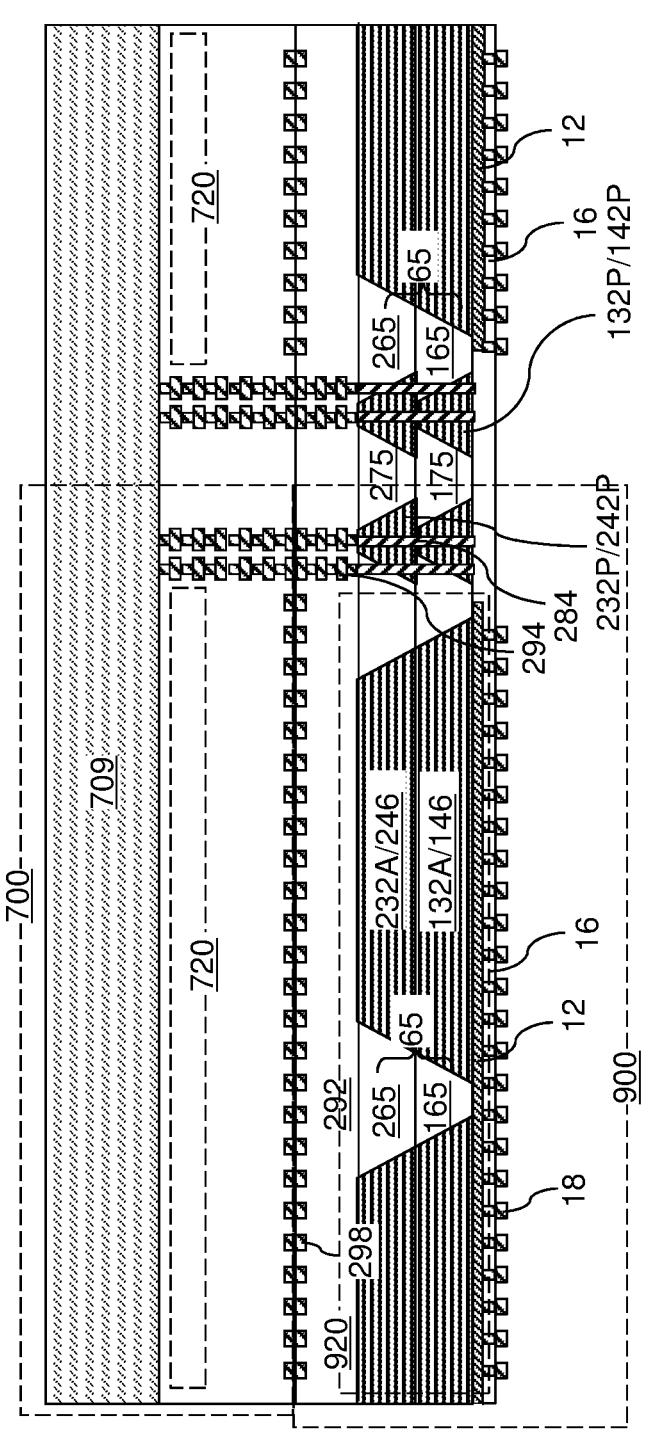
FIG. 19 is a vertical cross-sectional view of the first exemplary structure after removing a semiconductor substrate of the first semiconductor device wafer and forming backside bonding pads according to the first embodiment of the present disclosure.

Referring to FIG. 19, the memory substrate 9 may be optionally removed, for example, employing grinding, polishing, an anisotropic etch process, and/or an isotropic etch process, selective to the materials of the memory opening alternating stacks {(132A, 146), (232A, 246)}, the peripheral alternating stacks {(132P, 142P), (232P, 242P)}, and the retro-stepped dielectric structures 65. A source layer 12 may be formed on the physically exposed end surfaces of the vertical semiconductor channels 60 by depositing a doped semiconductor material and/or at least one metallic material. A backside insulating layer 16 can be formed over the source layer 12. Backside contact via cavities can be formed through the backside insulating layer 16, and backside bonding pads 18 can be formed in, and over, the backside contact via cavities.

Figure 20:
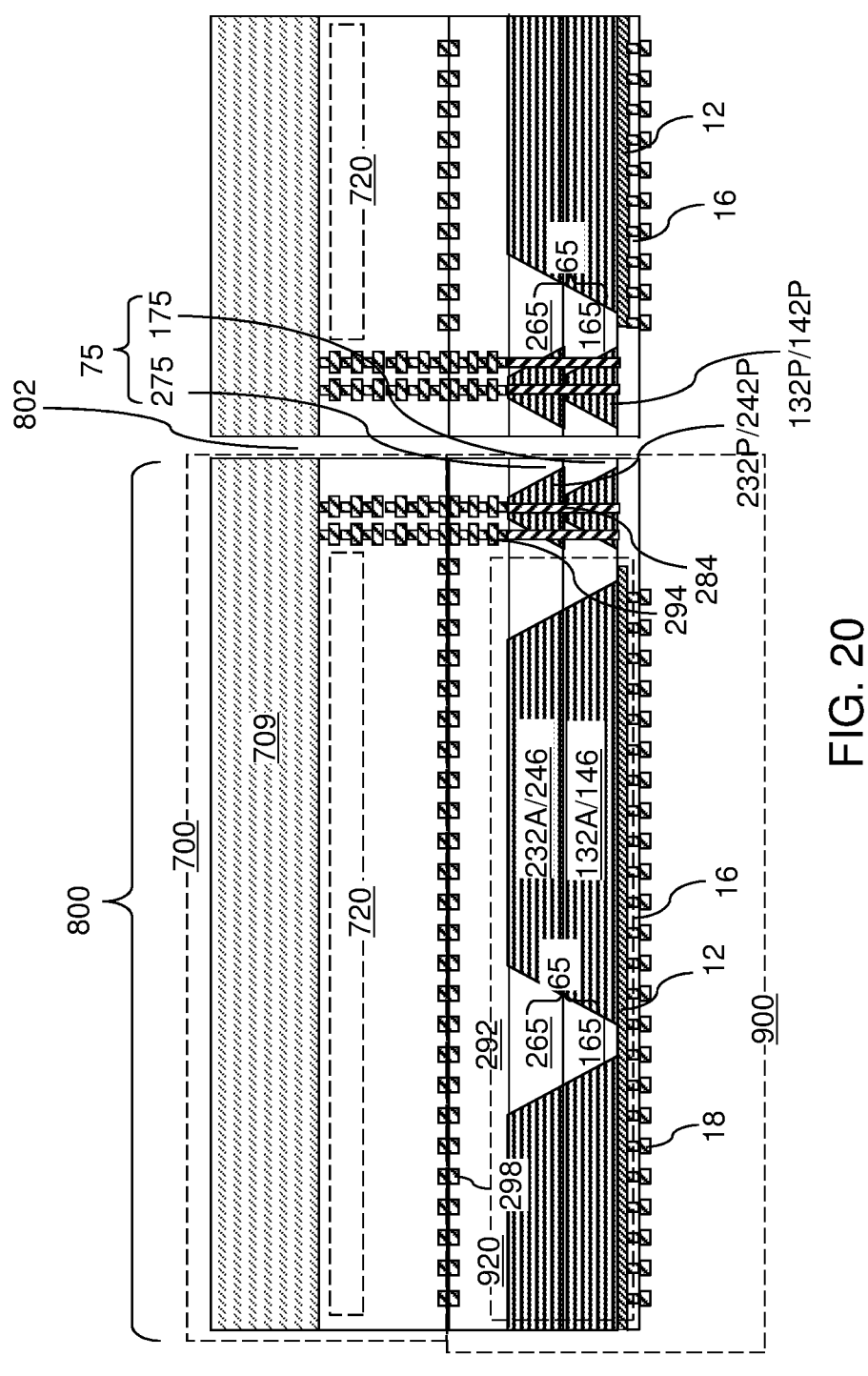
FIG. 20 is a vertical cross-sectional view of the first exemplary structure after dicing the bonded assembly into a plurality of bonded semiconductor dies according to the first embodiment of the present disclosure.

Referring to FIG. 20, the bonded assembly of the first semiconductor device wafer and the second semiconductor device wafer can be diced to form bonded semiconductor dies 800. The bonded assembly can be diced along dicing channels 802, which are located along geometrical centers of laterally-extending portions of the peripheral dielectric material portions (175, 275). Each bonded semiconductor die 800 includes a bonded assembly of a memory die 700 and a logic die 900. Each bonded semiconductor die 800 includes a dielectric frame 75, which includes a reaming annular portion of a first-tier peripheral dielectric material portion 175 and a remaining annular portion of a second-tier peripheral dielectric material portion 275.

Each dielectric frame 75 laterally surrounds the peripheral alternating stack {(132P, 142P), (232P, 242P)} of a memory die 900 and comprises a set of vertical outer sidewalls and a set of stepped inner sidewalls that contact stepped surfaces of the peripheral alternating stack {(132P, 142P), (232P, 242P)}. In one embodiment, an average horizontal step width of the stepped surfaces of the peripheral alternating stack {(132P, 142P) and/or (232P, 242P)} may be the same as an average horizontal step width of the stepped surfaces of the peripheral alternating stack {(132P, 142P), (232P, 242P)} that contacts the second portion (1651, 2651) of the retro-stepped dielectric structure 65. Specifically, an average horizontal step width of the stepped surfaces of the first-tier peripheral alternating stack (132P, 142P) may be the same as an average horizontal step width of the stepped surfaces of the first-tier peripheral alternating stack (132P, 142P) that contacts the second portion 1652 of the first-tier retro-stepped dielectric structure 165.

While a two-tier structure in which each memory die 900 includes a first-tier structure including first-tier memory region alternating stacks (132A, 146), (232A, 246)} and first-tier peripheral alternating stack (132P, 142P) and a second-tier structure including second-tier memory region alternating stacks (232A, 246), (232A, 246)} and second-tier peripheral alternating stack (232P, 242P) is described above, embodiments are expressly contemplated herein in which only a single tier structure is employed, or three or more tier structures are employed.

Figures 21A, 21B:
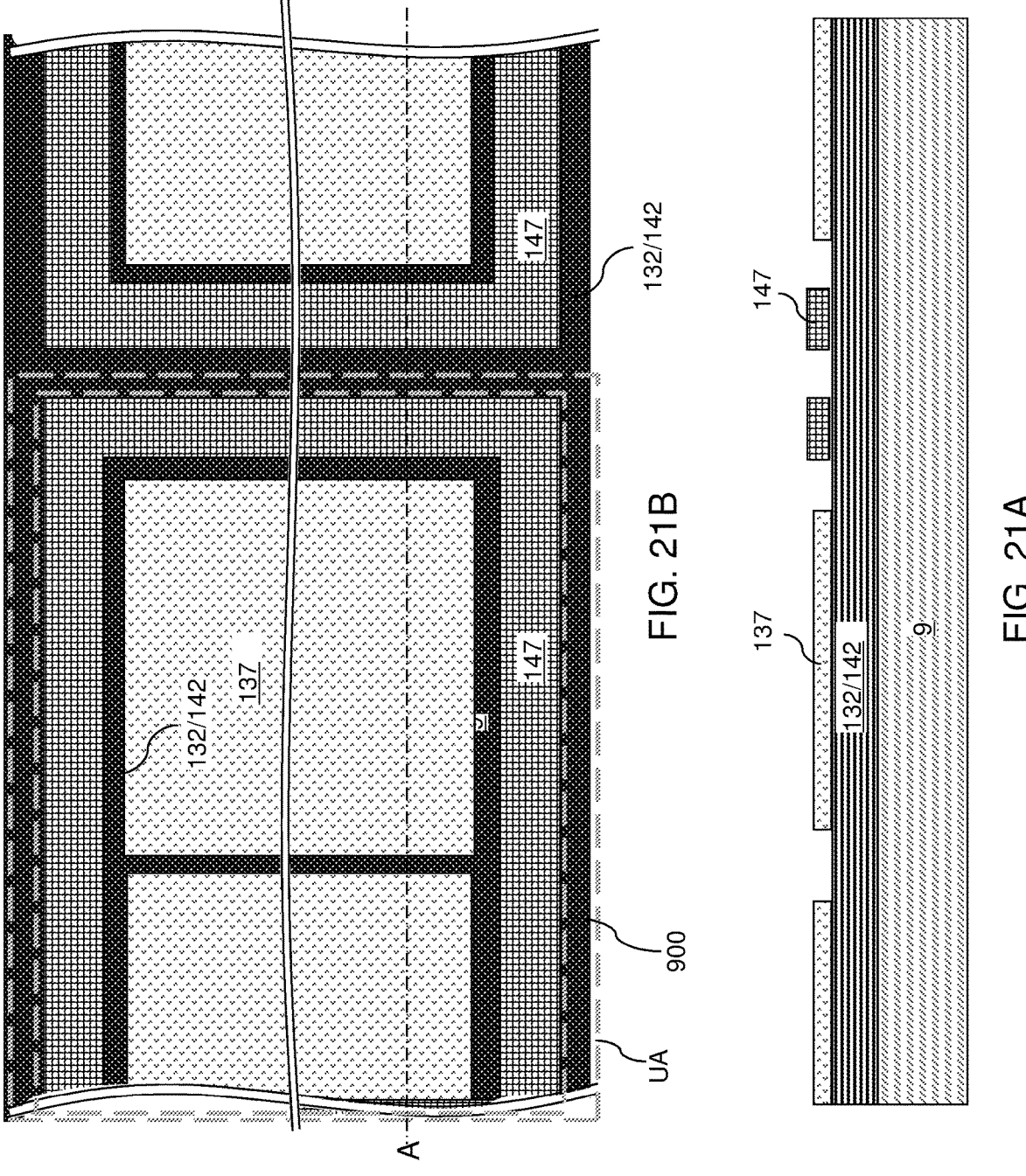
FIG. 21A is a vertical cross-sectional view of a second exemplary structure after formation of a first-tier vertically alternating sequence and application and patterning of a first trimmable layer and a first hard mask layer according to a second embodiment of the present disclosure.
FIG. 21B is a top-down view of the second exemplary structure of FIG. 2A.

Referring to FIGS. 21A and 21B, a second exemplary structure according to a second embodiment of the present disclosure can be derived from the first exemplary structure illustrated in FIGS. 2A and 2B by employing a first die-periphery etch mask 147 including a patterned hard mask layer in lieu of the first die-periphery etch mask 137B in the first exemplary structure of FIGS. 2A and 2B. In the second exemplary structure, first etch masks (137, 147) can be formed over the first vertically alternating sequence of first continuous insulating layers 132 and first continuous spacer material layers 142. Within each unit are UA, the first etch masks (137, 147) may comprise first memory-region etch masks 137 (e.g., photoresist mask) that are formed within the area of memory planes and a first die-periphery etch mask 147 that comprises a hard mask material other than photoresist (such as silicon oxide, silicon nitride, silicon carbide nitride, amorphous carbon or diamond-like carbon, or any other non-trimmable material layer that is not trimmed during subsequent photoresist trimming steps). The first die-periphery etch mask 147 is formed around a periphery of the die area of a respective memory die 900. In one embodiment, a first die-periphery etch mask 147 may cover the entirety of a periphery of a memory die 900. Each first memory-region etch mask 137 is laterally surrounded by the first die-periphery etch mask 147. The first memory-region etch masks 137 may comprise a trimmable mask material, such as photoresist. According to an aspect of the present disclosure, each neighboring pair of first memory-region etch masks 137 is laterally spaced from each other by a first uniform mask spacing distance, and the first die-periphery etch mask 147 is laterally spaced from each of the first memory-region etch masks 137 by the first uniform mask spacing distance. In other words, each neighboring pair of the first die-periphery etch mask 147 and a first memory-region etch mask 137 is laterally spaced from each other by the first uniform mask spacing distance. The first uniform mask spacing distance may be in a range from 1 microns to 100 microns, although lesser and greater dimensions may also be employed.

Figures 22A, 22B:
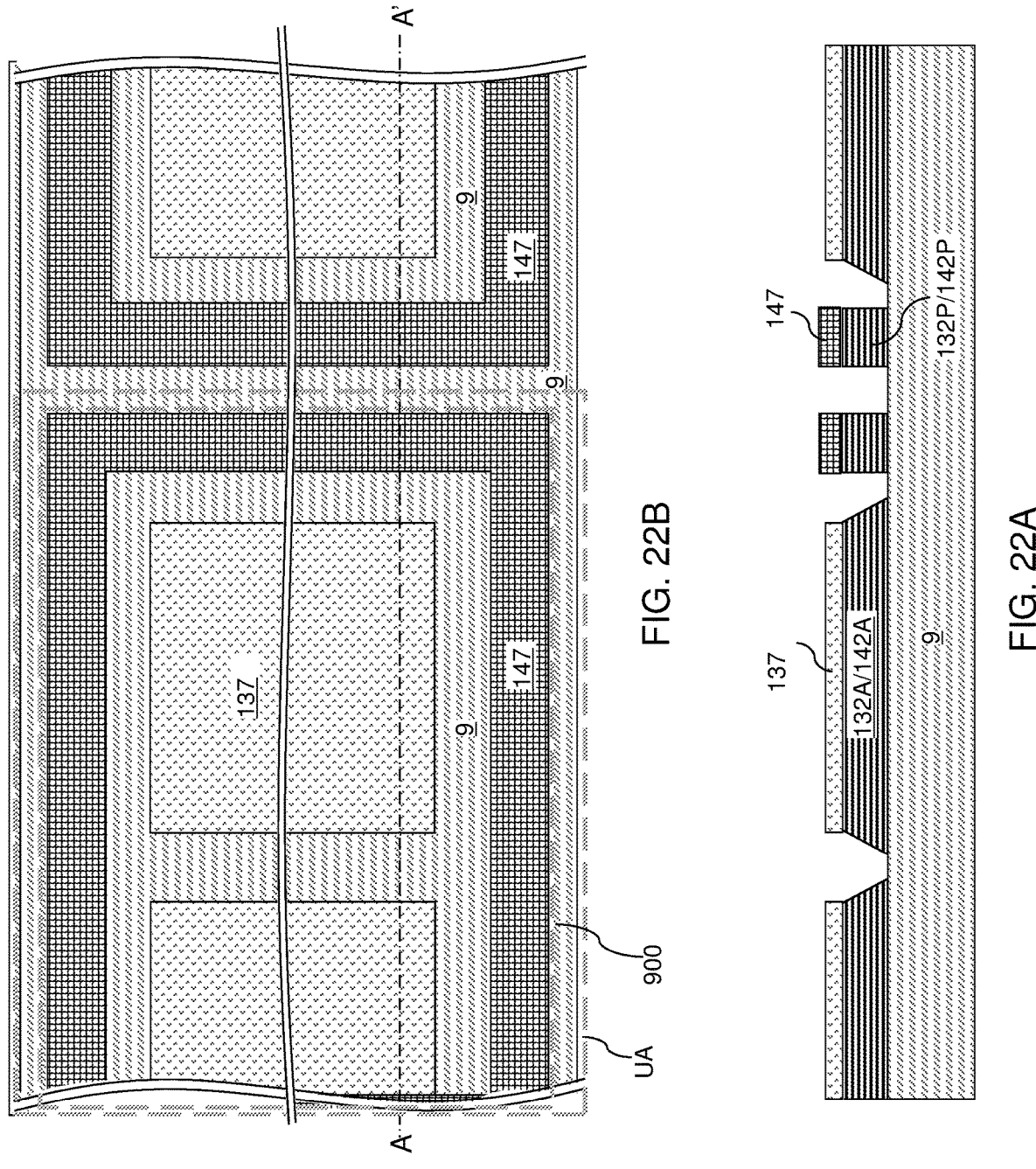
FIG. 22A is a vertical cross-sectional view of the second exemplary structure after formation of first-tier stepped surfaces according to the second embodiment of the present disclosure.
FIG. 22B is a top-down view of the second exemplary structure of FIG. 22A.

Referring to FIGS. 22A and 22B, multiple iterations of a unit processing step including an anisotropic etch step and a trimming step can be performed. The anisotropic etch step performs an anisotropic etch process that etches unmasked regions of the first vertically alternating sequence (132, 142). The trimming step performs a mask trimming process that isotropically trims each of the first memory-region etch masks 137 without trimming the first-die-periphery etch mask 147. The first vertically alternating sequence (132, 142) is divided into first memory-region alternating stacks (132A, 142A) and a peripheral alternating stack (132P, 142P) within each unit area UA.

Each first memory-region alternating stack (132A, 142A) includes a vertically alternating sequence of first memory-region insulating layers 132A and first memory-region spacer material layers 142A. The first memory-region insulating layers 132A are patterned portions of the first continuous insulating layer 132 that underlie the first memory-region etch masks 137. The first memory-region spacer material layers 142A are patterned portions of the first continuous spacer material layers 142 that underlie the first memory-region etch masks 137. Each first peripheral alternating stack (132P, 142P) includes a vertically alternating sequence of first peripheral insulating layers 132P and first peripheral spacer material layers 142P. The first peripheral insulating layers 132P are patterned portions of the first continuous insulating layer 132 that underlie the first die-periphery etch masks 147. The first peripheral spacer material layers 142P are patterned portions of the first continuous spacer material layers 142 that underlie the first die-periphery etch masks 147.

Within each unit area UA, each first memory-region alternating stack (132A, 142A) can be formed with a respective set of stepped surfaces in the active staircase region described above. Within each unit area UA, each first peripheral alternating stack (132P, 142P) can be formed straight sidewalls 150, which may be vertical or may have a uniform taper angle greater than 0 degree and less than 30 degrees.

In one embodiment, the uniform mask spacing between each neighboring pairs of the first memory-region etch masks 137 causes the trimmable mask material of each of the first etch masks 137 to be isotropically trimmed during each trimming step. As a consequence, the average horizontal step width each of the stepped surfaces of the first memory-region alternating stacks (132A, 142A) may be the same.

In one embodiment, a first memory-region alternating stack (132A, 142A) may comprise first stepped surfaces in a first active staircase region facing another first memory-region alternating stack (132A, 142A) and second stepped surfaces in a second active staircase region facing a first peripheral alternating stack (132P, 142P). In this case, the average horizontal step width of the first stepped surfaces of the first memory-region alternating stacks (132A, 142A) is the same as an average horizontal step width of the second stepped surfaces of the first memory-region alternating stacks (132A, 142A). The first etch masks (137, 147) can be subsequently removed.

Figures 23A, 23B:
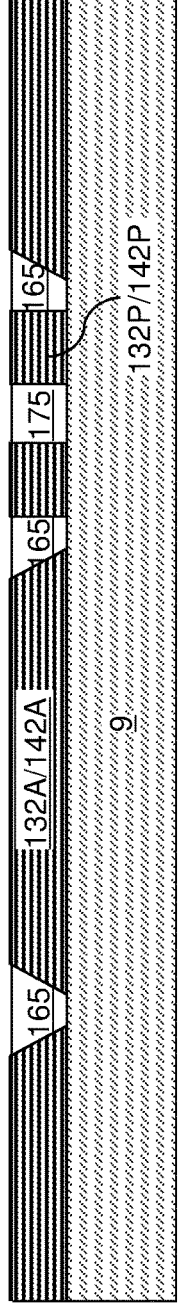
FIG. 23A is a vertical cross-sectional view of the second exemplary structure after formation of first-tier retro-stepped dielectric structures according to the second embodiment of the present disclosure.
FIG. 23B is a top-down view of the second exemplary structure of FIG. 23A.

Referring to FIGS. 23A and 23B, a dielectric fill material such as silicon oxide can be deposited over the stepped surfaces of the first memory-region alternating stacks (132A, 142A) and the first peripheral alternating stacks (132P, 142P). A planarization process (such as a chemical mechanical planarization process) can be performed to remove portions of the dielectric fill material from above the horizontal plane including the top surfaces of the first memory-region alternating stacks (132A, 142A) and the first peripheral alternating stacks (132P, 142P). Remaining portions of the dielectric fill material comprise first-tier retro-stepped dielectric structures 165 that are formed entirely within a respective first peripheral alternating stack (132P, 142P), and first-tier peripheral dielectric material portions 175 that are formed between neighboring pairs of first peripheral alternating stacks (132P, 142P) in kerf regions 901. In one embodiment, each first-tier retro-stepped dielectric structure 165 can contact, and can laterally surround, each first memory-region alternating sack (132A, 142A) within a memory die 900. Each first peripheral dielectric material portion 175 located at a peripheral region of a memory die 900 is laterally spaced from the first memory-region alternating stacks (132A, 142A) within the memory die 900 by a respective first peripheral alternating stack (132P, 142P) and by a respective first-tier retro-stepped dielectric structure 165. Each first-tier retro-stepped dielectric structure 165 comprises at least one first portion 1651 (which may be a plurality of first portions 1651) located between a neighboring pair of first memory-region alternating stacks (132A, 142A) and a second portion 1652 located between the first peripheral alternating stack (132P, 142P) and the first memory-region alternating stacks (132A, 142A).

The second exemplary structure includes a memory array region 100 within the area of each of the first memory-region alternating stacks (132A, 142A). Each memory array region 100 is a region in which a three-dimensional memory array is to be subsequently formed. A peripheral area of each first memory-region alternating stack (132A, 142A) includes the stepped surfaces of first memory-region alternating stack (132A, 142A) or stepped surfaces to be patterned on an additional alternating stack that is to be subsequently formed. This peripheral area is herein referred to as an active staircase region 200A. In one embodiment, each active staircase region 200A may laterally enclose a respective memory array region 100.

Various first-tier openings may be formed through the first memory-region alternating stacks (132A, 142A), and various sacrificial first-tier opening fill portions (148, 128) may be formed by performing the processing steps described with reference to FIG. 5.

Figures 24A, 24B:
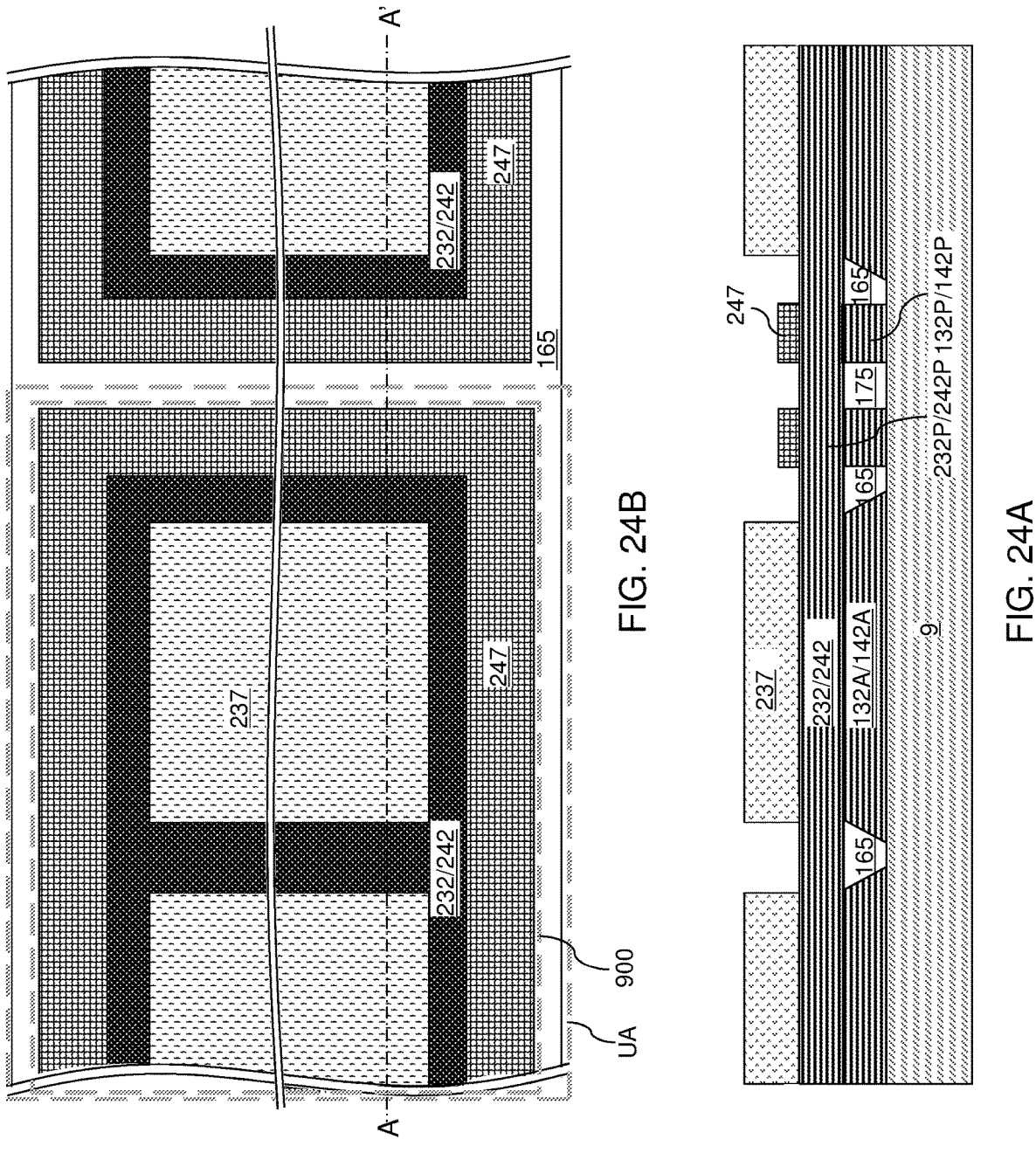
FIG. 24A is a vertical cross-sectional view of a second exemplary structure after formation of a second-tier vertically alternating sequence and application and patterning of a second trimmable etch mask layer and a second hard mask layer according to a second embodiment of the present disclosure.
FIG. 24B is a top-down view of the second exemplary structure of FIG. 24A.

Referring to FIGS. 24A and 24B, a second vertically alternating sequence of second continuous insulating layers 232 and second continuous spacer material layers 242 can be formed over the first-tier structure.

Second etch masks (237, 247) can be formed over the second vertically alternating sequence of second continuous insulating layers 232 and second continuous spacer material layers 242. Within each unit are UA, the second etch masks (237, 247) may comprise second memory-region etch masks 237 that are formed within the area of memory planes and a second die-periphery etch mask 247 that comprises a hard mask material (such as silicon oxide, silicon nitride, silicon carbide nitride, amorphous carbon or diamond-like carbon, or any other non-trimmable material layer that is not trimmed during subsequent trimming steps). The second die-periphery etch mask 247 is formed around a periphery of the die area of a respective memory die 900. In one embodiment, a second die-periphery etch mask 247 may cover the entirety of a periphery of a memory die 900. Each second memory-region etch mask 237 is laterally surrounded by the second die-periphery etch mask 247. The second memory-region etch masks 237 may comprise a trimmable mask material. According to an aspect of the present disclosure, each neighboring pair of second memory-region etch masks 237 is laterally spaced from each other by a second uniform mask spacing distance. In one embodiment, the second die-periphery etch mask 247 may be laterally spaced from each of the second memory-region etch masks 237 by a lateral spacing that is less than the second uniform mask spacing distance.

In one embodiment, the second uniform mask spacing distance may be greater than the width of each portion of the top surface of the first-tier retro-stepped dielectric structures 165 located between neighboring pairs of first memory-region alternating stacks (132A, 142A). In this case, the entirety of each second memory-region etch mask 237 may be located within the area of a topmost surface of an underlying first memory-region alternating stack (132A, 142A).

In one embodiment, each second die-periphery etch mask 247 may have a substantially same area as a respective first die-periphery etch mask 147 that is previously formed over a same memory die 900. In this case, each second die-periphery etch mask 247 may have an areal overlap with an outer portion of a respective first portion 1651 of the first-tier retro-stepped dielectric structure 65 and an inner portion of a respective first-tier peripheral dielectric material portions 175.

Figures 25A, 25B:
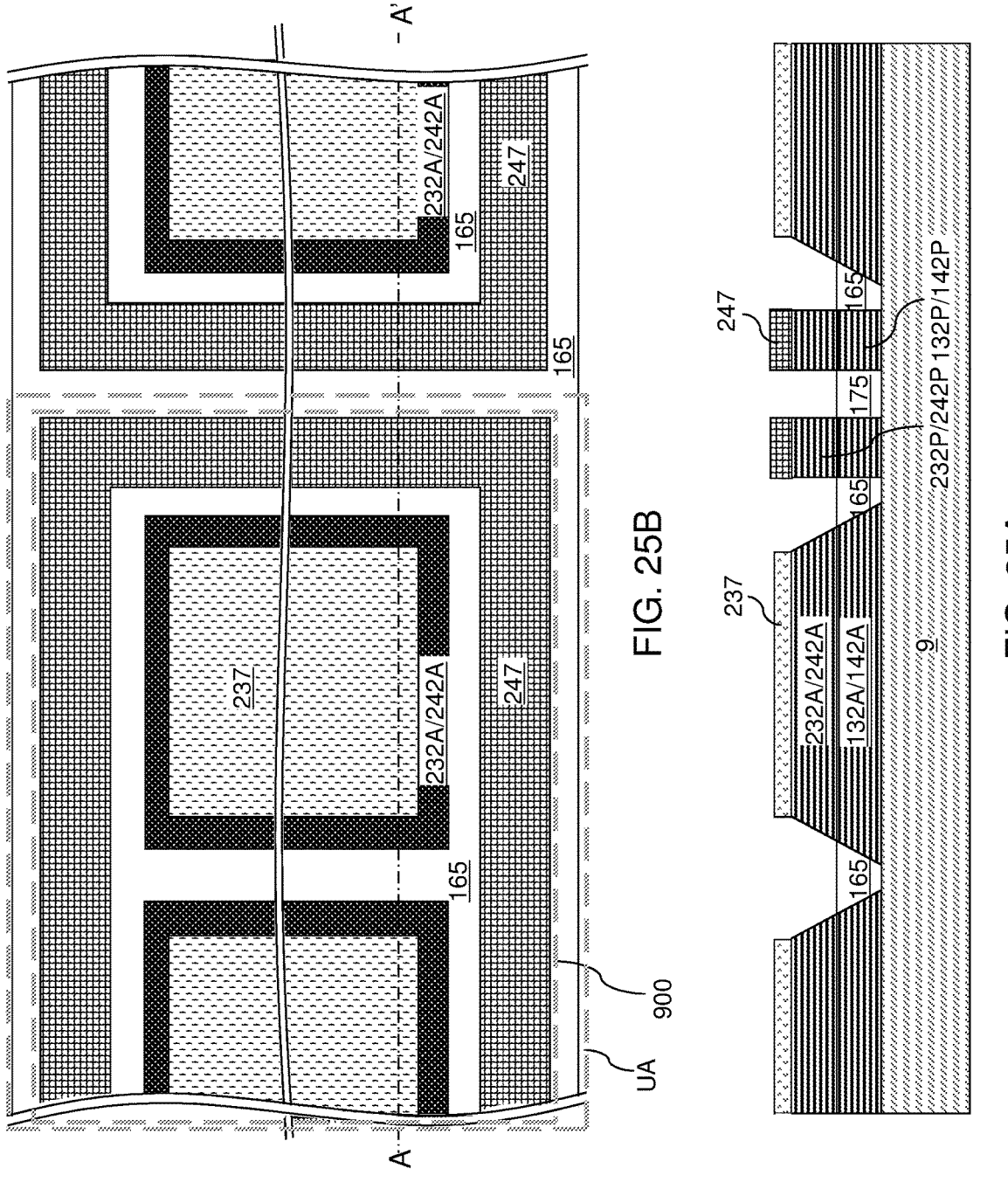
FIG. 25A is a vertical cross-sectional view of the second exemplary structure after formation of second-tier stepped surfaces according to the second embodiment of the present disclosure.
FIG. 25B is a top-down view of the second exemplary structure of FIG. 25A.

Referring to FIGS. 25A and 25B, multiple iterations of a unit processing step including an anisotropic etch step and a trimming step can be performed. The anisotropic etch step performs an anisotropic etch process that etches unmasked regions of the second vertically alternating sequence (232, 242). The trimming step performs a mask trimming process that isotropically trims each of the second memory-region etch mask 237 without trimming the second die-periphery etch masks 247. The second vertically alternating sequence (232, 242) is divided into second memory-region alternating stacks (232A, 242A) and a peripheral alternating stack (232P, 242P) within each unit area UA.

Each second memory-region alternating stack (232A, 242A) includes a vertically alternating sequence of second memory-region insulating layers 232A and second memory-region spacer material layers 242A. The second memory-region insulating layers 232A are patterned portions of the second continuous insulating layer 232 that underlie the second memory-region etch masks 237. The second memory-region spacer material layers 242A are patterned portions of the second continuous spacer material layers 242 that underlie the second memory-region etch masks 237.

Each second peripheral alternating stack (232P, 242P) includes a vertically alternating sequence of second peripheral insulating layers 232P and second peripheral spacer material layers 242P. The second peripheral insulating layers 232P are patterned portions of the second continuous insulating layer 232 that underlie the second die-periphery etch mask 247. The second peripheral spacer material layers 242P are patterned portions of the second continuous spacer material layers 242 that underlie the second die-periphery etch masks 247.

Within each unit area UA, each second memory-region alternating stack (232A, 242A) can be formed with a respective set of stepped surfaces. Within each unit area UA, each second peripheral alternating stack (232P, 242P) can be formed with straight sidewalls 250, which may be vertical or may have a taper angle greater than 0 degree and less than 15 degrees. Each second memory-region alternating stack (232A, 242A) can be formed entirely within the area of the topmost surface of a respective underlying first memory-region alternating stack (132A, 142A). The second etch masks (237, 247) can be subsequently removed, for example, by ashing. Thus, the peripheral alternating stacks {(132P, 142P), (232P, 242P)} of the second embodiment comprise dummy stacks with substantially planar sidewalls which perform the same function as the dummy staircase regions 200D in the first embodiment.

Figures 26A, 26B:
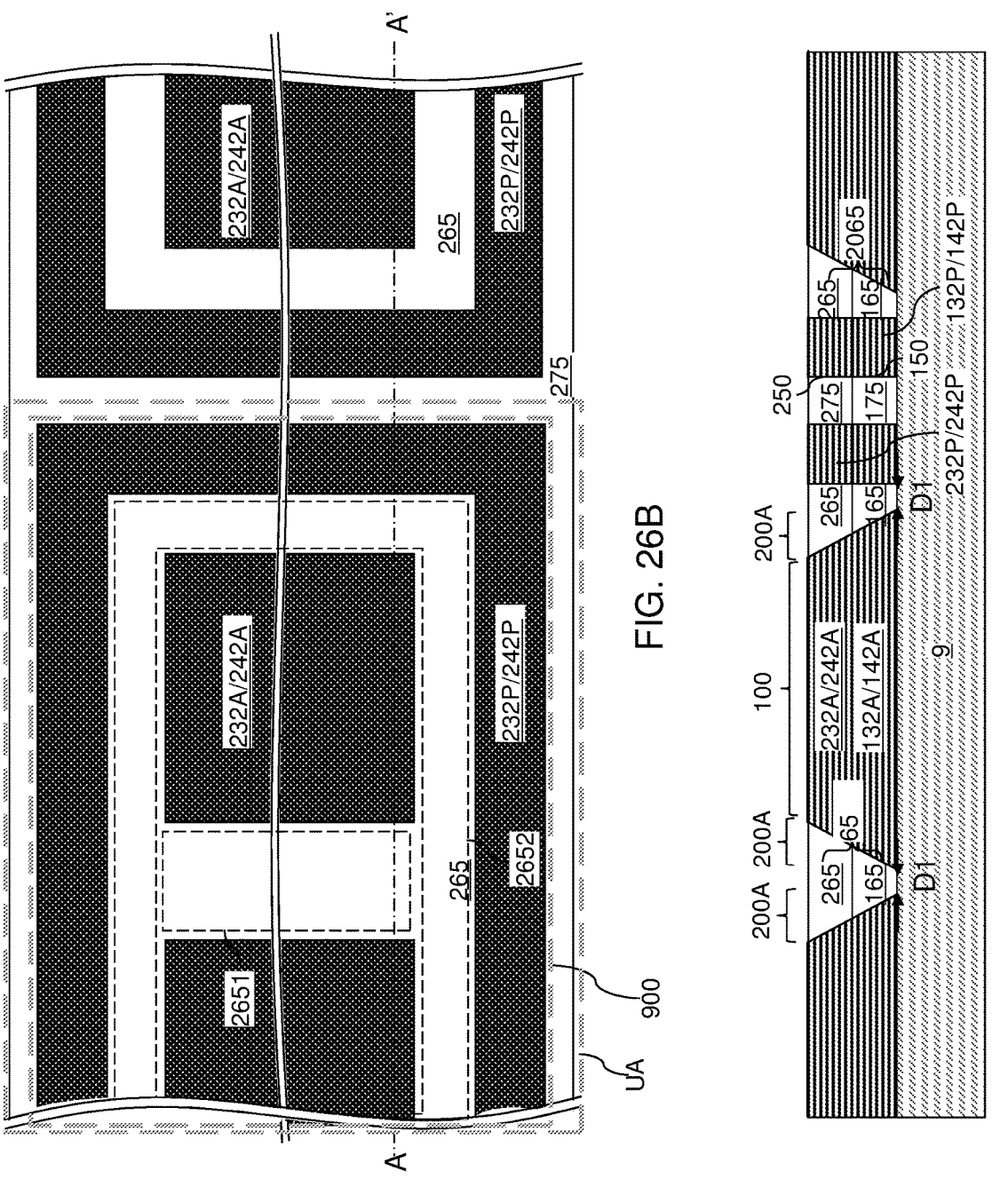
FIG. 26A is a vertical cross-sectional view of the second exemplary structure after formation of second-tier retro-stepped dielectric structures according to the second embodiment of the present disclosure.
FIG. 26B is a top-down view of the second exemplary structure of FIG. 26A.

Referring to FIGS. 26A and 26B, a dielectric fill material such as silicon oxide can be deposited over the stepped surfaces of the second memory-region alternating stacks (232A, 242A) and the second peripheral alternating stacks (232P, 242P). A planarization process (such as a chemical mechanical planarization process) can be performed to remove portions of the dielectric fill material from above the horizontal plane including the top surfaces of the second memory-region alternating stacks (232A, 242A) and the second peripheral alternating stacks (232P, 242P). Remaining portions of the dielectric fill material comprise second-tier retro-stepped dielectric structures 265 that are formed entirely within a respective second peripheral alternating stack (232P, 242P), and second-tier peripheral dielectric material portions 275 that are formed between neighboring pairs of second peripheral alternating stacks (232P, 242P) in kerf regions 901. In one embodiment, each second-tier retro-stepped dielectric structure 265 can contact, and can laterally surround, each first memory-region alternating sack (132A, 142A) within a memory die 900. Each second peripheral dielectric material portion 275 located at a peripheral region of a memory die 900 is laterally spaced from the second memory-region alternating stacks (232A, 242A) located within the memory die 900 by a respective second peripheral alternating stack (232P, 242P) and by a respective second-tier retro-stepped dielectric structure 265. Each second-tier retro-stepped dielectric structure 265 comprises at least one first portion 2651 (which may be a plurality of first portions 2651) located between a neighboring pair of second memory-region alternating stacks (232A, 242A) and a second portion 2652 located between the second peripheral alternating stack (232P, 242P) and the second memory-region alternating stacks (232A, 242A).

The second exemplary structure includes a memory array region 100 within the area of each of the second memory-region alternating stacks (232A, 242A). Each memory array region 100 is a region in which a three-dimensional memory array is to be subsequently formed. An active staircase region 200A includes stepped surfaces of second memory-region alternating stack (232A, 242A) and stepped surfaces of the first memory-region alternating stack (132A, 142A), and laterally enclose a respective memory array region 100.

Each stack of a first-tier retro-stepped dielectric structure 165 and a second-tier retro-stepped dielectric structure 265 is herein referred to as a dielectric structure stack 65, or as a retro-stepped dielectric structure 65.

In one embodiment, each neighboring pair of the memory-region alternating stacks {(132A, 142A), (232A, 242A)} has a minimum lateral spacing within a horizontal plane that includes bottom surfaces of the memory-region alternating stacks {(132A, 142A) and/or (232A, 242A)}. According to an aspect of the present disclosure, the minimum lateral spacing for each neighboring pair of the memory-region alternating stacks {(132A, 142A), (232A, 242A)} may be the same as a minimum lateral spacing between the peripheral alternating stack {(132P, 142P), (232P, 242P)} and each of the memory-region alternating stacks {(132A, 142A), (232A, 242A)}.

In one embodiment, a peripheral alternating stack {(132P, 142P), (232P, 242P)} of peripheral insulating layers (132P, 232P) and spacer material layers (142P, 242P) laterally surrounds each of the memory-region alternating stacks {(132A, 146), (232A, 246)} of a memory die 900, and is laterally spaced from the memory-region alternating stacks {(132A, 142A), (232A, 242A)} by a second portion (1652, 2652) of the retro-stepped dielectric structure overlying second stepped surfaces of the memory-region alternating stacks {(132A, 146), (232A, 246)}. In one embodiment, each first portion (1651, 2651) of the retro-stepped dielectric structure 65 has a respective uniform bottom width between a pair of straight edges of a respective bottom surface, and has a respective uniform top width between a pair of straight edges of a respective top surface. In one embodiment, the second portion (1652, 2652) of the retro-stepped dielectric structure 65 has a second uniform bottom width that is the same as the respective uniform bottom width.

Figures 27A, 27B:
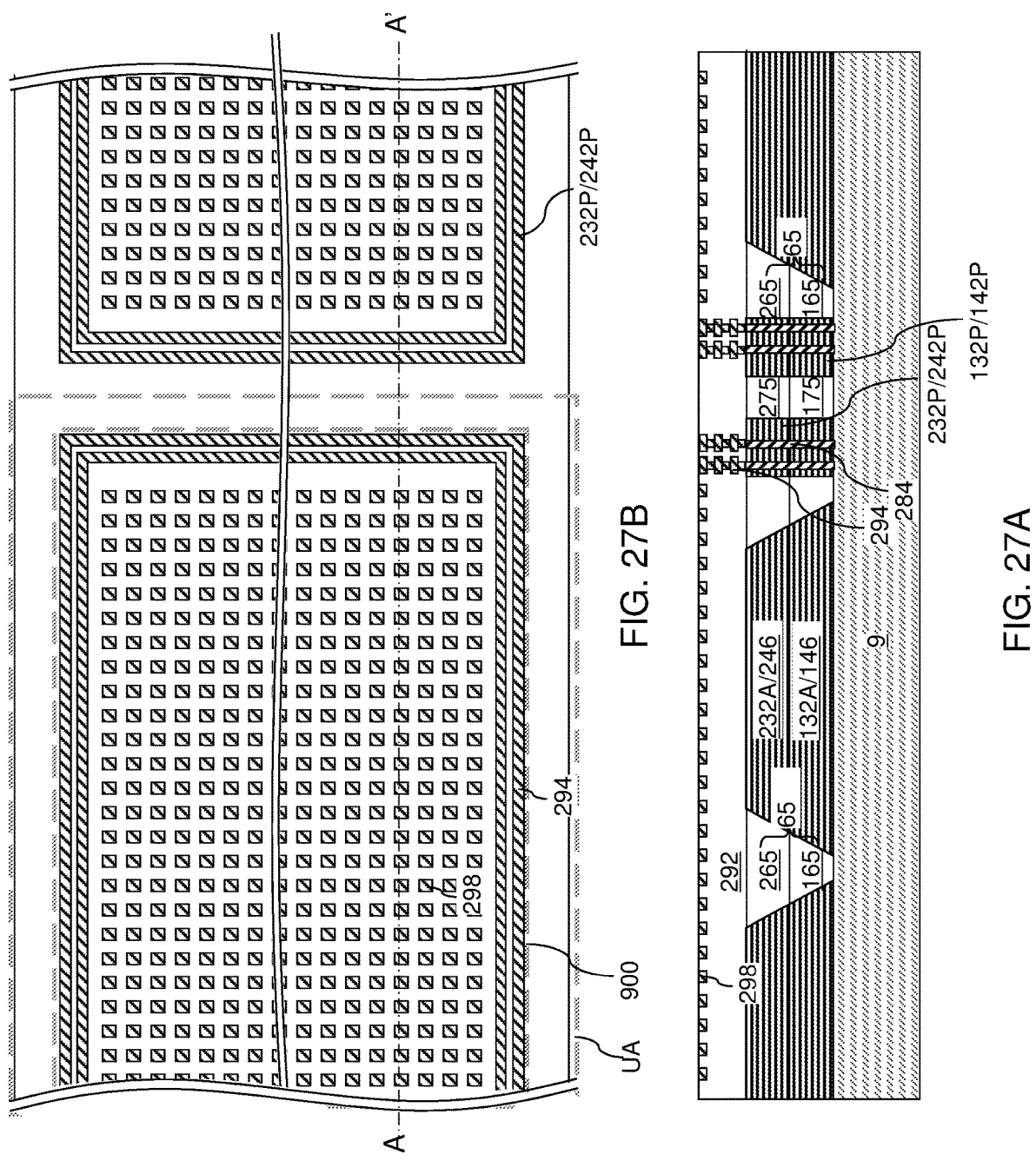
FIG. 27A is a vertical cross-sectional view of the second exemplary structure after formation of metal interconnect structures and edge seal wall structures according to the second embodiment of the present disclosure.
FIG. 27B is a top-down view of the second exemplary structure of FIG. 27A.

Referring to FIGS. 27A and 27B, the processing steps of FIGS. 9-17B can be performed with any needed changes in view of the changes in the patterns of the peripheral alternating stack {(132P, 142P), (232P, 242P)} (i.e., omission of the dummy staircase regions 200D).

Generally, interconnect-level dielectric material layers 292 embedding metal interconnect structures 294 over the memory-region alternating stacks {(132A, 142A), (232A, 242A)} and the peripheral alternating stack {(132P, 142P) and/or (232P, 242P)}. At least one edge seal wall structure (284, 294) is formed, which comprises a respective set of the at least one metal wall structure 284 and a respective subset of the metal interconnect structures 294, and continuously extends from a bottommost layer within the peripheral alternating stack {(132P, 142P), (232P, 242P)} to a horizontal plane including a top surface of the interconnect-level dielectric material layers 292.

In one embodiment, each metal wall structure 284 within the respective set of at least one metal wall structure 284 laterally extends around all of the memory-region alternating stacks {(132A, 146), (232A, 246)} as a single contiguous structure that is topologically homeomorphic to a torus. In one embodiment, the at least one edge seal wall structure (284, 294) comprises a nested plurality of edge seal wall structures (284, 294) within which each edge seal wall structure (284, 294) is laterally surrounded by, or laterally surrounds, any other edge seal wall structure (284, 294) within the nested plurality of edge seal wall structures (284, 294).

In one embodiment, the peripheral alternating stack {(132P, 142P), (232P, 242P)} comprises a vertical stack of a first-tier alternating stack (132P, 142P) and a second-tier alternating stack (232P, 242P) contacting a top surface of the first-tier alternating stack (132P, 142P). In one embodiment, the at least one straight sidewall of the second portion (1652, 2652) of the retro-stepped dielectric structure 65 comprises a first straight sidewall 150 contacting each layer within the first-tier alternating stack (132P, 142P) and a second straight sidewall 250 contacting each layer within the second-tier alternating stack (232P, 242P). In one embodiment, the second straight sidewall may be laterally offset from the first straight sidewall due to an overlay error during lithographic processes. In one embodiment, each of the at least one edge seal wall structure (284, 294) vertically extends through, and contacts, each layer within the peripheral alternating stack {(132P, 142P), (232P, 242P)}.

Figure 28:
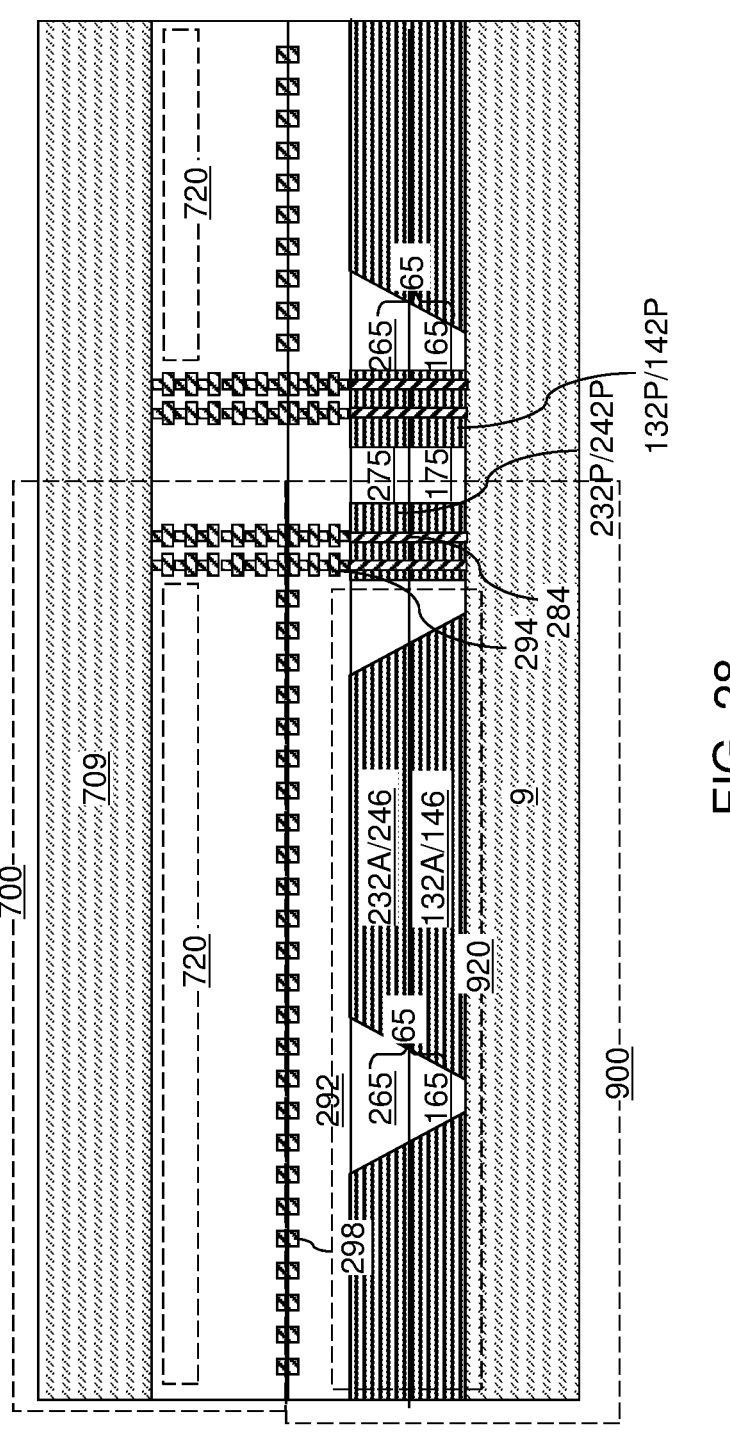
FIG. 28 is a vertical cross-sectional view of the second exemplary structure after bonding a second semiconductor device wafer including an array of logic dies to the first device wafer according to the second embodiment of the present disclosure.

Referring to FIG. 28, the processing steps of FIG. 18 can be performed to bond a second semiconductor device wafer including an array of logic dies 700 to the first semiconductor device wafer.

Figure 29:
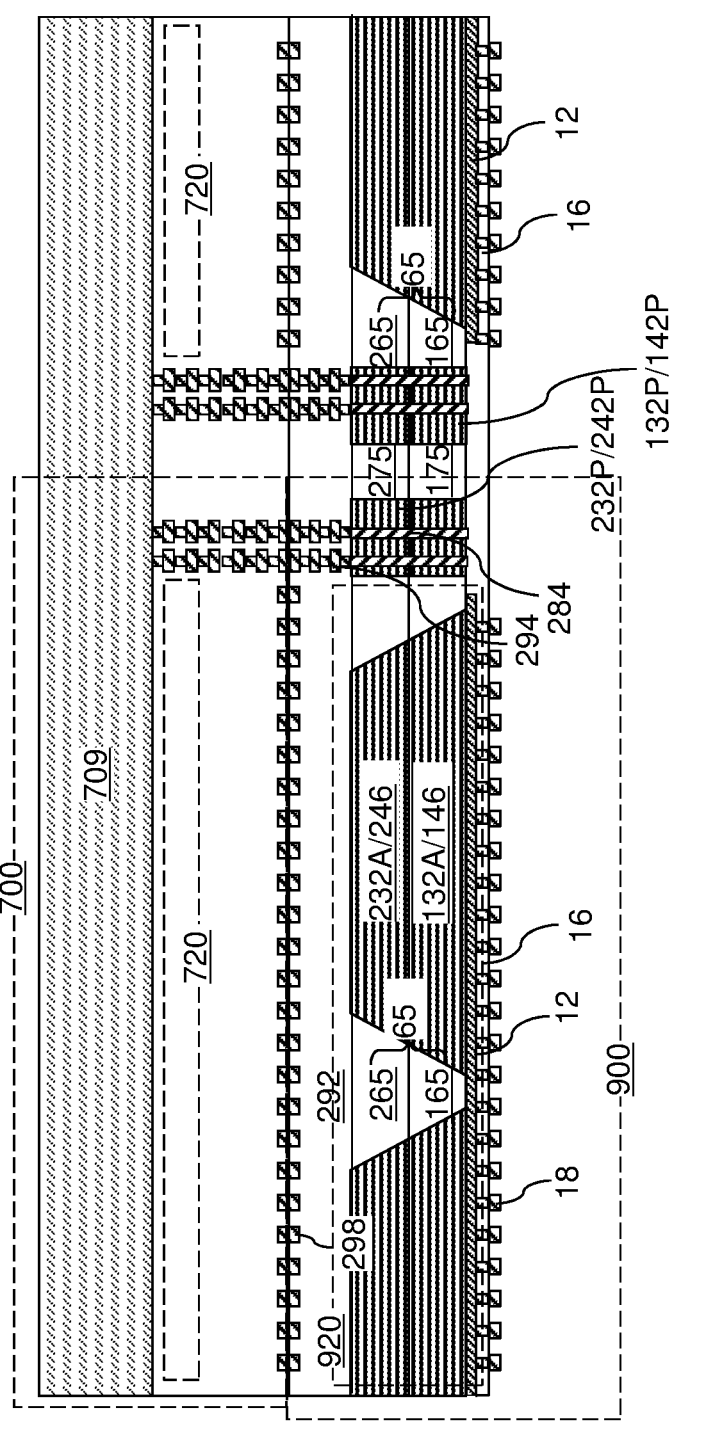
FIG. 29 is a vertical cross-sectional view of the second exemplary structure after removing a semiconductor substrate of the first semiconductor device wafer and forming backside bonding pads according to the second embodiment of the present disclosure.

Referring to FIG. 29, the processing steps of FIG. 19 can be performed to remove the memory substrate 9, to form a source layer 12, to form a backside insulating layer 16, and to form backside bonding pads 18.

Figure 30:
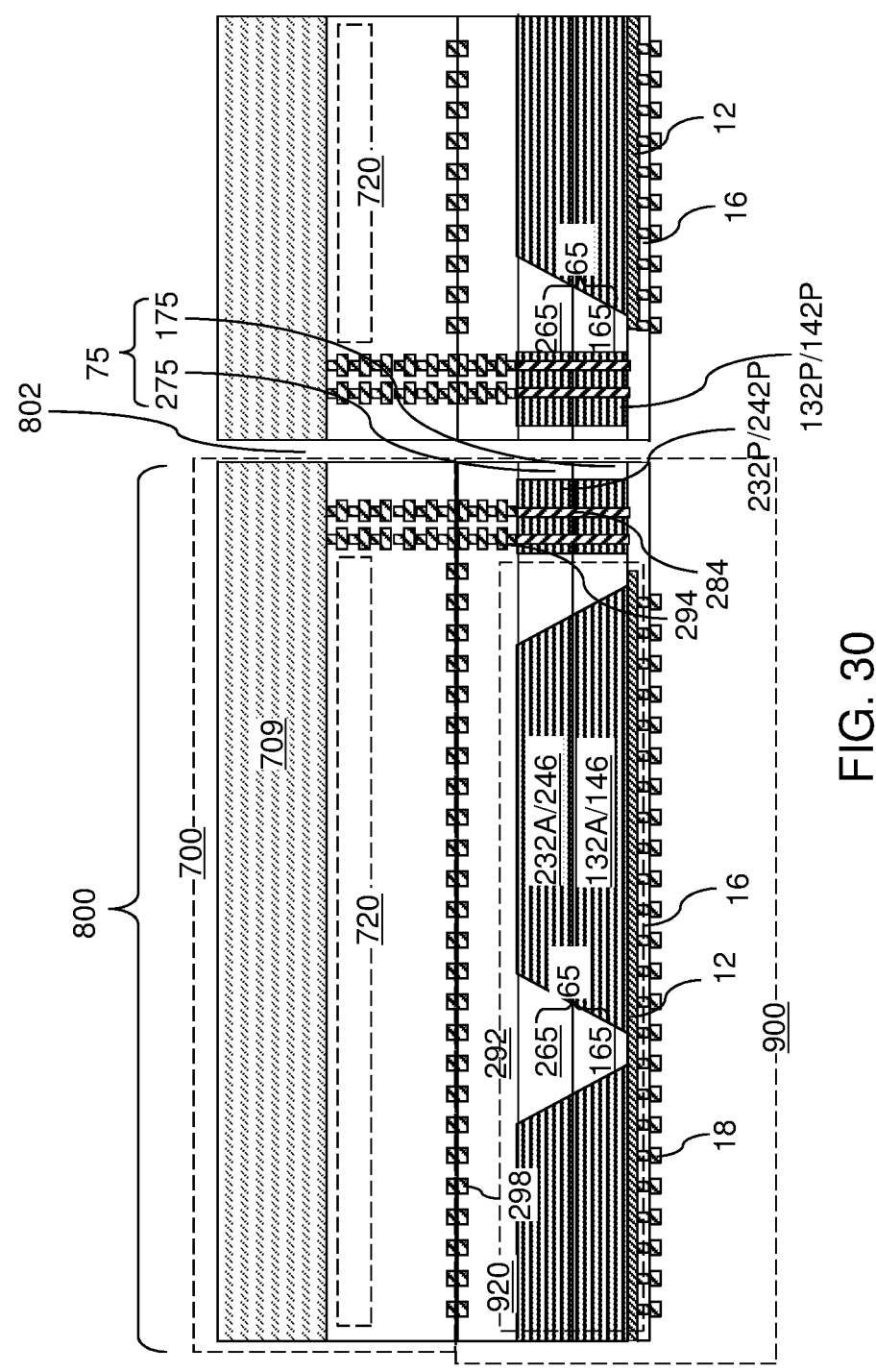
FIG. 30 is a vertical cross-sectional view of the second exemplary structure after dicing the bonded assembly into a plurality of bonded semiconductor dies according to the second embodiment of the present disclosure.

Referring to FIG. 30, the processing steps of FIG. 20 can be performed to dice the bonded assembly of the first semiconductor device wafer and the second semiconductor device wafer. The bonded assembly can be diced along dicing channels 802, which are located along geometrical centers of laterally-extending portions of the peripheral dielectric material portions (175, 275). Each bonded semiconductor die 800 includes a bonded assembly of a memory die 900 and a logic die 700. Each bonded semiconductor die includes a dielectric frame 75, which includes a reaming annular portion of a first-tier peripheral dielectric material portion 175 and a remaining annular portion of a second-tier peripheral dielectric material portion 275.

Each dielectric frame 75 laterally surrounds the peripheral alternating stack {(132P, 142P), (232P, 242P)} of a memory die 900 and comprises a set of vertical outer sidewalls and a set of straight inner sidewalls that contact planar (i.e., non-curved and non-stepped) surfaces of the peripheral alternating stack {(132P, 142P), (232P, 242P)}.

While a two-tier structure in which each memory die 900 includes a first-tier structure including first-tier memory region alternating stacks (132A, 146), (232A, 246)} and first-tier peripheral alternating stack (132P, 142P) and a second-tier structure including second-tier memory region alternating stacks (232A, 246), (232A, 246)} and second-tier peripheral alternating stack (232P, 242P) is described, embodiments are expressly contemplated herein in which only a single tier structure is employed, or three or more tier structures are employed.

Referring to various aspects of the present disclosure, a semiconductor structure 800 comprises a memory die 900, wherein the memory die 900 comprises: first and second memory-region alternating stacks {(132A, 146), (232A, 246)} of memory-region insulating layers (132A, 232A) and electrically conductive layers (146, 246) that are laterally spaced apart from each other by a respective first portion (1651, 2651) of the retro-stepped dielectric structure 65 overlying first stepped surfaces (e.g., active staircase regions 200A) of the first and second memory-region alternating stacks, memory openings 49 vertically-extending through the memory-region alternating stacks {(132A, 146), (232A, 246)}; memory opening fill structures 58 located in the memory openings 49 and comprising a respective vertical semiconductor channel 60 and a respective vertical stack of memory elements (e.g., portions of the memory film a peripheral alternating stack {(132P, 142P), (232P, 242P)} of peripheral insulating layers (132P, 232P) and spacer material layers (142P, 242P) having a different composition from the electrically conductive layers (146, 246). The peripheral alternating stack is laterally spaced from the second memory-region alternating stack by a second portion (1652, 2652) of the retro-stepped dielectric structure 65 overlying second stepped surfaces of the second memory-region alternating stack (e.g., the active staircase region 200A).

As shown in FIGS. 8A and 26A bottom surfaces (e.g., vertical bottom edges of the active staircase regions 200A) of the first and second memory-region alternating stacks are spaced apart by a first lateral spacing distance D1 Likewise, bottom surfaces of the second memory alternating stack (vertical bottom edge of one of the active staircase regions 200A) and the peripheral alternating stack (e.g., vertical bottom edge of the dummy staircase region 200D in FIG. 8A or the bottom edge of the vertical sidewall in FIG. 26A) are also spaced apart by the same first lateral spacing distance D1.

In one embodiment, the peripheral alternating stack laterally surrounds the first and the second memory-region alternating stacks. In one embodiment, the second portion (1652, 2652) of the retro-stepped dielectric structure 65 laterally surrounds the first and second memory-region alternating stacks {(132A, 146), (232A, 246)}, and is laterally surrounded by the peripheral alternating stack {(132P, 142P), (232P, 242P)}.

In one embodiment, the memory die 900 includes interconnect-level dielectric material layers 292 embedding metal interconnect structures 294 and overlying the memory-region alternating stacks {(132A, 146), (232A, 246)} and the peripheral alternating stack {(132P, 142P), (232P, 242P)}; and at least one edge seal wall structure (284, 294) comprising a respective set of at least one metal wall structure 284 and a respective subset of the metal interconnect structures 294 and continuously extending from a bottommost layer within the peripheral alternating stack {(132P, 142P), (232P, 242P)} to a horizontal plane including a top surface of the interconnect-level dielectric material layers 292.

In one embodiment, each metal wall structure 284 within the respective set of at least one metal wall structure 284 laterally extends around the first and second memory-region alternating stacks {(132A, 146), (232A, 246)} as a single continuous structure.

In one embodiment, the at least one edge seal wall structure (284, 294) comprises a nested plurality of edge seal wall structures (284, 294) within which each edge seal wall structure (284, 294) is laterally surrounded by, or laterally surrounds, any other edge seal wall structure (284, 294) within the nested plurality of edge seal wall structures (284, 294). In one embodiment, the nested plurality of edge seal wall structures (284, 294) comprises: a first edge seal wall structure (284, 294) that vertically extends through a subset of all layers within the peripheral alternating stack {(132P, 142P) and/or (232P, 242P)} and through a region of the second portion (1652, 2652) of the retro-stepped dielectric structure 65; and a second edge seal wall structure (284, 294) that vertically extends through all layers within the peripheral alternating stack {(132P, 142P) and/or (232P, 242P)} and is laterally spaced from the second portion (1652, 2652) of the retro-stepped dielectric structure 65.

In one embodiment, the first memory-region alternating stack comprises a first memory plane 910, the second memory-region alternating stack comprises a second memory plane 910, the spacer material layers (142P, 242P) comprise dielectric material layers, and the peripheral alternating stack comprises a dummy alternating stack.

In the first embodiment, the dummy alternating stack comprises a dummy staircase region 200D containing dummy stepped surfaces. The first stepped surfaces of the first and second memory-region alternating stacks and the second stepped surfaces of the second memory-region alternating stack comprise active staircase regions 200A. An average horizontal step width of the first stepped surfaces of the first and second memory-region alternating stacks is the same as an average horizontal step width of the second stepped surfaces of the memory-region alternating stacks, and is the same as an average horizontal step width of the dummy stepped surfaces of the dummy alternating stack.

In the second embodiment, the dummy alternating stack comprises a substantially straight sidewall (150, 250), the second stepped surfaces of the second memory-region alternating stack comprise an active staircase region 200A, and the bottom surface of an edge of a bottom step of the active staircase region of the second memory alternating stack and the bottom surface of the substantially straight sidewall 150 of the peripheral alternating stack are spaced apart by the first lateral spacing distance D1, as shown in FIG. 26.

In one embodiment, each first portion (1651, 2651) of the retro-stepped dielectric structure 65 has a respective uniform bottom width between a pair of straight edges of a respective bottom surface, and has a respective uniform top width between a pair of straight edges of a respective top surface; and the second portion (1652, 2652) of the retro-stepped dielectric structure 65 has a second uniform bottom width that is the same as the respective uniform bottom width, and has a second uniform top width that is less than the respective uniform top width.

In one embodiment, the peripheral alternating stack {(132P, 142P) and/or (232P, 242P)} comprises a vertical stack of a first-tier alternating stack (132P, 142P) and a second-tier alternating stack (232P, 242P) contacting a top surface of the first-tier alternating stack (132P, 142P); and a bottommost layer within the second-tier alternating stack (232P, 242P) has a greater lateral extent than a topmost layer of the first-tier alternating stack (132P, 142P). In one embodiment, a surface segment of the bottommost layer within the second-tier alternating stack (232P, 242P) contacts a horizontal top surface of the second portion (1652, 2652) of the retro-stepped dielectric structure 65 that is located between a topmost surface of the second portion (1652, 2652) of the retro-stepped dielectric structure 65 and a bottommost surface of the second portion (1652, 2652) of the retro-stepped dielectric structure 65.

In one embodiment, the semiconductor structure 800 also comprises a dielectric frame 75 laterally surrounding the peripheral alternating stack {(132P, 142P), (232P, 242P)}. In the first embodiment, the dielectric frame 75 comprises a set of vertical outer sidewalls and a set of stepped inner sidewalls that contact additional stepped surfaces of the peripheral alternating stack {(132P, 142P) and/or (232P, 242P)}. An average horizontal step width of the additional stepped surfaces of the peripheral alternating stack {(132P, 142P) and/or (232P, 242P)} is the same as an average horizontal step width of the stepped surfaces of the peripheral alternating stack {(132P, 142P) and/or (232P, 242P)} that contacts the second portion (1652, 2652) of the retro-stepped dielectric structure 65.

In one embodiment the semiconductor structure 800 comprises a bonded assembly which includes a logic die 700 bonded to the memory die 900.

The various embodiments of the present disclosure provide a memory die 900 having uniform step width for horizontal surfaces within each set of stepped surfaces located in active staircase regions 200A on the memory-region alternating stacks {(132A, 146), (232A, 246)} by utilizing a dummy stack (e.g., a peripheral alternating stack {(132P, 142P), (232P, 242P)}) in the edge seal region. In case stepped surfaces are formed in dummy staircase regions 200D on peripheral alternating stack {(132P, 142P), (232P, 242P)}, the horizontal surfaces within the stepped surfaces in the dummy staircase regions 200D of the peripheral alternating stacks {(132P, 142P), (232P, 242P)} may have the same width as the horizontal surfaces of the memory-region alternating stacks {(132A, 146), (232A, 246)}. The dummy stack reduces or avoids the stair slimming distortion and thus permits reduction in the total area of the active staircase regions 200A.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A semiconductor structure comprising a memory die, wherein the memory die comprises:

first and second memory-region alternating stacks of memory-region insulating layers and electrically conductive layers that are laterally spaced apart from each other by a respective first portion of a retro-stepped dielectric structure overlying first stepped surfaces of the first and second memory-region alternating stacks;

memory openings vertically-extending through the first and second memory-region alternating stacks;

memory opening fill structures located in the memory openings and comprising a respective vertical semiconductor channel and a respective vertical stack of memory elements;

a peripheral alternating stack of peripheral insulating layers and spacer material layers having a different composition from the electrically conductive layers, the peripheral alternating stack is laterally spaced from the second memory-region alternating stack by a second portion of the retro-stepped dielectric structure overlying second stepped surfaces of the second memory-region alternating stack;

interconnect-level dielectric material layers embedding metal interconnect structures and overlying the first and second memory-region alternating stacks and the peripheral alternating stack; and at least one edge seal wall structure comprising a respective set of at least one metal wall structure and a respective subset of the metal interconnect structures, and which continuously extends from a bottommost layer within the peripheral alternating stack to a horizontal plane including a top surface of the interconnect-level dielectric material layers wherein:

bottom surfaces of the first and second memory-region alternating stacks are spaced apart by a first lateral spacing distance; and bottom surfaces of the second memory alternating stack and the peripheral alternating stack are spaced apart by the first lateral spacing distance.

2. The semiconductor structure of claim 1, wherein each metal wall structure within the respective set of at least one metal wall structure laterally extends around the first and the second memory-region alternating stacks as a single continuous structure.

3. The semiconductor structure of claim 1, wherein the at least one edge seal wall structure comprises a nested plurality of edge seal wall structures within which each edge seal wall structure is laterally surrounded by, or laterally surrounds, any other edge seal wall structure within the nested plurality of edge seal wall structures.

4. The semiconductor structure of claim 2, wherein the nested plurality of edge seal wall structures comprises:

a first edge seal wall structure that vertically extends through a subset of all layers within the peripheral alternating stack and through a region of the second portion of the retro-stepped dielectric structure; and a second edge seal wall structure that vertically extends through all layers within the peripheral alternating stack and is laterally spaced from the second portion of the retro-stepped dielectric structure.

5. The semiconductor structure of claim 1, A semiconductor structure comprising a memory die, wherein the memory die comprises:

first and second memory-region alternating stacks of memory-region insulating layers and electrically conductive layers that are laterally spaced apart from each other by a respective first portion of a retro-stepped dielectric structure overlying first stepped surfaces of the first and second memory-region alternating stacks;

memory openings vertically-extending through the first and second memory-region alternating stacks;

memory opening fill structures located in the memory openings and comprising a respective vertical semiconductor channel and a respective vertical stack of memory elements; and a peripheral alternating stack of peripheral insulating layers and spacer material layers having a different composition from the electrically conductive layers, the peripheral alternating stack is laterally spaced from the second memory-region alternating stack by a second portion of the retro-stepped dielectric structure overlying second stepped surfaces of the second memory-region alternating stack;

wherein:

bottom surfaces of the first and second memory-region alternating stacks are spaced apart by a first lateral spacing distance;

bottom surfaces of the second memory alternating stack and the peripheral alternating stack are spaced apart by the first lateral spacing distance;

the first memory-region alternating stack comprises a first memory plane;

the second memory-region alternating stack comprises a second memory plane;

the spacer material layers comprise dielectric material layers; and the peripheral alternating stack comprises a dummy alternating stack.

6. The semiconductor structure of claim 5, wherein:

the dummy alternating stack comprises a dummy staircase region containing dummy stepped surfaces;

first stepped surfaces of the first and second memory-region alternating stacks and the second stepped surfaces of the second memory-region alternating stack comprise active staircase regions; and an average horizontal step width of the first stepped surfaces of the first and second memory-region alternating stacks is the same as an average horizontal step width of the second stepped surfaces of the memory-region alternating stacks, and is the same as an average horizontal step width of the dummy stepped surfaces of the dummy alternating stack.

7. The semiconductor structure of claim 5, wherein:

the dummy alternating stack comprises a substantially straight sidewall;

the second stepped surfaces of the second memory-region alternating stack comprise an active staircase region; and the bottom surface of an edge of a bottom step of the active staircase region of the second memory alternating stack and the bottom surface of the substantially straight sidewall of the peripheral alternating stack are spaced apart by the first lateral spacing distance.

8. The semiconductor structure of claim 5, wherein:

each first portion of the retro-stepped dielectric structure has a respective uniform bottom width between a pair of straight edges of a respective bottom surface, and has a respective uniform top width between a pair of straight edges of a respective top surface; and the second portion of the retro-stepped dielectric structure has a second uniform bottom width that is the same as the respective uniform bottom width, and has a second uniform top width that is less than the respective uniform top width.

9. The semiconductor structure of claim 8, wherein:

the peripheral alternating stack comprises a vertical stack of a first-tier vertically alternating sequence and a second-tier vertically alternating sequence contacting a top surface of the first-tier vertically alternating sequence; and a bottommost layer within the second-tier vertically alternating sequence has a greater lateral extent than a topmost layer of the first-tier vertically alternating sequence.

10. The semiconductor structure of claim 8, further comprising a dielectric frame laterally surrounding the peripheral alternating stack.

11. The semiconductor structure of claim 8, further comprising a logic die bonded to the memory die.

* * * * *